United States Patent
Nishimoto et al.

(10) Patent No.: US 11,619,365 B2
(45) Date of Patent: Apr. 4, 2023

(54) LIGHT SOURCE UNIT, ILLUMINATION DEVICE, PROCESSING EQUIPMENT, AND DEFLECTION ELEMENT

(71) Applicant: Nuvoton Technology Corporation Japan, Kyoto (JP)

(72) Inventors: Masahiko Nishimoto, Osaka (JP); Kazuhiko Yamanaka, Osaka (JP); Masayuki Hata, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 14 days.

(21) Appl. No.: 17/334,629

(22) Filed: May 28, 2021

(65) Prior Publication Data
US 2021/0285619 A1  Sep. 16, 2021

Related U.S. Application Data

(63) Continuation of application No. PCT/JP2019/043784, filed on Nov. 8, 2019.

(30) Foreign Application Priority Data

Dec. 6, 2018  (JP) .............................. JP2018-229344

(51) Int. Cl.
*F21V 9/30* (2018.01)
*F21V 8/00* (2006.01)
(Continued)

(52) U.S. Cl.
CPC .............. *F21V 9/30* (2018.02); *G02B 6/0008* (2013.01); *G02B 19/0052* (2013.01);
(Continued)

(58) Field of Classification Search
CPC ..... F21V 9/30; G02B 6/0008; G02B 19/0052; G02B 27/0916; G02B 27/0972;
(Continued)

(56) References Cited

U.S. PATENT DOCUMENTS 10,261,261 B2 * 4/2019 Hemenway ........ G02B 19/0057
10,833,482 B2 * 11/2020 Chen ................... G02B 19/0057
(Continued)

FOREIGN PATENT DOCUMENTS

JP   2013-235943 A    11/2013
WO   2014/115194 A1    7/2014

OTHER PUBLICATIONS

International Search Report issued in corresponding International (PCT) Application No. PCT/JP2019/043784, dated Feb. 4, 2020, with English translation.

*Primary Examiner* — Arman B Fallahkhair
(74) *Attorney, Agent, or Firm* — McDermott Will & Emery LLP

(57) ABSTRACT

A light source unit includes: a first light emission point from which a first beam is emitted; a second light emission point from which a second beam is emitted and which is disposed apart from the first light emission point in a second direction perpendicular to a first direction; a deflection element that deflects the first and/or second beam; and a first condensing optical element that focuses, on a light collection surface, the first and second beams. The first beam at the first light emission point overlaps the second beam at the second light emission point in a third direction, and on the light collection surface, the first and second beams overlap each other in the second direction and are separate from each other in the third direction.

9 Claims, 41 Drawing Sheets

(51) Int. Cl.
   *G02B 19/00* (2006.01)
   *G02B 27/09* (2006.01)
   *H01S 5/00* (2006.01)
   *H01S 5/02251* (2021.01)
   *H01S 5/40* (2006.01)
   *F21Y 115/30* (2016.01)
   *H01S 5/02253* (2021.01)

(52) U.S. Cl.
   CPC ..... *G02B 27/0916* (2013.01); *G02B 27/0972* (2013.01); *H01S 5/0087* (2021.01); *H01S 5/02251* (2021.01); *H01S 5/4012* (2013.01); *H01S 5/4075* (2013.01); *H01S 5/4081* (2013.01); *F21Y 2115/30* (2016.08); *H01S 5/02253* (2021.01)

(58) Field of Classification Search
   CPC .. H01S 5/02251; H01S 5/0087; H01S 5/4012; H01S 5/4075; H01S 5/4081; H01S 5/02253
   See application file for complete search history.

(56) References Cited

U.S. PATENT DOCUMENTS

| | | |
|---|---|---|
| 2009/0245315 A1 | 10/2009 | Faybishenko |
| 2015/0131692 A1 | 5/2015 | Hayamizu et al. |
| 2015/0316234 A1 | 11/2015 | Samonji et al. |

\* cited by examiner

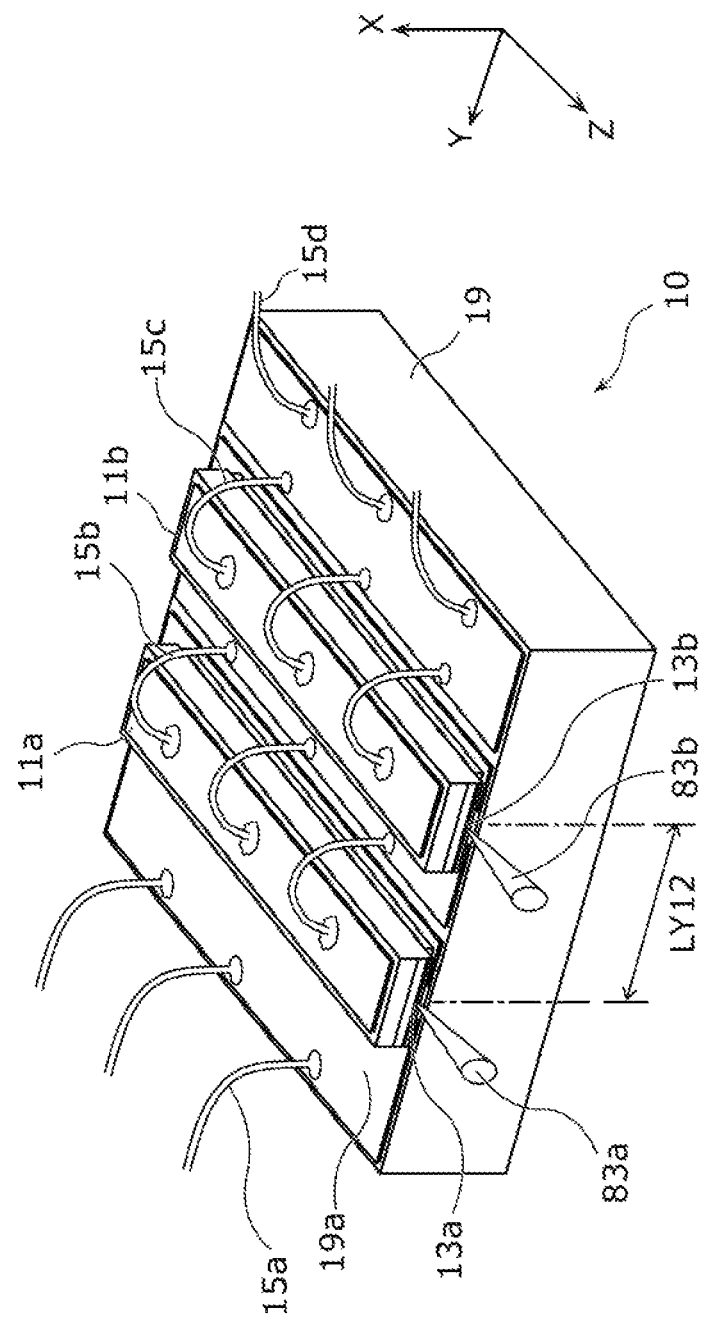

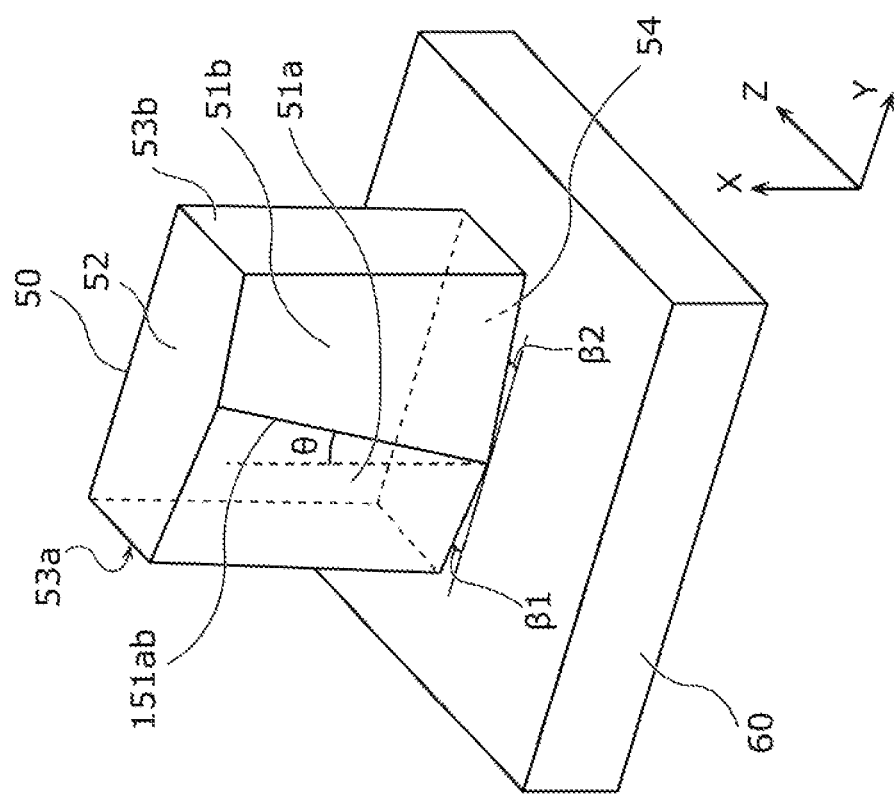

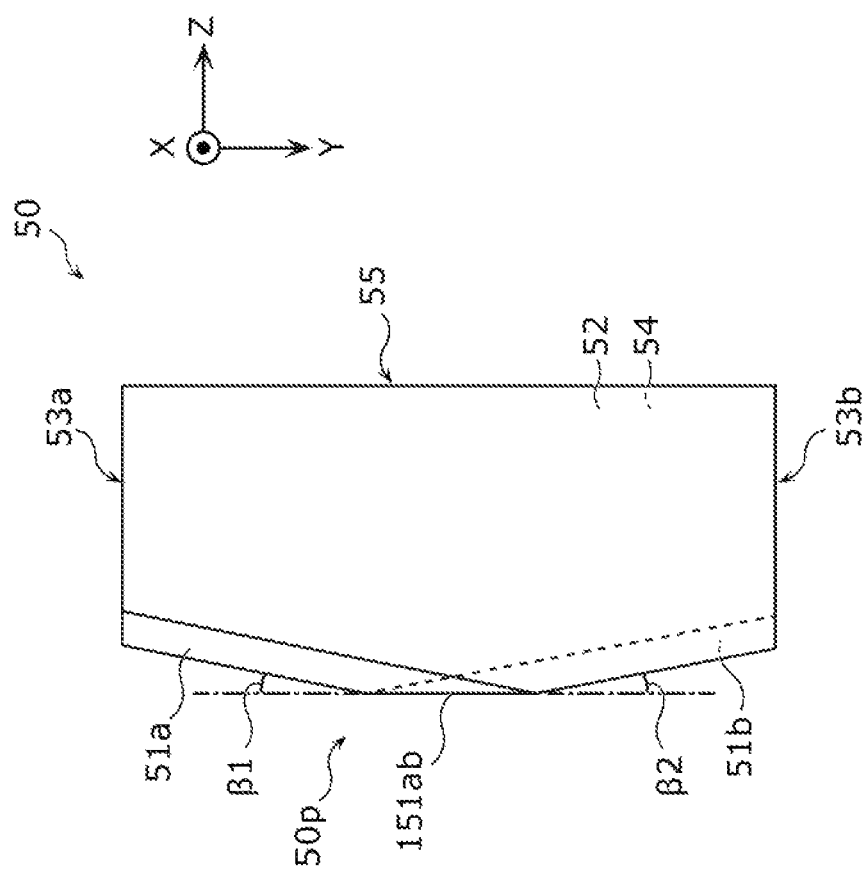

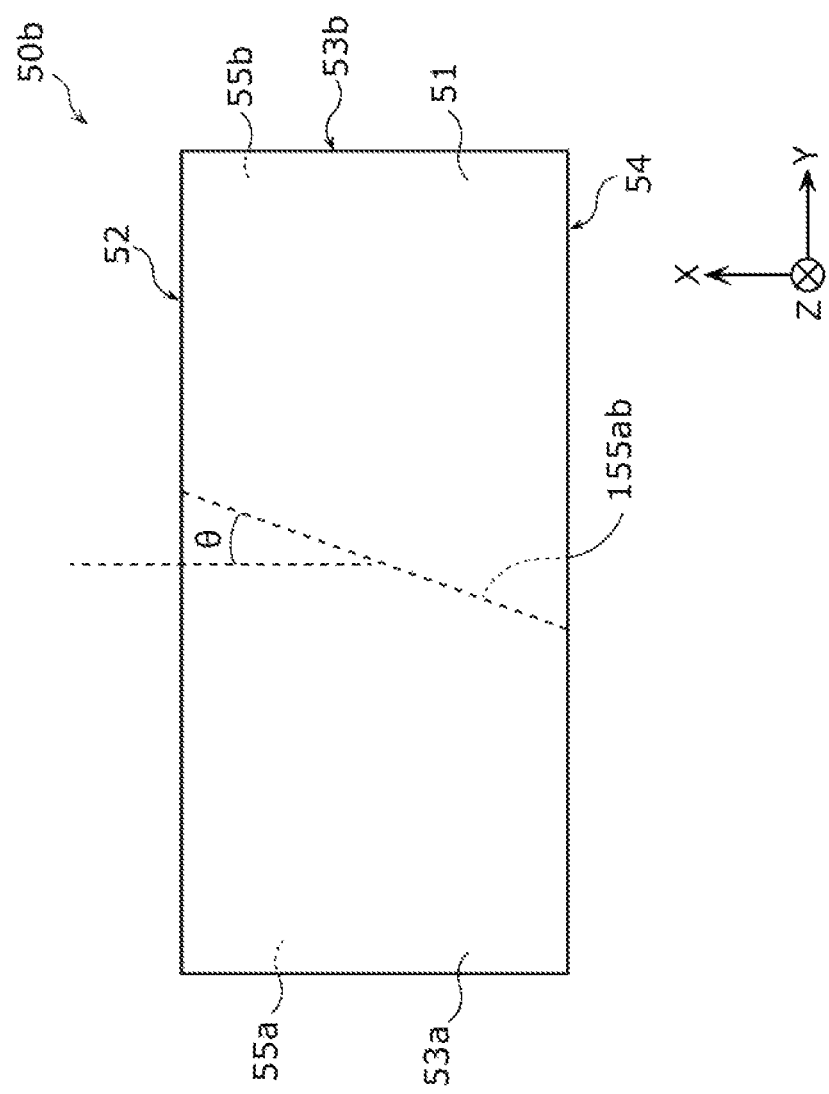

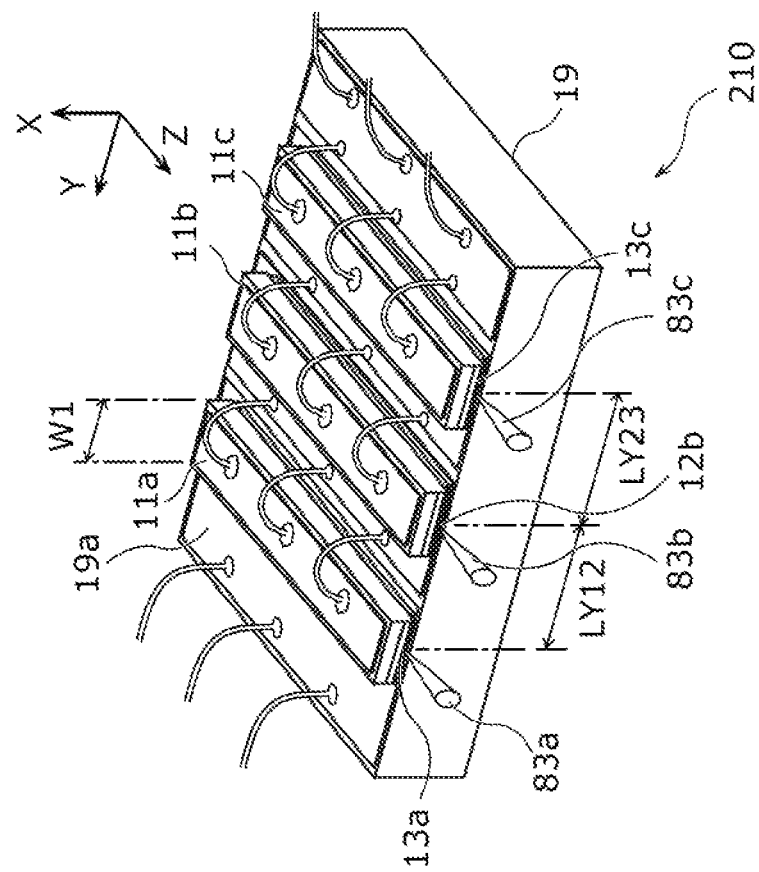

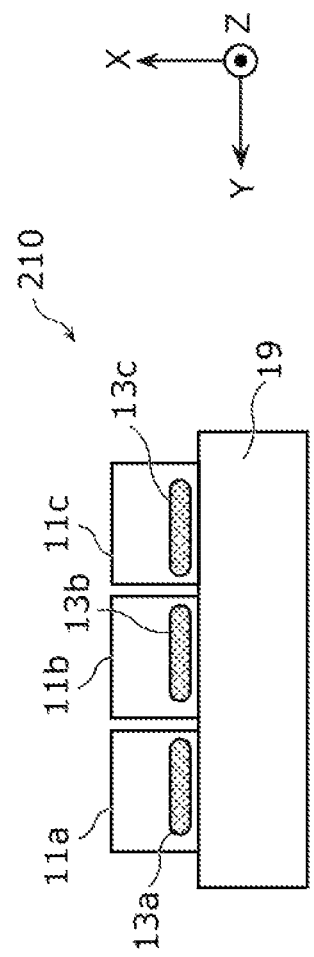

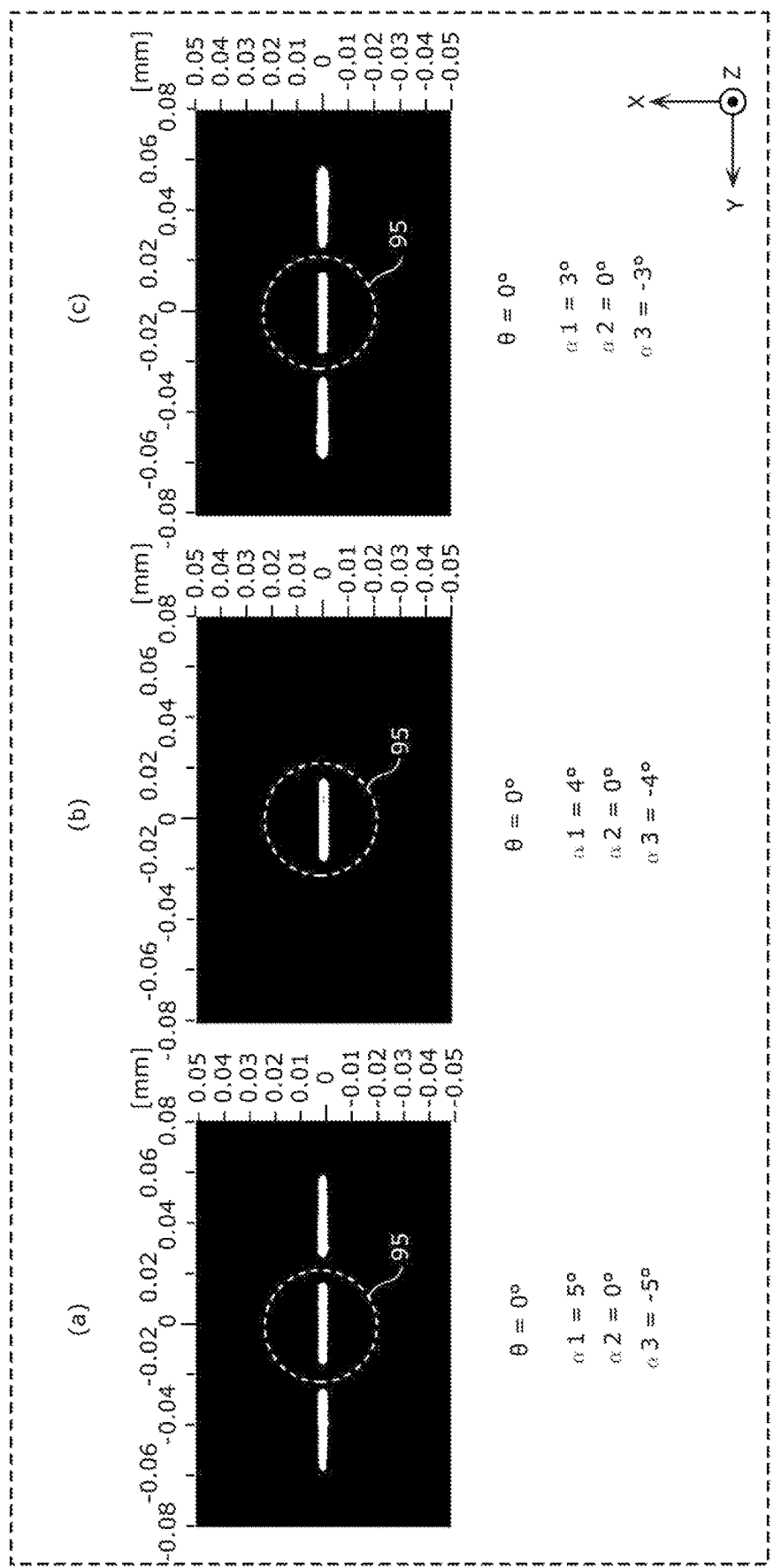

LIGHT SOURCE UNIT, ILLUMINATION DEVICE, PROCESSING EQUIPMENT, AND DEFLECTION ELEMENT

CROSS REFERENCE TO RELATED APPLICATIONS

This is a continuation application of PCT International Application No. PCT/JP2019/043784 filed on Nov. 8, 2019, designating the United States of America, which is based on and claims priority of Japanese Patent Application No. 2018-229344 filed on Dec. 6, 2018. The entire disclosures of the above-identified applications, including this specifications, drawings and claims are incorporated herein by reference in their entirety.

FIELD

The present disclosure relates to light source units, illumination devices, pieces of processing equipment, and deflection elements used therein.

BACKGROUND

For example, light source units that emit light with extremely high power such that its optical output exceeds 1 watt are currently under development. The application of light source units, which are particularly capable of efficiently emitting light with excellent directivity, to various usages is under consideration. Semiconductor light-emitting devices are examples of light sources for use in such light source units. A semiconductor light-emitting device includes, for instance: semiconductor light-emitting elements each having an optical waveguide and being represented by a laser diode; and a package on which the semiconductor light-emitting elements are mounted. For example, semiconductor light-emitting devices that use, for instance, InAlGaP-based or InAlGaAs-based compound semiconductors are under development as the following light sources: light sources for industrial processing devices such as welding devices, processing devices, laser scribing devices, and thin-film annealing devices; long-wavelength light sources for display; and light detection and ranging (LiDAR) infrared light sources. Moreover, semiconductor light-emitting devices that use, for instance, InAlGaN-based nitride semiconductors are under development as light sources for image display devices such as laser displays or projectors for projection mapping, and also as excitation light sources of white solid-state light sources. A light source unit in which a semiconductor light-emitting device as an excitation light source is combined with a phosphor is capable of emitting white light having high luminance. Light source units as such are therefore currently under development as light sources for projectors and vehicle headlights.

These light source units are required to emit, for example, light with extremely high power exceeding several watts in total from small light emission portions. A configuration that uses light sources may be adopted to attain such light with high power. In this case, ingenuity of all kinds is necessary also to achieve a structure for effectively combining lights emitted from light sources disposed in light source units.

In order to address the above problems, PTL 1 or PTL 2, for example, proposes a structure of a light source unit in which light sources are combined.

The following describes conventional light source units with reference to FIG. 17 and FIG. 18. FIG. 17 and FIG. 18 are schematic diagrams illustrating structures of light source units disclosed in PTL 1 and PTL 2, respectively.

As illustrated in FIG. 17, light source unit 1600 disclosed in PTL 1 includes light source 1611 having three emitters, lens 1631 that converts emitted light to parallel light, and optical element 1650 including optical surfaces 1651a, 1651b, and 1651c having slight tilt angles with respect to a principal surface of optical element 1650 which are different from one another. With such a configuration, light source unit 1600 emits luminous flux group 1660. An attempt is made to focus luminous fluxes at one point by focusing, using a lens for example, luminous flux group 1660 emitted from such light source unit 1600.

As illustrated in FIG. 18, light source unit 1001 disclosed in PTL 2 includes laser light sources 1005 disposed inside package 1003, first lenses 1007, second lenses 1009, reflection mirrors 1011, condenser lens 1013, and optical fiber 1015. Laser light emitted from each of laser light sources 1005 is transmitted to condenser lens 1013 via first lens 1007, second lens 1009, and reflection mirror 1011. The laser light incident on condenser lens 1013 is collected by condenser lens 1013 and enters optical fiber 1015. PTL 2 attempts to achieve light source unit 1001 having excellent efficiency in combining lights into an optical fiber.

CITATION LIST

Patent Literature

PTL 1: International Publication No. WO2014/115194
PTL 2: Japanese Unexamined Patent Application Publication No. 2013-235943

SUMMARY

Technical Problems

Light source unit 1600 disclosed in PTL 1, however, focuses luminous fluxes at one point, thereby damaging, for instance, an optical element provided as a light collection surface. In the case where a phosphor or an end face of an optical fiber is used as a light collection surface, laser light concentrated at one point might damage substances forming the light collection surface.

Moreover, in light source unit 1001 disclosed in PTL 2, since the heights of laser light sources 1005 are different from one another, second lenses 1009 corresponding to laser light sources 1005, for instance, are necessary. In other words, light source unit 1001 requires more components.

The present disclosure is conceived to overcome such problems and provides a light source unit that has a simplified configuration and is capable of focusing beams on a light collection surface while suppressing the peak intensities of the beams.

Solutions to Problems

A light source unit according to an aspect of the present disclosure to overcome the above problems is a light source unit having an optical axis parallel to a first direction. The light source unit includes: a first light emission point from which a first beam is emitted; a second light emission point from which a second beam is emitted, the second light emission point being disposed apart from the first light emission point in a second direction perpendicular to the first direction; a deflection element that deflects at least one of the first beam or the second beam in a third direction perpendicular to the first direction and the second direction; and a first condensing optical element that focuses, on a light collection surface, the first beam and the second beam that are emitted from the deflection element. The first beam at the first light emission point overlaps the second beam at the second light emission point in the third direction. On the light collection surface, the first beam and the second beam overlap each other in the second direction and are separate from each other in the third direction.

A light source unit according to an aspect of the present disclosure may include a plurality of light emission points including the first light emission point and the second light emission point. On the light collection surface, a distance between the first beam and the second beam in the second direction may be at most 0.8 times a beam width of the first beam or the second beam in the second direction, and a distance between the first beam and the second beam in the third direction may be at least a value obtained by dividing 0.75 times a beam width of the first beam or the second beam in the third direction by a total number of the plurality of light emission points.

A light source unit according to another aspect of the present disclosure to overcome the above problems is a light source unit having an optical axis parallel to a first direction. The light source unit includes: a first light emission point from which a first beam is emitted; a second light emission point from which a second beam is emitted, the second light emission point being disposed apart from the first light emission point in a second direction perpendicular to the first direction; and a deflection element that deflects at least one of the first beam or the second beam in a third direction perpendicular to the first direction and the second direction. The first beam is incident on the deflection element from a fourth direction perpendicular to the third direction. The second beam is incident on the deflection element from a fifth direction perpendicular to the third direction. An angle between the fourth direction and the first direction is different from an angle between the fifth direction and the first direction in a view along the third direction. The first beam is emitted from the deflection element in a sixth direction. The second beam is emitted from the deflection element in a seventh direction. An angle between the fourth direction and the sixth direction in a view along the second direction is a first deflection angle. An angle between the fifth direction and the seventh direction in the view along the second direction is a second deflection angle. The first deflection angle is different from the second deflection angle. The sixth direction and the seventh direction are parallel to each other in the view along the third direction.

A light source unit according to yet another aspect of the present disclosure to overcome the above problems is a light source unit having an optical axis parallel to a first direction. The light source unit includes: a first light emission point from which a first beam is emitted; a second light emission point from which a second beam is emitted, the second light emission point being disposed apart from the first light emission point in a second direction perpendicular to the first direction; and a deflection element that deflects at least one of the first beam or the second beam in a third direction perpendicular to the first direction and the second direction. The first beam is incident on the deflection element from a fourth direction perpendicular to the third direction. The second beam is incident on the deflection element from a fifth direction perpendicular to the third direction. The first beam is emitted from the deflection element in a sixth direction. The second beam is emitted from the deflection element in a seventh direction. An angle between the fourth direction and the sixth direction in a view along the second direction is a first deflection angle. An angle between the fifth direction and the seventh direction in the view along the second direction is a second deflection angle. An angle between the fourth direction and the sixth direction in a view along the third direction is a third deflection angle. An angle between the fifth direction and the seventh direction in the view along the third direction is a fourth deflection angle. The first deflection angle is different from the second deflection angle. The third deflection angle is different from the fourth deflection angle.

In the light source unit according to each aspect of the present disclosure, the first beam at the first light emission point may overlap the second beam at the second light emission point in the third direction.

The light source unit according to each aspect of the present disclosure may further include a first condensing optical element that focuses, on a light collection surface, the first beam and the second beam that are emitted from the deflection element.

In the light source unit according to each aspect of the present disclosure, on the light collection surface, the first beam and the second beam may overlap each other in the second direction and are separate from each other in the third direction.

In the light source unit according to each aspect of the present disclosure, the deflection element may include a first incident surface on which the first beam is incident and a second incident surface on which the second beam is incident. An intersection line between the first incident surface and a plane perpendicular to the third direction may be tilted by a first tilt angle from the second direction. An intersection line between the second incident surface and a plane perpendicular to the third direction may be tilted by a second tilt angle from the second direction. An intersection line between the first incident surface and a plane perpendicular to the second direction may be tilted by a third tilt angle from the third direction. An intersection line between the second incident surface and a plane perpendicular to the second direction may be tilted by a fourth tilt angle from the third direction. The first tilt angle may be different from the second tilt angle. The third tilt angle may be different from the fourth tilt angle. An absolute value of the third tilt angle may be smaller than an absolute value of the first tilt angle. An absolute value of the fourth tilt angle may be smaller than an absolute value of the second tilt angle.

In the light source unit according to each aspect of the present disclosure, the deflection element may include a first emission surface from which the first beam is emitted and a second emission surface from which the second beam is emitted. An intersection line between the first emission surface and a plane perpendicular to the third direction may be tilted by a fifth tilt angle from the second direction. An intersection line between the second emission surface and a plane perpendicular to the third direction may be tilted by a sixth tilt angle from the second direction. An intersection line between the first emission surface and a plane perpendicular to the second direction may be tilted by a seventh tilt angle from the third direction. An intersection line between the second emission surface and a plane perpendicular to the second direction may be tilted by an eighth tilt angle from the third direction. The fifth tilt angle may be different from the sixth tilt angle. The seventh tilt angle may be different from the eighth tilt angle. An absolute value of the seventh tilt angle may be smaller than an absolute value of the fifth tilt angle. An absolute value of the eighth tilt angle may be smaller than an absolute value of the sixth tilt angle.

In the light source unit according to each aspect of the present disclosure, the deflection element may include a bottom surface perpendicular to the third direction.

In the light source unit according to each aspect of the present disclosure, the first light emission point and the second light emission point may be included in a semiconductor laser array disposed on a single semiconductor substrate.

The light source unit according to each aspect of the present disclosure may further include a mounting surface perpendicular to the third direction. The first light emission point may be included in a first semiconductor light-emitting element chip. The second light emission point may be included in a second semiconductor light-emitting element chip. The first semiconductor light-emitting element chip and the second semiconductor light-emitting element chip may be mounted on the mounting surface.

The light source unit according to each aspect of the present disclosure may further include a package that accommodates the first light emission point and the second light emission point.

The light source unit according to each aspect of the present disclosure may further include a second condensing optical element disposed between (i) the deflection element and (ii) the first light emission point and the second light emission point.

In the light source unit according to each aspect of the present disclosure, the second condensing optical element may reduce dispersions of the first beam and the second beam.

In the light source unit according to each aspect of the present disclosure, the first beam may be emitted from the second condensing optical element in the fourth direction, and the second beam may be emitted from the second condensing optical element in the fifth direction.

In the light source unit according to each aspect of the present disclosure, the first beam may intersect with the second beam between the second condensing optical element and the deflection element.

In the light source unit according to each aspect of the present disclosure, the second condensing optical element may include a collimating lens that focuses the first beam and the second beam at least in the second direction, and the collimating lens may reduce dispersions of the first beam and the second beam.

In the light source unit according to each aspect of the present disclosure, at an incident position where the first beam is incident on the second condensing optical element, the first beam may be a first distance away from an optical axis of the second condensing optical element in the second direction, and at an incident position where the second beam is incident on the second condensing optical element, the second beam may be a second distance away from the optical axis of the second condensing optical element in the second direction.

In the light source unit according to each aspect of the present disclosure, the second condensing optical element may include: a fast axis collimating lens that reduces dispersions of the first beam and the second beam in the third direction; and a slow axis collimating lens that reduces dispersions of the first beam and the second beam in the second direction, and the slow axis collimating lens may be disposed between the fast axis collimating lens and the deflection element.

In the light source unit according to each aspect of the present disclosure, the first beam and the second beam may be focused on the light collection surface to form a shape that is longer in the second direction than in the third direction.

In the light source unit according to each aspect of the present disclosure, a near-field pattern of the first beam at the first light emission point and a near-field pattern of the second beam at the second light emission point each may have a shape that is longer in the second direction than in the third direction.

The light source unit according to each aspect of the present disclosure may further include a phosphor on which the first beam and the second beam are incident.

An illumination device according to each aspect of the present disclosure includes the above light source unit. Emitted light from the phosphor is used as illumination light.

The light source unit according to each aspect of the present disclosure may further include an optical fiber that the first beam and the second beam enter. The first beam and the second beam may be focused on an end face of the optical fiber.

A piece of processing equipment according to an aspect of the present disclosure to overcome the above problems includes the above light source unit. Emitted light from the optical fiber is used for processing.

A deflection element according to an aspect of the present disclosure to overcome the above problems is a deflection element that includes: a first incident surface that intersects with a first direction and a second direction perpendicular to the first direction; a second incident surface that intersects with the first direction; and a bottom surface perpendicular to a third direction that is perpendicular to the first direction and the second direction. An intersection line between the first incident surface and a plane perpendicular to the third direction is tilted by a first tilt angle from the second direction. An intersection line between the second incident surface and a plane perpendicular to the third direction is tilted by a second tilt angle from the second direction. An intersection line between the first incident surface and a plane perpendicular to the second direction is tilted by a third tilt angle from the first direction. An intersection between the second incident surface and a plane perpendicular to the second direction is tilted by a fourth tilt angle from the first direction. The first tilt angle is different from the second tilt angle. The third tilt angle is different from the fourth tilt angle. An absolute value of the third tilt angle is smaller than an absolute value of the first tilt angle. An absolute value of the fourth tilt angle is smaller than an absolute value of the second tilt angle.

The deflection element according to an aspect of the present disclosure may further include an emission surface that faces the first incident surface and the second incident surface and is perpendicular to the first direction.

In the deflection element according to an aspect of the present disclosure, the first incident surface and the second incident surface may form a protrusion.

Advantageous Effects

According to the present disclosure, it is possible to provide, for instance, a light source unit that has a simplified configuration and is capable of focusing beams on a light collection surface while suppressing the peak intensities of the beams.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2A is a perspective view illustrating an overall configuration of a semiconductor light-emitting device according to Embodiment 1.

FIG. 3A is a perspective view illustrating an overall configuration of a deflection element according to Embodiment 1.

FIG. 3C is a plan view illustrating the overall configuration of the deflection element according to Embodiment 1.

FIG. 5C is a front view illustrating the overall configuration of the deflection element according to Variation 2 of Embodiment 1.

FIG. 7A is a perspective view illustrating an overall configuration of a semiconductor light-emitting device according to Embodiment 2.

FIG. 7C is a schematic diagram illustrating a relative position of light emission points according to Embodiment 2.

FIG. 9B is a diagram illustrating examples of a simulation result obtained using the light source unit according to the comparative example.

DESCRIPTION OF EMBODIMENTS

Figure 1A:
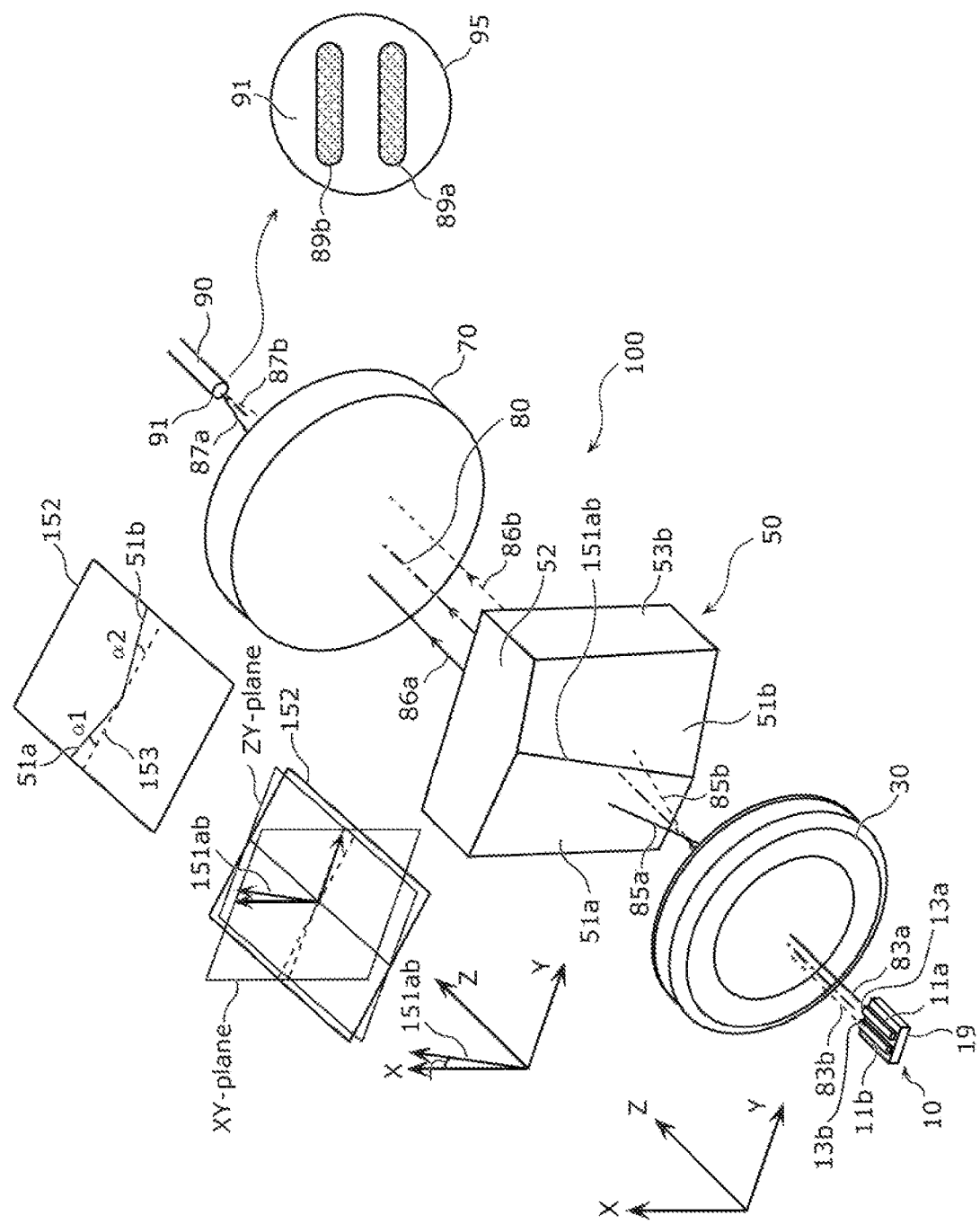
FIG. 1A is a perspective view illustrating an overall configuration of a light source unit according to Embodiment 1.

Hereinafter, embodiments of the present disclosure will be described in detail with reference to the drawings. Note that each of the embodiments described below shows a specific example of the present disclosure. Accordingly, numerical values, shapes, materials, elements, placement and connection of the elements, etc. in the following embodiments are mere examples, and are not intended to limit the present disclosure. Among the elements described in the following embodiments, elements not recited in any of the independent claims that define the broadest concepts of the present disclosure are described as optional elements.

The drawings are schematic diagrams and do not necessarily provide strictly accurate illustrations. Therefore, scales and the like in the drawings do not necessarily coincide. Note that substantially like elements are assigned with like reference signs in the drawings, and redundant description is omitted or simplified.

Embodiment 1

A light source unit according to Embodiment 1 will be described.

[1-1. Overall Configuration]

First, an overall configuration of a light source unit according to the present embodiment will be described with reference to FIG. 1A through FIG. 3E. FIG. 1A, FIG. 1B, FIG. 1C, and FIG. 1D are a perspective view, a plan view, a lateral view, and a front view respectively illustrating an overall configuration of light source unit 100 according to the present embodiment. The plan view, the lateral view, and the front view are views of light source unit 100 in views along an X-axis direction (a third direction described later), a Y-axis direction (a second direction described later), and a Z-axis direction (a first direction described later) of light source unit 100, respectively.

Figure 1B:
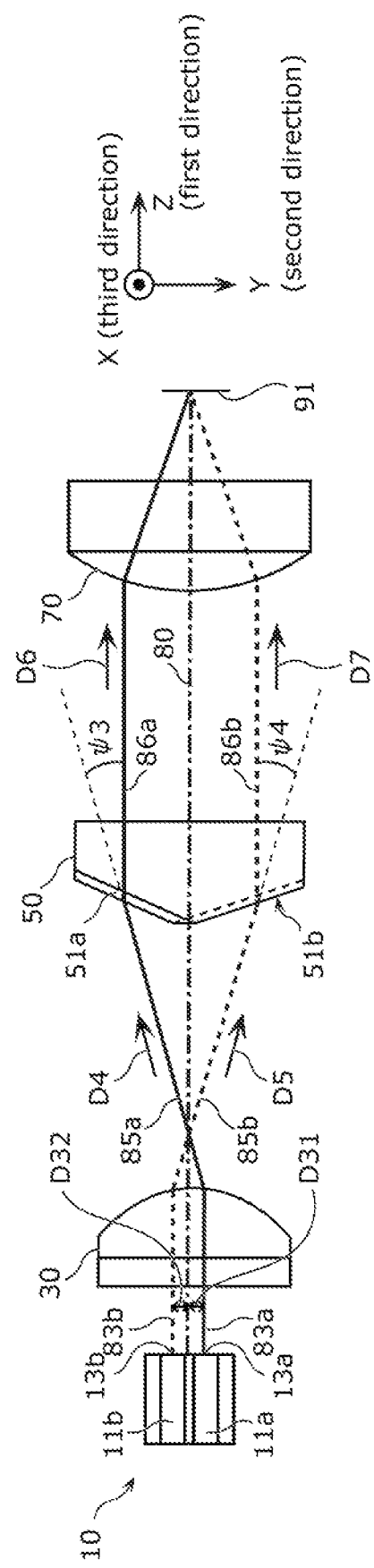
FIG. 1B is a plan view illustrating the overall configuration of the light source unit according to Embodiment 1.
Figure 1C:
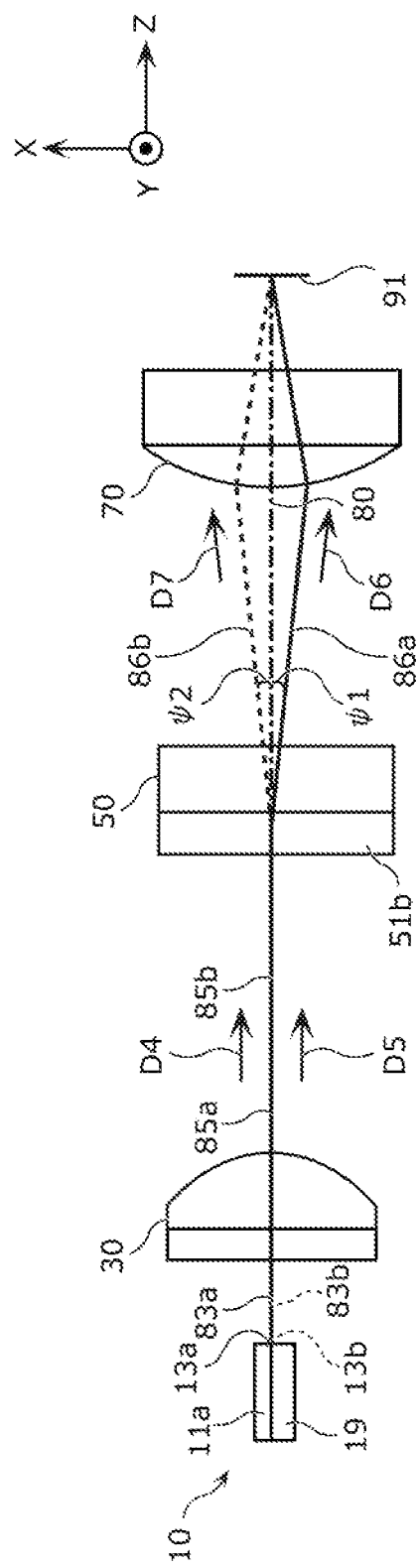
FIG. 1C is a lateral view illustrating the overall configuration of the light source unit according to Embodiment 1.

As illustrated in FIG. 1A, light source unit 100 according to the present embodiment has optical axis 80 parallel to the first direction (the Z-axis direction in the figure). As illustrated in FIG. 1A through FIG. 1C, light source unit 100 includes first light emission point 13a, second light emission point 13b, deflection element 50, and first condensing optical element 70. In the present embodiment, light source unit 100 also includes second condensing optical element 30 and light collection object 90, as illustrated in FIG. 1A through FIG. 1D.

As illustrated in FIG. 1A or FIG. 1B, first beam 83a is emitted from first light emission point 13a. Second light emission point 13b is disposed apart from first light emission point 13a in the second direction (the Y-axis direction in the figure) perpendicular to the first direction, and second beam 83b is emitted from second light emission point 13b. In the present embodiment, light source unit 100 includes semiconductor light-emitting device 10 that includes first light emission point 13a and second light emission point 13b.

Hereinafter, elements included in light source unit 100 will be described.

[1-1-1. Semiconductor Light-Emitting Device]

Semiconductor light-emitting device 10 will be described with reference to FIG. 2A and FIG. 2B in addition to FIG. 1A through FIG. 1D. FIG. 2A is a perspective view illustrating an overall configuration of semiconductor light-emitting device 10 according to the present embodiment. FIG. 2B is a circuit diagram illustrating an equivalent circuit of semiconductor light-emitting device 10 according to the present embodiment.

In the present embodiment, semiconductor light-emitting device 10 includes first semiconductor light-emitting element chip 11a, second semiconductor light-emitting element chip 11b, and submount 19, as illustrated in FIG. 2A. First light emission point 13a is included in first semiconductor light-emitting element chip 11a and second light emission point 13b is included in second semiconductor light-emitting element chip 11b. First light emission point 13a is located distance (center-to-center distance) LY12 away from second light emission point 13b in the second direction.

As illustrated in FIG. 1C, first beam 83a at first light emission point 13a overlaps second beam 83b at second light emission point 13b in the third direction (the X-axis direction in the figure). Moreover, a state described by "first beam 83a overlaps second beam 83b in the third direction" is not limited to a state in which first beam 83a perfectly overlaps second beam 83b. The definition of the term "overlap" will be described later.

Figure 1D:
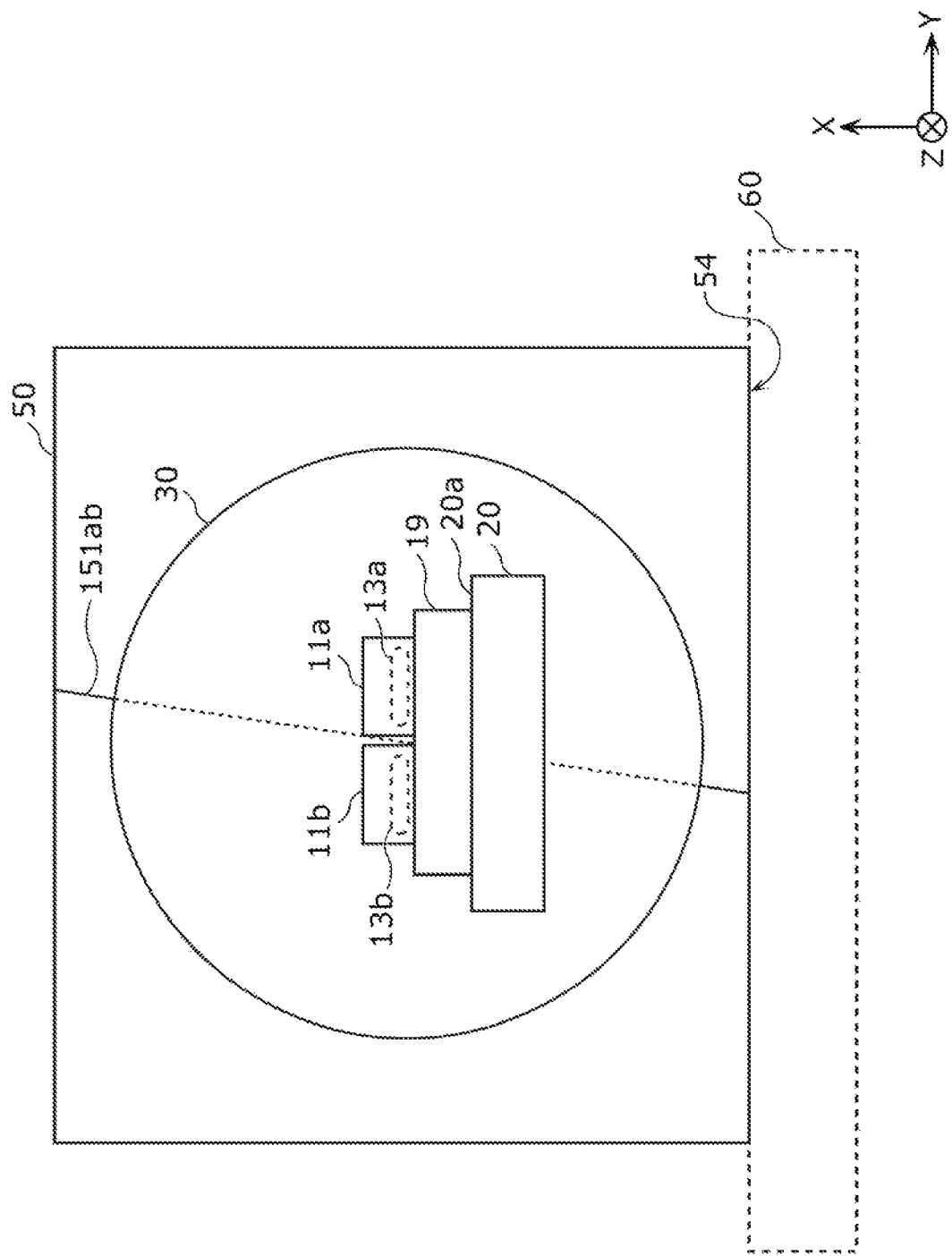
FIG. 1D is a front view illustrating the overall configuration of the light source unit according to Embodiment 1.
Figure 2B:
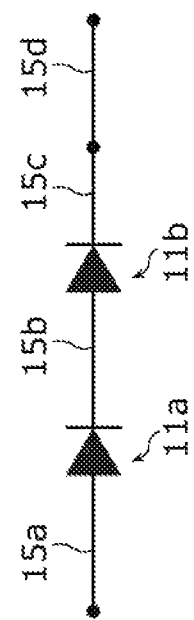
FIG. 2B is a circuit diagram illustrating an equivalent circuit of the semiconductor light-emitting device according to Embodiment 1.

As illustrated in FIG. 1D, light source unit 100 includes package 20 that has mounting surface 20a perpendicular to the third direction, and first semiconductor light-emitting element chip 11a and second semiconductor light-emitting element chip 11b are mounted on mounting surface 20a of package 20 via submount 19.

First semiconductor light-emitting element chip 11a has an optical waveguide, although not shown in the figure, extending in the first direction (the Z-axis direction) and including first light emission point 13a at an end portion of the optical waveguide. First light emission point 13a has a near-field pattern which is a light emission intensity distribution. The near-field pattern is a pattern having a shape that is longer in the second direction (the Y-axis direction) than in the third direction (the X-axis direction). Stated differently, the light intensity distribution expands more in the second direction than in the third direction. Second semiconductor light-emitting element chip 11b has the same optical waveguide and near-field pattern as those of first semiconductor light-emitting element chip 11a.

Light source unit 100 includes package 20 that accommodates first light emission point 13a and second light emission point 13b. Package 20 is accommodated in housing 60 of light source unit 100, but only a portion of package 20 and a portion of housing 60 are illustrated in FIG. 1D. Mounting surface 20a is one plane of package 20. In other words, semiconductor light-emitting device 10 is mounted on package 20.

In the present embodiment, first semiconductor light-emitting element chip 11a and second semiconductor light-emitting element chip 11b are each a laser diode chip having an optical waveguide and emit first beam 83a and second beam 83b, each being laser light, in the first direction from first light emission point 13a and second light emission point 13b, respectively. A material constituting each semiconductor light-emitting element chip is, for example, an InAlGaP-based material including phosphorus as a group V element, an InAlGaAs-based material including arsenic as a group V element, or an InAlGaN-based material including nitrogen as a group V element. The wavelength of an emitting beam can be changed to a wavelength in the range of from approximately 350 nm to approximately 2000 nm by adjusting the composition of the material. Note that first semiconductor light-emitting element chip 11a and second semiconductor light-emitting element chip 11b are not limited to laser diode chips. First semiconductor light-emitting element chip 11a and second semiconductor light-emitting element chip 11b each need to be, for example, an element that emits a beam with directivity such that parallel lighting is allowed with the use of a collimating lens, and may be a super luminescent diode (SLD), for example.

Submount 19 is a member on which first semiconductor light-emitting element chip 11a and second semiconductor light-emitting element chip 11b are mounted. First semiconductor light-emitting element chip 11a and second semiconductor light-emitting element chip 11b are fixed to submount 19 by a solder material such as AuSn not shown in the figure. In the present embodiment, the optical waveguide side of the semiconductor light-emitting element chip is positioned on the mounting surface 20a side, and this is so-called junction down mounting. Submount 19 is formed using a material having high thermal conductivity, such as aluminum nitride, silicon carbide, or Cu, and functions also as a heat sink.

First semiconductor light-emitting element chip 11a and second semiconductor light-emitting element chip 11b are connected in series to electrode 19a on submount 19 by metallic wires 15b and 15c, as illustrated in FIG. 2B. Note that electrode 19a is omitted from FIG. 2B. Semiconductor light-emitting device 10 has metallic wires 15a and 15d, and a current is supplied from an external power source via metallic wires 15a and 15d. With such a configuration, semiconductor light-emitting device 10 is capable of causing light-emitting elements to simultaneously emit light with a constant current. Note that in the case where submount 19 is formed using a conductive material such as Cu, an insulating material is interposed between submount 19 and electrode 19a.

Although the present embodiment has illustrated that first light emission point 13a and second light emission point 13b are included in semiconductor light-emitting device 10, first light emission point 13a and second light emission point 13b may be included in a light source other than a semiconductor light-emitting device. For example, first light emission point 13a and second light emission point 13b may be separately included in two fixed laser devices each being other than a semiconductor light-emitting device. Alternatively, first light emission point 13a and second light emission point 13b do not need to be included in a light source. For example, a point on each optical path of beams may be defined as a first light emission point or a second light emission point.

[1-1-2. Second Condensing Optical Element]

Second condensing optical element 30 is an element interposed between deflection element 50 and first and second light emission points 13a and 13b, as illustrated in FIG. 1A through FIG. 1D. Second condensing optical element 30 includes a collimating lens that focuses light at least in the second direction, and reduces the dispersions of first beam 83a and second beam 83b. In the present embodiment, second condensing optical element 30 is a collimating lens formed of an aspheric lens that reduces the dispersions of first beam 83a and second beam 83b in the second direction and the third direction.

Second condensing optical element 30 is disposed so that the optical axis thereof coincides with optical axis 80 of light source unit 100. As illustrated in FIG. 1B, at an incident position where first beam 83a is incident on second condensing optical element 30, first beam 83a is first distance D31 away from the optical axis of second condensing optical element 30 in the second direction. At an incident position where second beam 83b is incident on second condensing optical element 30, second beam 83b is second distance D32 away from the optical axis of second condensing optical element 30 in the second direction. The incident position of first beam 83a on second condensing optical element 30 is different from the incident position of second beam 83b on second condensing optical element 30. Note that either the incident position of first beam 83a or the incident position of second beam 83b on second condensing optical element 30 may overlap optical axis 80. In the present embodiment, the incident positions of first beam 83a and second beam 83b on second condensing optical element 30 are located in opposite directions with respect to optical axis 80 and are located almost the same distance away from optical axis 80.

First beam 83a is collimated and emitted from second condensing optical element 30 in fourth direction D4 whereas second beam 83b is collimated and emitted from second condensing optical element 30 in fifth direction D5 different from fourth direction D4. Fourth direction D4 is a direction in which first beam 83a is deflected from the first direction toward the second direction, and fifth direction D5 is a direction in which second beam 83b is deflected from the first direction toward the second direction oppositely to the direction in which first beam 83a is deflected. In the view along the third direction, an angle counterclockwise from the first direction is defined as a positive angle and an angle clockwise from the first direction is defined as a negative angle. In the present embodiment, the deflection angle of fourth direction D4 is negative and the deflection angle of fifth direction D5 is positive. Fourth direction D4 is rotated to the negative direction of the second direction (Y-axis) from the first direction, and fifth direction D5 is rotated to the positive direction of the second direction (Y-axis). First beam 85a and second beam 85b emitted from second condensing optical element 30 intersect with each other between second condensing optical element 30 and deflection element 50. In the present embodiment, the absolute value of the deflection angle for fourth direction D4 from the first direction toward the second direction is nearly equal to the absolute value of the deflection angle for fifth direction D5 from the first direction toward the second direction. Fourth direction D4 and fifth direction D5 are on the YZ-plane.

Since the incident position at which first beam 83a is incident on second condensing optical element 30 is different from the incident position at which second beam 83b is incident on second condensing optical element 30, it is possible to cause first beam 83a and second beam 83b to emit in different directions from second condensing optical element 30.

Although an aspheric lens is used as second condensing optical element 30 in the present embodiment, second condensing optical element 30 needs to be an optical element that focuses first beam 83a and second beam 83b at least in the second direction. For example, second condensing optical element 30 may be configured using two collimating lenses, one collimating in the third direction and the other collimating in the second direction, as will be described later.

[1-1-3. Deflection Element]

As illustrated in FIG. 1A through FIG. 1D, deflection element 50 is an element that deflects at least one of first beam 85a or second beam 85b in the third direction (the X-axis direction in each of the figures) perpendicular to the first direction and the second direction. In the present embodiment, deflection element 50 deflects both first beam 85a and second beam 85b in the third direction.

As illustrated in FIG. 1C, first beam 85a is incident on deflection element 50 from fourth direction D4 perpendicular to the third direction (the X-axis direction), and second beam 85b is incident on deflection element 50 from fifth direction D5 perpendicular to the third direction. As illustrated in FIG. 11, in a view along the third direction, an angle between fourth direction D4 and the first direction is different from an angle between fifth direction D5 and the first direction. Note that one of fourth direction D4 and fifth direction D5 may coincide with the first direction. In the view along the third direction, an angle counterclockwise from the first direction is defined as a positive angle and an angle clockwise from the first direction is defined as a negative angle. An angle between the first direction and fourth direction D4 is third deflection angle $\psi3$, and an angle between the first direction and fifth direction D5 is fourth deflection angle $\psi4$. In the present embodiment, in the view along the third direction, the absolute values of the angles of fourth direction D4 and fifth direction D5 relative to the first direction are approximately the same. The positive-negative relationship of other angles described below is likewise defined.

First beam 85a is emitted in sixth direction D6 from deflection element 50 while second beam 85b is emitted in seventh direction D7 from deflection element 50. As illustrated in FIG. 1C, sixth direction D6 is defined by a change of first deflection angle ψ1 from fourth direction D4 toward the third direction in a view along the second direction, and seventh direction D7 is defined by a change of second deflection angle ψ2 from fifth direction D5 toward the third direction in the view along the second direction. An angle between fourth direction D4 and sixth direction D6 in the view along the second direction is first deflection angle ψ1, and an angle between fifth direction D5 and seventh direction D7 in the view along the second direction is second deflection angle ψ2. In the view along the second direction, an angle counterclockwise on the ZX-plane is defined as a positive angle and an angle clockwise on the ZX-plane is defined as a negative angle. In the present embodiment, first deflection angle ψ1 is positive and second deflection angle ψ2 is negative. Sixth direction D6 is rotated to the negative direction of the third direction (X-axis) from fourth direction D4 and seventh direction D7 is rotated to the positive direction of the third direction (X-axis) from fifth direction D5. As illustrated in FIG. 1C, first deflection angle ψ1 is different from second deflection angle ψ2 in the view along the second direction, and as illustrated in FIG. 1B, sixth direction D6 and seventh direction D7 are parallel to each other in the view along the third direction. In addition, sixth direction D6 and seventh direction D7 are parallel to the first direction in the view along the third direction. Note that the expression "sixth direction D6 and seventh direction D7 are parallel to each other" is not limited to a state in which sixth direction D6 and seventh direction D7 are exactly parallel to each other and includes also a state in which sixth direction D6 and seventh direction D7 are substantially parallel to each other. In this specification, sixth direction D6 and seventh direction D7 are parallel to each other means, for example, a state in which an angle between sixth direction D6 and seventh direction D7 is at most 1 degree. With sixth direction D6 and seventh direction D7 being parallel to each other, it is easier to set, for first beam 85a and second beam 85b, the same focal length extending to light collection surface 91 described later, using first condensing optical element 70 described later.

As illustrated in FIG. 1C, an angle between fourth direction D4 and sixth direction D6 in the view along the second direction is first deflection angle ψ1, and an angle between fifth direction D5 and seventh direction D7 in the view along the second direction is second deflection angle ψ2. As illustrated in FIG. 1B, sixth direction D6 is defined by a change of third deflection angle ψ3 from fourth direction D4 toward the second direction in the view along the third direction, and seventh direction D7 is defined by a change of fourth deflection angle ψ4 from fifth direction D5 toward the second direction in the view along the third direction. An angle between fourth direction D4 and sixth direction D6 in the view along the third direction is third deflection angle ψ3, and an angle between fifth direction D5 and seventh direction D7 in the view along the third direction is fourth deflection angle ψ4. Third deflection angle ψ3 is different from fourth deflection angle ψ4, and first deflection angle ψ1 is different from second deflection angle ψ2. In the present embodiment, third defection angle ψ3 is positive and fourth deflection angle ψ4 is negative. Note that in the present embodiment, since sixth direction D6 and seventh direction D7 are parallel to the first direction in the view along the third direction, third deflection angle ψ3 is equal to the angle between fourth direction D4 and the first direction in the view along the third direction, and fourth deflection angle ψ4 is equal to the angle between fifth direction D5 and the first direction in the view along the third direction.

Figure 3B:
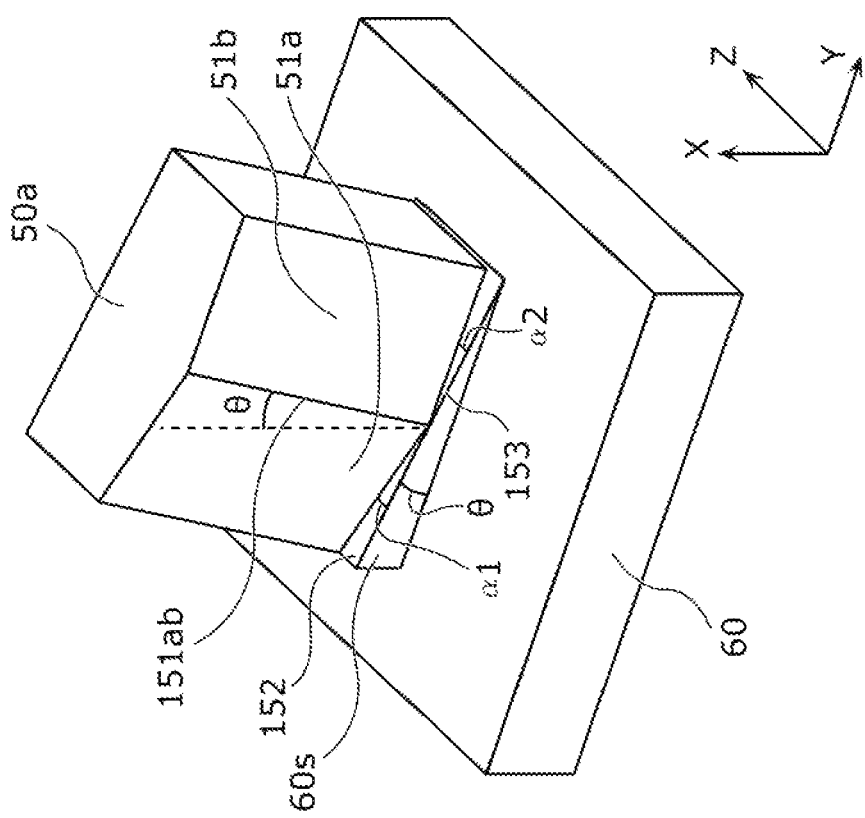
FIG. 3B is a perspective view illustrating an overall configuration of a deflection element according to Variation 1 of Embodiment 1.
Figure 3D:
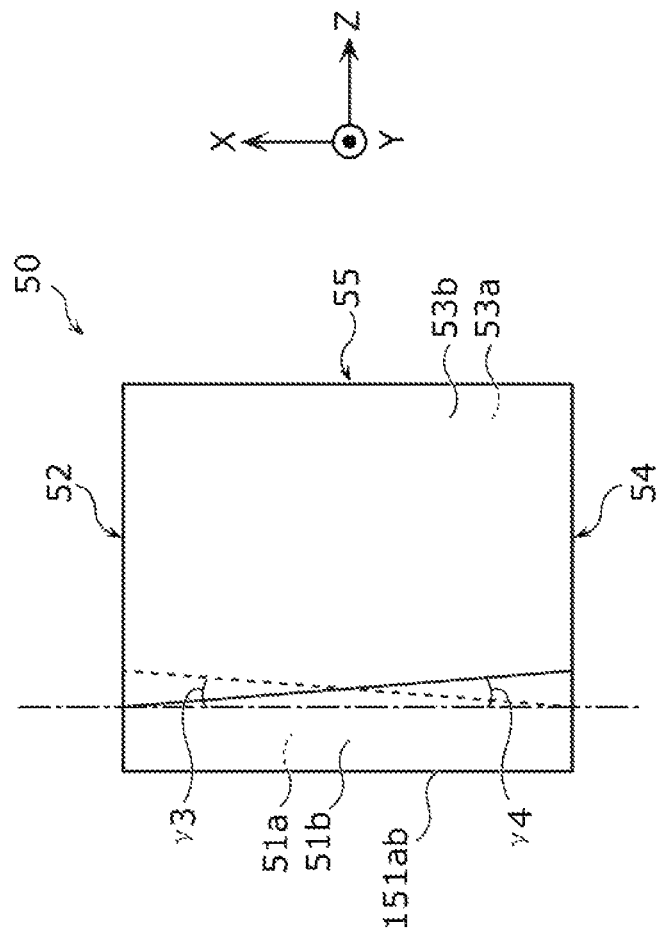
FIG. 3D is a lateral view illustrating the overall configuration of the deflection element according to Embodiment 1.
Figure 3E:
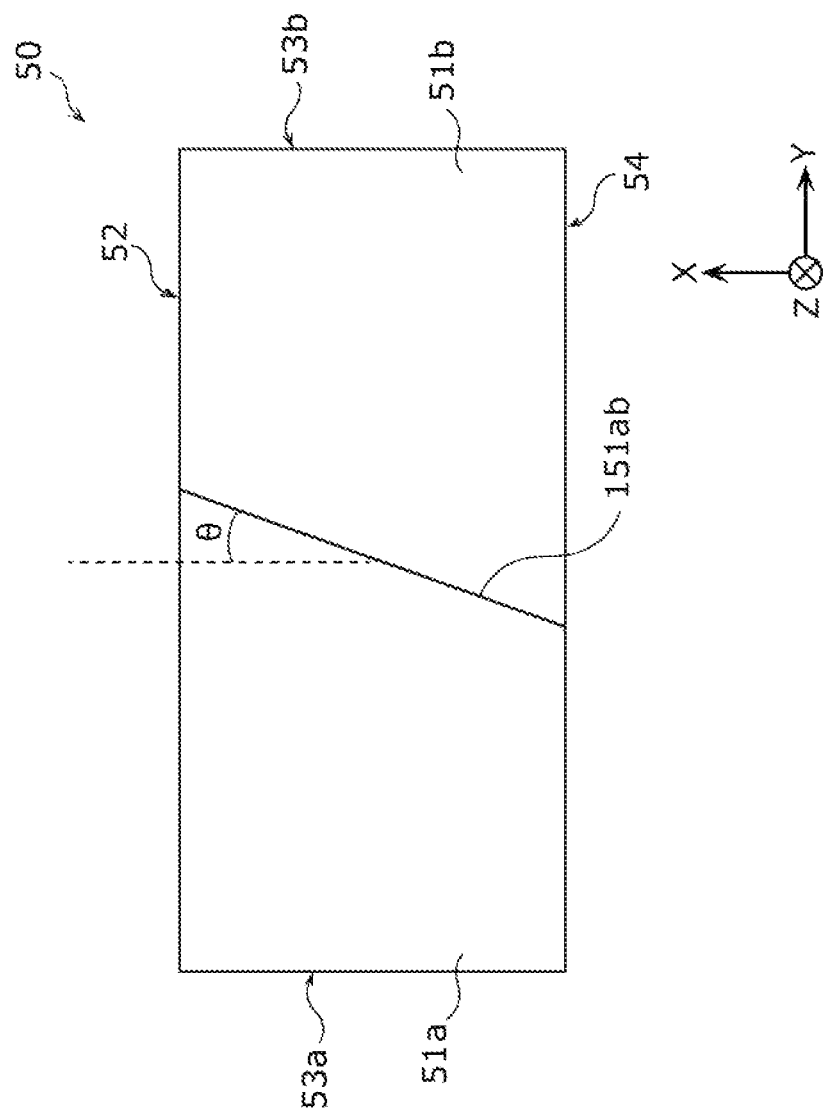
FIG. 3E is a front view illustrating the overall configuration of the deflection element according to Embodiment 1.

The following describes deflection element 50 with reference to FIG. 3A through FIG. 3E in addition to FIG. 1A through FIG. 1D. FIG. 3A is a perspective view illustrating an overall configuration of deflection element 50 according to the present embodiment. FIG. 3A illustrates, in addition to deflection element 50, housing 60 on which deflection element 50 is disposed. FIG. 3B is a perspective view illustrating an overall configuration of deflection element 50a according to Variation 1 of the present embodiment. FIG. 3B illustrates, in addition to deflection element 50a, spacer 60s that supports deflection element 50a as well as housing 60 on which deflection element 50a is disposed. FIG. 3C, FIG. 3D, and FIG. 3E are a plan view, a lateral view, and a front view respectively illustrating the configuration of deflection element 50 according to the present embodiment. The plan view, the lateral view, and the front view are views of deflection element 50 in views along an X-axis direction (a third direction), a Y-axis direction (a second direction), and a Z-axis direction (a first direction), respectively.

In the present embodiment, deflection element 50 is a light-transmissive optical element and has first incident surface 51a on which first beam 85a is incident and second incident surface 51b on which second beam 85b is incident, as illustrated in FIG. 3A. First incident surface 51a intersects with second incident surface 51b at intersection line 151ab. As illustrated in FIG. 1A, FIG. 3A, or FIG. 3B, intersection line 151ab is tilted by angle θ with respect to the third direction (the X-axis direction). An anti-reflective film formed of, for instance, a dielectric multilayer film may be formed on the beam incident surface and the beam emission surface of deflection element 50. A material, which has high light transmittance for a wavelength of a transmitting beam and is not deteriorated by its beam power even after long hours of radiation, is selected for a basic material constituting deflection element 50. Specifically, in the case where each of the semiconductor light-emitting element chips is a laser diode chip which emits a beam with a wavelength of at least 350 nm and at most 550 nm and is formed using a material that includes, for example, nitrogen as a group V element, an inorganic glass-based material such as quartz, BK7, N-BK7, or waterwhite glass can be selected as the constituent material of deflection element 50. On the other hand, in the case where each of the semiconductor light-emitting element chips is a laser diode chip which emits a beam with a wavelength of at least 550 nm and at most 2000 nm and is formed using a material that includes, for example, arsenic or phosphorus as a group V element, an inorganic glass-based material such as quartz, BK7, N-BK7, or waterwhite glass, or a resin-based material having high light resistance, such as silicone or a cycloolefin polymer resin can be selected as the constituent material of deflection element 50.

The shape of deflection element 50 will be described with reference to FIG. 3A and FIG. 3B. First incident surface 51a and second incident surface 51b of deflection element 50 according to the present embodiment can be also achieved by using deflection element 50a illustrated in FIG. 3B as a variation of deflection element 50.

Regarding deflection elements 50 and 50a, the following first describes a configuration of deflection element 50a and subsequently describes deflection element 50.

Deflection element 50a is a light-transmissive optical element in the shape of a pentagonal prism having, as lateral surfaces, first incident surface 51a and second incident surface 51b that are perpendicular to reference plane 152 tilted by angle θ about the Z-axis with respect to the ZY-plane. In the example illustrated in FIG. 3B, reference plane 152 is a plane normal to intersection line 151ab between first incident surface 51a and second incident surface 51b of deflection element 50a. Deflection element 50a is a pentagonal prism in which five lateral surfaces including first incident surface 51a and second incident surface 51b are perpendicular to a bottom surface located on reference plane 152, and the bottom surface is parallel to a top surface. First incident surface 51a and second incident surface 51b of deflection element 50a are tilted by tilt angles α1 and α2, respectively, with respect to reference line 153 which is an intersection line between reference plane 152 and the XY-plane. In the example illustrated in FIG. 3B, deflection element 50a is disposed on housing 60 via spacer 60s that is sphenoid and at which two planes facing each other intersect with each other at angle θ. By inserting sphenoid spacer 60s between housing 60 and deflection element 50a, it is possible for first beam 85a and second beam 85b to be respectively incident on first incident surface 51a and second incident surface 51b each having a desired tilt.

Deflection element 50a according to a variation of the present embodiment has first incident surface 51a and second incident surface 51b having the same tilt angles as those of first incident surface 51a and second incident surface 51b of deflection element 50 illustrated in FIG. 3A. It is therefore possible for deflection element 50a according to the variation to deflect first beam 85a and second beam 85b in the same manner as deflection element 50 illustrated in FIG. 3A.

With the use of deflection element 50a according to this variation, it is possible to simplify more the manufacture of deflection element 50a compared to the case of using deflection element 50.

Deflection element 50 according to the present embodiment has emission surface 55, lateral surfaces 53a and 53b, and top surface 52. Emission surface 55 faces first incident surface 51a and second incident surface 51b, and is a plane perpendicular to the first direction. Lateral surface 53a is a plane that joins first incident surface 51a to emission surface 55 and lateral surface 53b is a plane that joins second incident surface 51b to emission surface 55. Top surface 52 and bottom surface 54 are disposed on opposite sides of deflection element 50. Deflection element 50 is formed by cutting away portions of the following surfaces from deflection element 50a according to the variation so that an intersection line between first incident surface 51a and second incident surface 51b is tilted at angle θ relative to the third direction: a lateral surface that neighbors first incident surface 51a; a lateral surface that neighbors second incident surface 5ib; the top surface; and the bottom surface. In other words, two lateral surfaces of deflection element 50a which are parallel to each other are each cut away with a plane perpendicular to the top surface of housing 60 and also to the Y-axis direction, and the top surface and the bottom surface of deflection element 50a are cut away with a plane parallel to the top surface of housing 60.

Accordingly, lateral surface 53a has a trapezoid shape having the lower base (located on the bottom surface side) that is longer than the upper base (located on the top surface side), while lateral surface 53b has a trapezoid shape having the upper base (located on the top surface side) longer than the lower base (located on the bottom surface side). In addition, first incident surface 51a has a trapezoid shape having the lower base (located on the bottom surface side) shorter than the upper base (located on the top surface side), while second incident surface 51b has a trapezoid shape having the lower base (located on the bottom surface side) longer than the upper base (located on the top surface side). First incident surface 51a and second incident surface 51b of deflection element 50 form protrusion 50p protruding in the first direction, as illustrated in FIG. 3C.

Note that only a portion of housing 60 is illustrated in FIG. 3A or FIG. 3B.

Next, a detailed configuration of deflection element 50 according to the present embodiment will be described.

As illustrated in FIG. 3C, an intersection line between first incident surface 51a and a plane perpendicular to the third direction is tilted by first tilt angle β1 from the second direction (see the dashed-dotted line in FIG. 3C), and an intersection line between second incident surface 51b and a plane perpendicular to the third direction is tilted by second tilt angle β2 from the second direction. Note that the plane perpendicular to the third direction may be, for example, bottom surface 54 (or top surface 52) illustrated in FIG. 3C. In FIG. 3C, an angle between the second direction and the intersection line between bottom surface 54 and first incident surface 51a is presented as first tilt angle β1, whereas an angle between the second direction and the intersection line between top surface 52 and second incident surface 51b is presented as second tilt angle β2. The same applies to a plane perpendicular to the third direction described below. Regarding first tilt angle β1 and second tilt angle β2, in the view along the third direction, an angle counterclockwise from the second direction is defined as a positive angle and an angle clockwise from the second direction is defined as a negative angle.

As illustrated in FIG. 3D, an intersection line between first incident surface 51a and a plane perpendicular to the second direction is tilted by third tilt angle γ3 from the third direction (see the dashed-dotted line in FIG. 3D), and an intersection line between second incident surface 51b and a plane perpendicular to the second direction is tilted by fourth tilt angle γ4 from the third direction. Note that the plane perpendicular to the second direction may be, for example, lateral surface 53b (or lateral surface 53a) illustrated in FIG. 3D. In FIG. 3D, an angle between the third direction and the intersection line between lateral surface 53a and first incident surface 51a is presented as third tilt angle γ3, while an angle between the third direction and the intersection line between lateral surface 53b and second incident surface 51b is presented as fourth tilt angle γ4. The same applies to a plane perpendicular to the second direction described below. Regarding third tilt angle γ3 and fourth tilt angle γ4, in the view along the second direction, an angle counterclockwise from the third direction is defined as a positive angle and an angle clockwise from the third direction is defined as a negative angle.

Here, first tilt angle β1 is different from second tilt angle β2, and third tilt angle γ3 is different from fourth tilt angle γ4. The absolute value of third tilt angle γ3 is smaller than the absolute value of first tilt angle β1, and the absolute value of fourth tilt angle γ4 is smaller than the absolute value of second tilt angle Γ2. In the present embodiment, the absolute value of first tilt angle β1 is equal to the absolute value of second tilt angle β2, and the absolute value of third tilt angle γ3 is equal to the absolute value of fourth tilt angle γ4.

First tilt angle β1 and second tilt angle β2 each of which is a tilt angle, from the second direction, of an intersection line between an incident surface and a plane perpendicular to the third direction are different from each other. It is therefore possible to define sixth direction D6, which is a direction in which first beam 85a is to travel, by a change of third deflection angle ψ3 from fourth direction D4 toward the second direction in the view along the third direction. It is also possible to define seventh direction D7, which is a direction in which second beam 85b is to travel, by a change of fourth deflection angle ψ4 from fifth direction D5 toward the second direction in the view along the third direction. First tilt angle β1 and second tilt angle β2 are set so that with first beam 85a and second beam 85b being deflected at third deflection angle ψ3 and fourth deflection angle ψ4, respectively, sixth direction D6 and seventh direction D7 are parallel to each other in the view along the third direction.

In addition, since first incident surface 51a is tilted upward by third tilt angle γ3 which is a tilt angle, from the third direction, of the intersection line between an incident surface and a plane perpendicular to the second direction, it is possible to direct sixth direction D6, which is a direction in which first beam 85a is to travel, by first deflection angle ψ1 from fourth direction D4 toward the first direction in the view along the second direction. Moreover, since second incident surface 51b is tilted downward by fourth tilt angle γ4, it is possible to direct seventh direction D7, which is a direction in which second beam 85b is to travel, by second deflection angle β2 from fifth direction D5 toward the first direction in the view along the second direction. Sixth direction D6 and seventh direction D7 are directed respectively downward from fourth direction D4 and upward from fifth direction D5.

As illustrated in FIG. 3D or FIG. 3E, deflection element 50 has first incident surface 51a that intersects with the first direction and the second direction, second incident surface 51b that intersects with the first direction, and bottom surface 54 perpendicular to the third direction. Since deflection element 50 has bottom surface 54 perpendicular to the third direction, it is possible to more easily place deflection element 50 on housing 60 compared to deflection element 50a, for instance. In the present embodiment, second incident surface 51b intersects not only with the first direction but also with the second direction.

Although a light-transmissive optical element is used as deflection element 50 in the present embodiment, deflection element 50 needs to be an element that deflects at least one of first beam 85a or second beam 85b in the third direction. It is also possible to configure deflection element 50 using, for example, two mirrors, one reflecting first beam 85a and the other reflecting second beam 85b.

[1-1-4. First Condensing Optical Element]

First condensing optical element 70 is an optical element that focuses, on light collection surface 91, first beam 86a and second beam 86b emitted from deflection element 50, as illustrated in FIG. 1A through FIG. 1C. In the present embodiment, first condensing optical element 70 is a condensing lens that focuses first beam 86a and second beam 86b in the second direction and the third direction. First beam 87a and second beam 87b that are emitted from first condensing optical element 70 are focused on light collection surface 91 of light collection object 90.

Although a condensing lens is used as first condensing optical element 70 in the present embodiment, first condensing optical element 70 needs to be an optical element that focuses first beam 86a and second beam 86b on light collection surface 91. It is also possible to use, for example, an aspheric mirror as first condensing optical element 70.

First tilt angle β1 and second tilt angle β2 are set so that sixth direction D6 and seventh direction D7 are parallel to each other in the view along the third direction in the present embodiment, but may be set so that sixth direction D6 and seventh direction D7 are not parallel to each other in the view along the third direction.

[1-1-5. Light Collection Object]

As illustrated in FIG. 1A through FIG. 1C, light collection object 90 is a component that first beam 87a and second beam 87b, which are emitted from first condensing optical element 70 and then focused, enter. In the present embodiment, light collection object 90 is an optical fiber and light collection surface 91 is an end face of the optical fiber. First beam 87a and second beam 87b are incident on an area mainly corresponding to core 95 of light collection surface 91 of light collection object 90. Accordingly, it is possible to combine first beam 87a and second beam 87b into the optical fiber. As illustrated in FIG. 1A, first light collection spot 89a and second light collection spot 89b which respectively correspond to the radiation areas of first beam 87a and second beam 87b are aligned in the first direction (the X-axis direction) on light collection surface 91 of light collection object 90.

Note that light collection object 90 is not specifically limited and may be, for example, a phosphor as such that is described later.

[1-2. Operations and Advantageous Effects]

Figure 4:
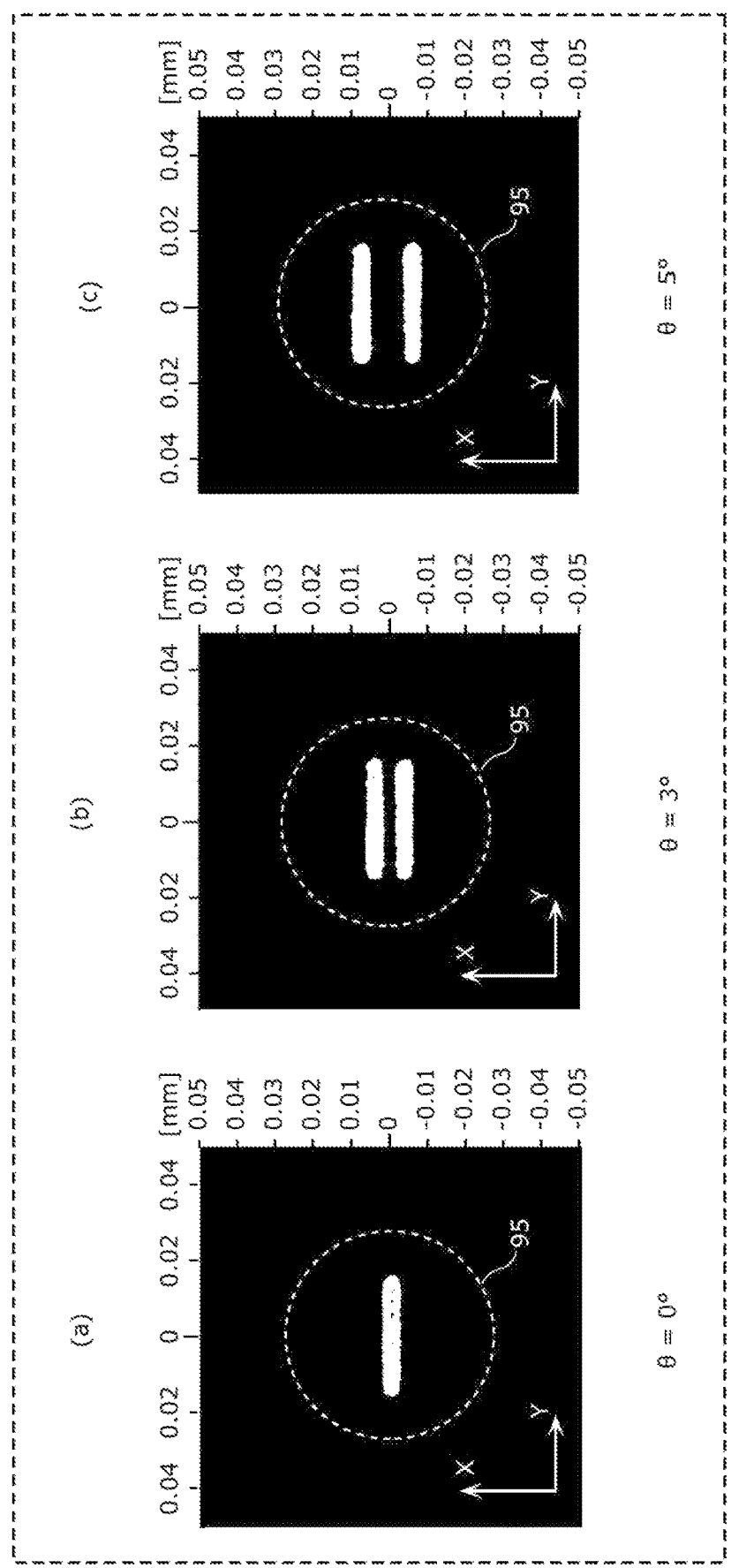
FIG. 4 is a diagram illustrating examples of a simulation result obtained using the light source unit according to Embodiment 1.

Next, operations and advantageous effects of light source unit 100 according to the present embodiment will be described using simulation results. FIG. 4 is a diagram illustrating examples of a simulation result obtained using light source unit 100 according to the present embodiment. FIG. 4 illustrates light intensity distributions on light collection surface 91 obtained from three simulation results. Note that the contour of core 95 of the optical fiber is indicated by a dotted circle in FIG. 4.

In a simulation, beam widths δx in the third direction in near-field patterns of first beam 83a and second beam 83b respectively emitted from first light emission point 13a and second light emission point 13b were defined as 1 μm, and beam widths δy in the second direction in the near-field patterns were defined as 30 μm. Thus, in this specification, a beam width means a full width between positions at which the intensity is reduced to $1/e^2$ of the peak intensity. In the present embodiment, the near-field pattern of first beam 83a at first light emission point 13a and the near-field pattern of second beam 83b at second light emission point 13b each have a shape that is longer in the second direction than in the third direction.

Moreover, distance LY12 between first light emission point 13a and second light emission point 13b was defined as 150 μm, the focal length of second condensing optical element 30 formed of an aspheric lens was defined as 4 mm, and the focal length of first condensing optical element 70 formed of an aspheric lens was defined as 4 mm. Distance LY12 is a distance between the peak intensity position of first light emission point 13a and the peak intensity position of second light emission point 13b. When the refractive index of deflection element 50 is 1.5, first tilt angle β1 of first incident surface 51a of deflection element 50 and second tilt angle β2 of second incident surface 51b are +2 degrees and −2 degrees, respectively.

Light collection object 90 is an optical fiber and light collection surface 91 is an end face of the optical fiber having the core diameter of 105 μm.

Three simulations were conducted when angle θ of deflection element 50 is 0 degree, 3 degrees, and 5 degrees under the following conditions. Light intensity distributions (a), (b), and (c) on light collection surface 91 illustrated in FIG. 4 illustrate light intensity distributions when angle θ of deflection element 50 is 0 degree, 3 degrees, and 5 degrees, respectively. The case where angle θ of deflection element 50 is 0 degree is a case where intersection line 151ab of deflection element 50a illustrated in FIG. 3B is normal to the ZY-plane, and corresponds to a comparative example of light source unit 100 according to the present embodiment. The case where angle θ of deflection element 50 is greater than 0 degree corresponds to light source unit 100 according to the present embodiment.

When angle θ of deflection element 50 is 0 degree, first incident surface 51a and second incident surface 51b of deflection element 50 are perpendicular to the ZY-plane. Accordingly, first deflection angle ψ1 and second deflection angle ψ2 illustrated in FIG. 1C are 0 degree. The position of first light collection spot 89a and the position of second light collection spot 89b in the third direction therefore overlap each other on light collection surface 91, as illustrated in light intensity distribution (a) in FIG. 4. In this case, since the peak positions of the light intensities of first beam 87a and second beam 87b are concentrated approximately at one point on light collection surface 91, this heightens the risk that light collection surface 91, which is an end face of the optical fiber, may receive damages.

When angle θ of deflection element 50 is 3 degrees or 5 degrees, on the other hand, deflection element 50 deflects at least one of first beam 85a or second beam 85b in the third direction. In the present embodiment, an angle between the fourth direction D4 and sixth direction D6 of first beam 86a in the view along the second direction is first deflection angle ψ1, as described above. Moreover, an angle between fifth direction D5 and seventh direction D7 of second beam 86b is second deflection angle ψ2 in the view along the second direction. Therefore, first beam 83a at first light emission point 13a overlaps second beam 83b at second light emission point 13b in the third direction, but first beam 87a and second beam 87b are separate from each other in the third direction on light collection surface 91, as illustrated in light intensity distribution (b) or (c) in FIG. 4, and yet overlap each other in the second direction. Accordingly, it is possible to focus two beams so that the two beams do not overlap each other in such a small area like core 95 of the end face of the optical fiber. In other words, with light source unit 100 according to the present embodiment, it is possible to focus two beams while suppressing the peak intensities of the beams. Moreover, such an advantageous effect can be obtained with light source unit 100 having a configuration simplified with the use of deflection element 50.

In the present embodiment, the beam widths of first beam 87a and second beam 87b are longer in the second direction than in the third direction, as illustrated in light intensity distribution (b) or (c) in FIG. 4. Accordingly, it is possible to suppress the expansion of a light intensity distribution in the third direction even when first beam 87a and second beam 87b are separate from each other in the third direction, as described above.

Furthermore, as illustrated in light intensity distribution (b) or (c) in FIG. 4, since the positions of the light collection spots of two beams on light collection surface 91 can be adjusted by adjusting angle θ of deflection element 50, it is easy to adjust a light intensity distribution (a light density distribution if stated differently) on light collection surface 91.

Note that two light collection spots on light collection surface 91 may partly overlap each other in the third direction and do not need to perfectly overlap each other in the second direction. The definitions of the terms "overlap" and "separate" used herein will be described later.

[1-3. Variation 2]

Next, a deflection element according to Variation 2 of the present embodiment will be described. Deflection element 50 according to the present embodiment deflects first beam 85a and second beam 85b by first incident surface 51a and second incident surface 51b, respectively, but the deflection element according to Variation 2 deflects first beam 85a and second beam 85b by respective emission surfaces. The following describes, with reference to FIG. 5A through FIG. 5C, the deflection element according to this variation, focusing on such a difference.

Figure 5A:
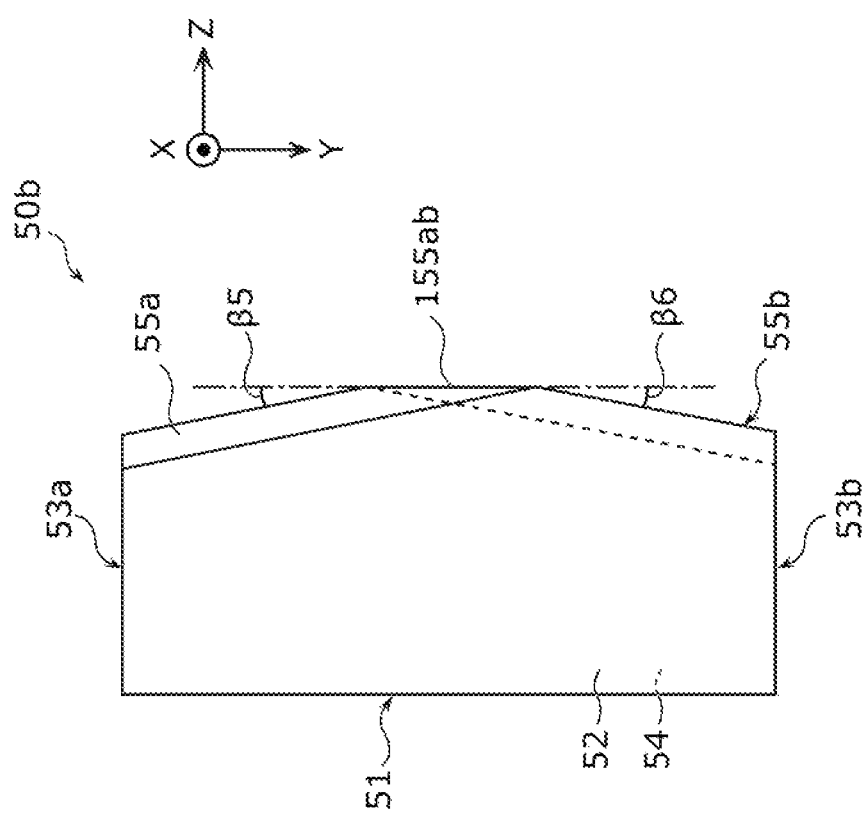
FIG. 5A is a plan view illustrating an overall configuration of a deflection element according to Variation 2 of Embodiment 1.
Figure 5B:
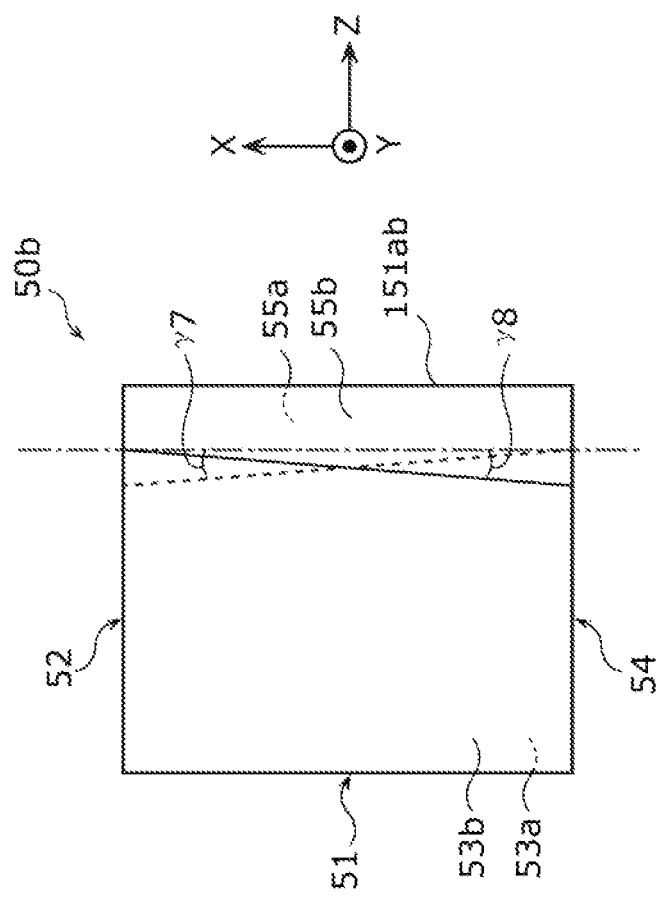
FIG. 5B is a lateral view illustrating the overall configuration of the deflection element according to Variation 2 of Embodiment 1.

FIG. 5A, FIG. 5B, and FIG. 5C are a plan view, a lateral view, and a front view respectively illustrating an overall configuration of deflection element 50b according to this variation.

Deflection element 50b is a light-transmissive optical element and has incident surface 51, first emission surface 55a, second emission surface 55b, bottom surface 54, lateral surfaces 53a and 53b, and top surface 52, as illustrated in FIG. 5A through FIG. 5C. Incident surface 51 is a plane on which first beam 85a and second beam 85b are incident, and first emission surface 55a and second emission surface 55b are planes from which first beam 86a and second beam 86b are respectively emitted. First emission surface 55a intersects with second emission surface 55b at intersection line 155ab.

As illustrated in FIG. 5A, an intersection line between first emission surface 55a and a plane perpendicular to the third direction is tilted by fifth tilt angle β5 from the second direction (see the dashed-dotted line in FIG. 5A), and an intersection line between second emission surface 55b and a plane perpendicular to the third direction is tilted by sixth tilt angle β6 from the second direction.

As illustrated in FIG. 5B, an intersection line between first emission surface 55a and a plane perpendicular to the second direction is tilted by seventh tilt angle γ7 from the third direction (see the dashed-dotted line in FIG. 5B), and an intersection line between second emission surface 55b and a plane perpendicular to the second direction is tilted by eighth tilt angle γ8 from the third direction. Here, fifth tilt angle β5 is different from sixth tilt angle β6, and seventh tilt angle γ7 is different from eighth tilt angle γ8. The absolute value of seventh tilt angle γ7 is smaller than the absolute value of fifth tilt angle β5, and the absolute value of eighth tilt angle γ8 is smaller than the absolute value of sixth tilt angle β6.

Even with deflection element 50b having the configuration as described above, the same advantageous effects as obtained with deflection element 50 are produced. In other words, with deflection element 50b, it is possible to deflect at least one of the first beam or the second beam in the third direction. Therefore, by using deflection element 50b according to this variation instead of deflection element 50, for light source unit 100, it is possible to achieve a light source unit that has a simplified configuration and is capable of focusing two beams on light collection surface 91 while suppressing the peak intensities of the beams.

Deflection element 50b according to this variation also has bottom surface 54 perpendicular to the third direction, and lateral surfaces 53a and 53b that are parallel to the third direction, as is the case of deflection element 50. Accordingly, it is possible to easily place deflection element 50b on housing 60, for instance.

Note that first emission surface 55a and second emission surface 55b of deflection element 50b according to this variation may be combined with deflection element 50 according to the present embodiment. In other words, the first beam and the second beam may be deflected by both the incident surfaces and the emission surfaces of a deflection element.

Embodiment 2

A light source unit according to Embodiment 2 will be described. Main differences between the light source unit according to the present embodiment and light source unit 100 according to Embodiment 1 are the number of light emission points and the number of beams. The following describes, with reference to FIG. 6 through FIG. 10C, the light source unit according to the present embodiment, focusing on the main differences from light source unit 100 according to Embodiment 1.

[2-1. Overall Configuration]

Figure 6:
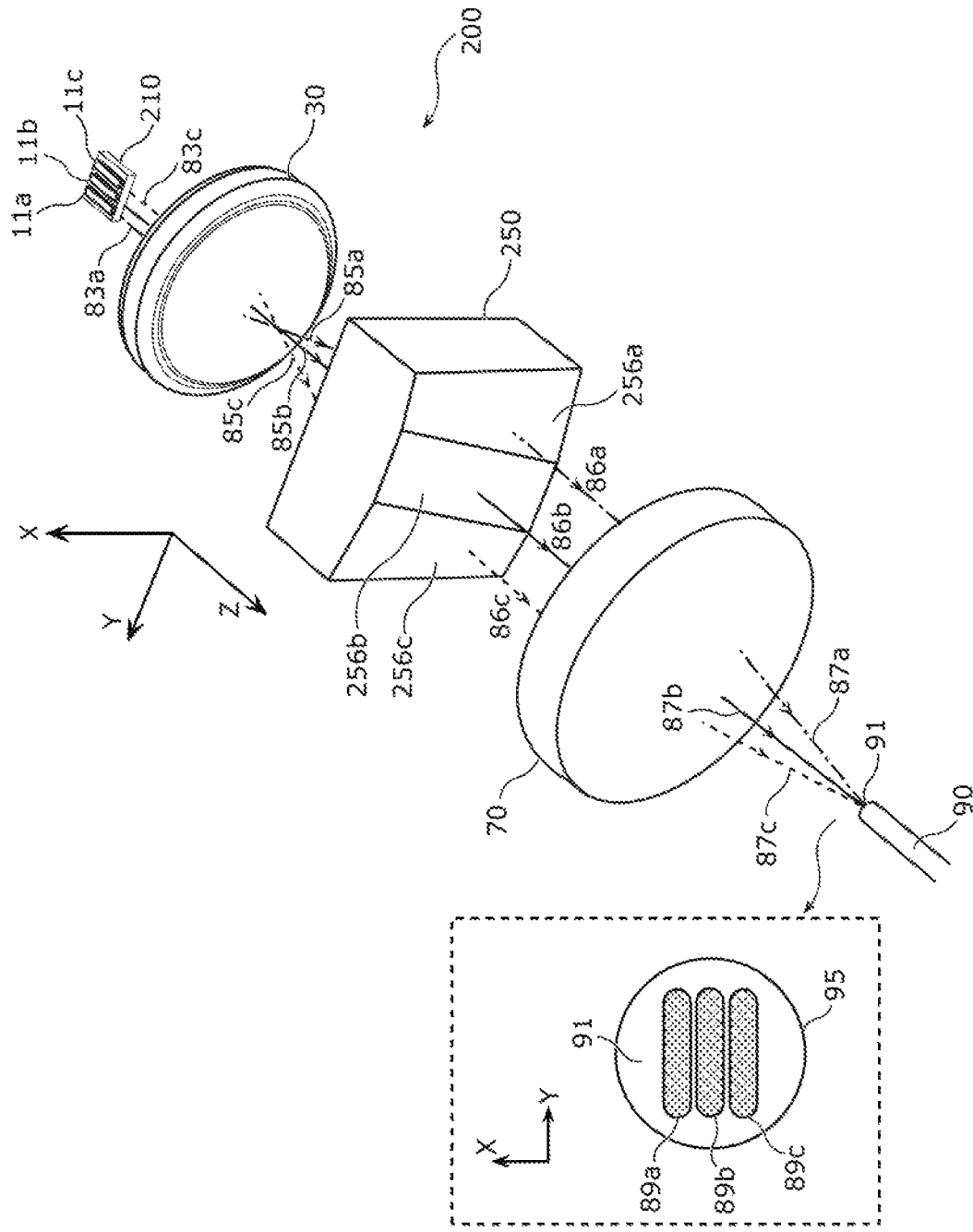
FIG. 6 is a perspective view illustrating an overall configuration of a light source unit according to Embodiment 2.

First, an overall configuration of the light source unit according to the present embodiment will be described. FIG. 6 is a perspective view illustrating an overall configuration of light source unit 200 according to the present embodiment. As illustrated in FIG. 6, light source unit 200 includes: semiconductor light-emitting device 210 including a plurality of light emission spots; second condensing optical element 30; deflection element 250; first condensing optical element 70; and light collection object 90.

[2-1-1. Semiconductor Light-Emitting Device]

Semiconductor light-emitting device 210 according to the present embodiment will be described with reference to FIG. 7A. FIG. 7A is a perspective view illustrating an overall configuration of semiconductor light-emitting device 210 according to the present embodiment.

As illustrated in FIG. 7A, semiconductor light-emitting device 210 includes first semiconductor light-emitting element chip 11a, second semiconductor light-emitting element chip 11b, third semiconductor light-emitting element chip 11c, and submount 19. Semiconductor light-emitting device 210 includes a plurality of light emission points including first light emission point 13a and second light emission point 13b. Among the plurality of light emission points, first light emission point 13a and second light emission point 13b are two light emission points adjacent to each other. First light emission point 13a is included in first semiconductor light-emitting element chip 11a, second light emission point 13b is included in second semiconductor light-emitting element chip 11b, and third light emission point 13c is included in third semiconductor light-emitting element chip 11c. First light emission point 13a is distance LY12 away from second light emission point 13b in the second direction, and second light emission point 13b is distance LY23 away from third light emission point 13c in the second direction. Third semiconductor light-emitting element chip 11c may have the same configuration as first semiconductor light-emitting element chip 11a and second semiconductor light-emitting element chip 11b.

First beam 83a at first light emission point 13a, second beam 83b at second light emission point 13b, and third beam 83c at third light emission point 13c overlap each other in the third direction.

First semiconductor light-emitting element chip 11a, second semiconductor light-emitting element chip 11b, and third semiconductor light-emitting element chip 11c are connected in series to electrode 19a on submount 19 by metallic wires, as illustrated in FIG. 7A.

Figure 7B:
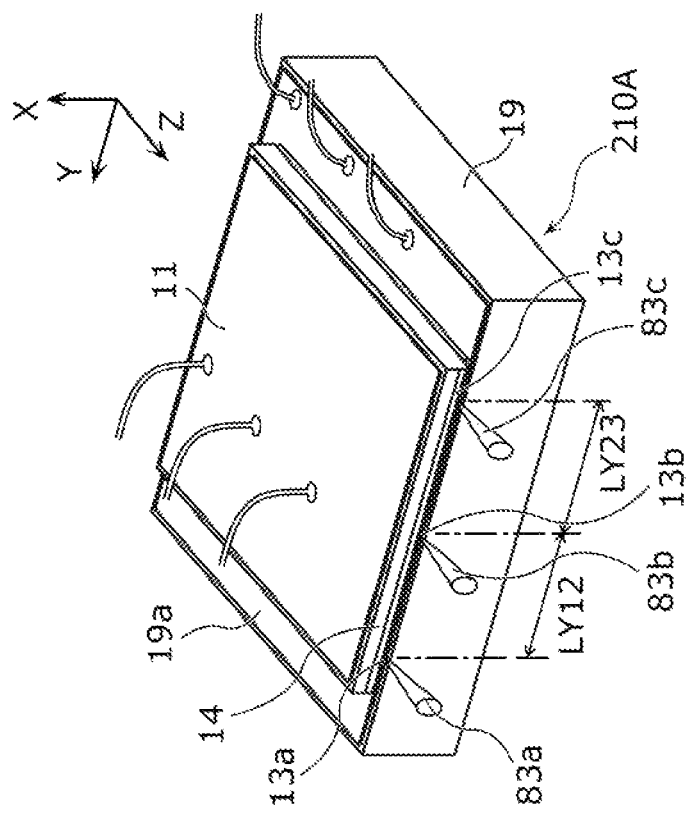
FIG. 7B is a perspective view illustrating an overall configuration of a semiconductor light-emitting device according to Variation 1 of Embodiment 2.

Although each of the light emission points is included in a separate semiconductor light-emitting element chip in semiconductor light-emitting device 210 according to the present embodiment, the configuration of the semiconductor light-emitting device is not limited to this example. A semiconductor light-emitting device according to Variation 1 of the present embodiment will be described with reference to FIG. 7B. FIG. 7B is a perspective view illustrating an overall configuration of semiconductor light-emitting device 210A according to Variation 1 of the present embodiment.

As illustrated in FIG. 7B, semiconductor light-emitting device 210A according to this variation includes semiconductor laser array 11 and submount 19. Semiconductor laser array 11 is a semiconductor light-emitting element chip that has three optical waveguides formed on the same semiconductor substrate. First light emission point 13a, second light emission point 13b, and third light emission point 13c are included in semiconductor laser array 11 and located on the emission end faces of the three optical waveguides. In semiconductor light-emitting device 210A according to this variation, currents flow in parallel from the same electrode 19a to each of the optical waveguides.

After a semiconductor multilayer structure is formed on the semiconductor substrate by crystal growth, semiconductor laser array 11 is manufactured by forming optical waveguides by photolithography. Since spaces between the optical waveguides are formed with accuracy, spaces between light emission points can be also formed with accuracy. Semiconductor light-emitting device 210A having such a configuration, instead of semiconductor light-emitting device 210, may be used for light source unit 200.

In the case of using semiconductor light-emitting device 210 according to the present embodiment, on the other hand, it is possible to reduce more the area to be used of a semiconductor substrate, compared to the case of using semiconductor light-emitting device 210A according to Variation 1. For example, when a width of, for instance, first semiconductor light-emitting element chip 11a in the second direction is defined as W1, as illustrated in FIG. 7A, it is possible, with semiconductor light-emitting device 210 according to the present embodiment, to reduce the area of the semiconductor substrate to W1/LY12, compared to semiconductor light-emitting device 210A according to Variation 1. When width W1 is 160 μm and distance LY12 is 400 μm, for example, it is possible to reduce the area of the semiconductor substrate according to the present embodiment to 40% of the area of the semiconductor substrate according to Variation 1. As already mentioned in the description of semiconductor light-emitting device according to Embodiment 1, since the semiconductor light-emitting element chips are connected in series, semiconductor light-emitting device 210 according to the present embodiment is capable of supplying the semiconductor light-emitting element chips with a current of the same magnitude. Accordingly, it is possible to achieve the same light intensity in an output from each of the semiconductor light-emitting element chips.

Figure 7D:
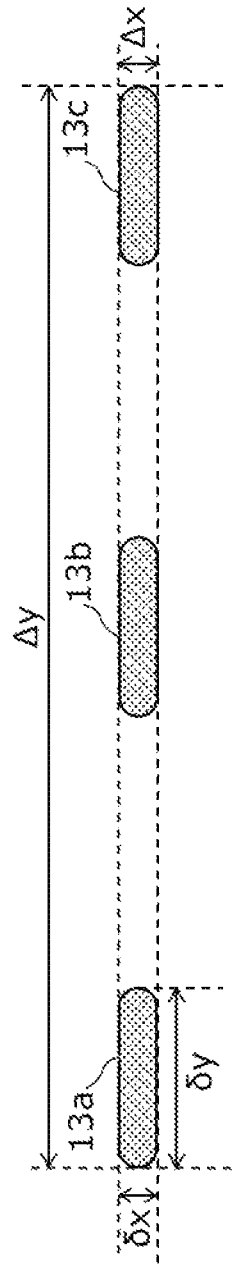
FIG. 7D is a schematic diagram illustrating one example of the relative position of the light emission points according to Embodiment 2.
Figure 7E:
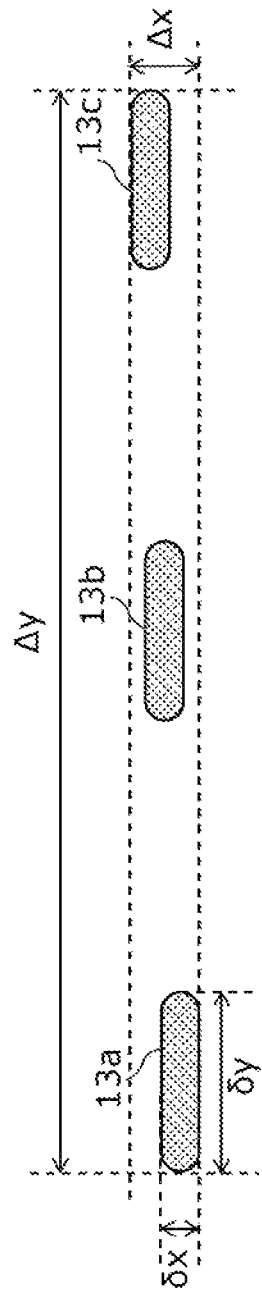
FIG. 7E is a schematic diagram illustrating another example of the relative position of the light emission points according to Embodiment 2.
Figure 7F:
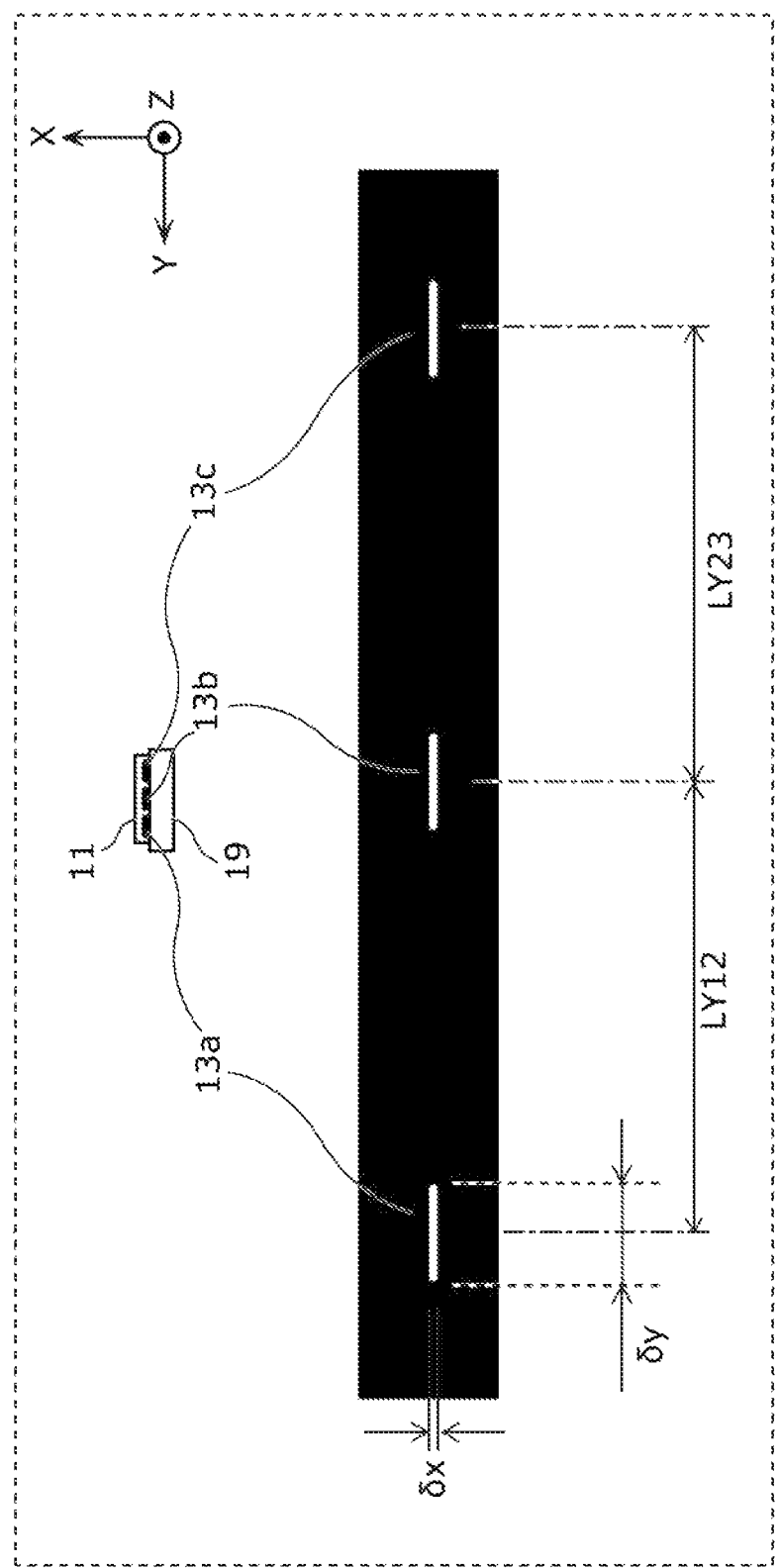
FIG. 7F is a diagram illustrating a simulation result of light emission spot shapes at light emission points according to Embodiment 2.

Next, the light emission points in semiconductor light-emitting device 210 according to the present embodiment will be described with reference to FIG. 7C through FIG. 7F. FIG. 7C is a schematic diagram illustrating a relative position of the light emission points according to the present embodiment. FIG. 7D and FIG. 7E are each a schematic diagram illustrating an example of the relative position of the light emission points according to the present embodiment. In FIG. 7C through FIG. 7E, the shapes of light emission spots at the light emission points are hatched. Note that the shapes of the light emission spots are the same as those of near-field patterns. FIG. 7F is a diagram illustrating a simulation result of the light emission spot shapes at the light emission points according to the present embodiment.

As illustrated in the light emission spot shapes in FIG. 7D through FIG. 7F, each of the light emission points actually has a light-emission size that is limited. In the present embodiment, each of the light emission spots has beam width δy in the second direction and beam width δx in the third direction. Beam widths of the entire area of the light emission spots in the second direction and the third direction are presented by Δy and Δx, respectively.

With semiconductor light-emitting device 210, the shapes of the light emission spots perfectly overlap each other in the third direction and beam width δx of each light emission spot in the third direction is equal to beam width Δx of the entire light emission spot area in the third direction in some cases, as illustrated in FIG. 7D. The shapes of the light emission spots partly overlap each other in the third direction and beam width Δx of the entire light emission spot area in the third direction is greater than beam width δx of each light emission spot in the third direction in other cases, as illustrated in FIG. 7E.

Beam width δx in the third direction has a dimension of approximately a wavelength of each beam, and beam width δy in the second direction is longer than beam width δx in the third direction. Beam width δy is, for example, at least twice as long as beam width δx. In the present embodiment, δy is about 30 μm and δx is about 1 μm. Distances LY12 and LY23 are each 150 μm.

The shapes of these light emission spots are increased or decreased in size by an optical system included in light source unit 200 and then projected on light collection surface 91.

Each of the beams in the y direction may be either horizontal-single-mode light or horizontal-multimode light. Note that a semiconductor light-emitting element chip operating in a horizontal multimode is more suitable for higher output than that operating in a horizontal single-mode. Moreover, each of the beams in the x direction has a light intensity distribution forming a single-mode shape.

[2-1-2. Second Condensing Optical Element]

Second condensing optical element 30 has the same configuration as that of second condensing optical element 30 according to Embodiment 1. Second condensing optical element 30 reduces the dispersions of first beam 83a, second beam 83b, and third beam 83c, and emits first beam 85a, second beam 85b, and third beam 85c, respectively.

[2-1-3. Deflection Element]

Deflection element 250 is a light-transmissive optical element and deflects beams by respective emission surfaces, as is the case of deflection element 50b according to Variation 2 of Embodiment 1. As illustrated in FIG. 6, deflection element 250 has first emission surface 256a, second emission surface 256b, and third emission surface 256c. A tilt angle, from the second direction, of an intersection line between second emission surface 256b and a plane perpendicular to the third direction as well as a tilt angle, from the third direction, of an intersection line between second emission surface 256b and a plane perpendicular to the second direction are both 0 degree.

In the present embodiment, first emission surface 256a and third emission surface 256c deflect first beam 85a and third beam 85c, respectively, as is the case of first emission surface 55a and second emission surface 55b according to Variation 2 of Embodiment 1. Accordingly, deflection element 250 deflects first beam 85a and third beam 85c to emit first beam 86a and third beam 86c, respectively. Moreover, deflection element 250 does not deflect second beam 85b, that is, deflects second beam 85b at 0 degree to emit second beam 86b. With such a deflection element, it is possible to emit first beam 85a, second beam 85b, and third beam 85c respectively passing first emission surface 256a, second emission surface 256b, and third emission surface 256c, so that first beam 85a, second beam 85b, and third beam 85c overlap each other in the second direction and are separate from each other in the third direction.

In the present embodiment, deflection element 250 is disposed to have first emission surface 256a, second emission surface 256b, and third emission surface 256c, but the same advantageous effects can be obtained even in the case of directing first emission surface 256a, second emission surface 256b, and third emission surface 256c toward second condensing optical element 30 by rotating deflection element 250 by 180 degrees about the X-axis, thereby using first emission surface 256a, second emission surface 256b, and third emission surface 256c as incident surfaces.

[2-1-4. First Condensing Optical Element]

First condensing optical element 70 has the same configuration as that of first condensing optical element 70 according to Embodiment 1. First condensing optical element 70 focuses first beam 86a, second beam 86b, and third beam 86c, and emits first beam 87a, second beam 87b, and third beam 87c, respectively.

With light source unit 200 having the above configuration, first light collection spot 89a, second light collection spot 89b, and third light collection spot 89c respectively corresponding to the radiation areas of first beam 87a, second beam 87b, and third beam 87c are aligned in the first direction (the X-axis direction) on light collection surface 91 of light collection object 90, as illustrated in FIG. 6.

[2-2. Operations and Advantageous Effects]

Figure 8:
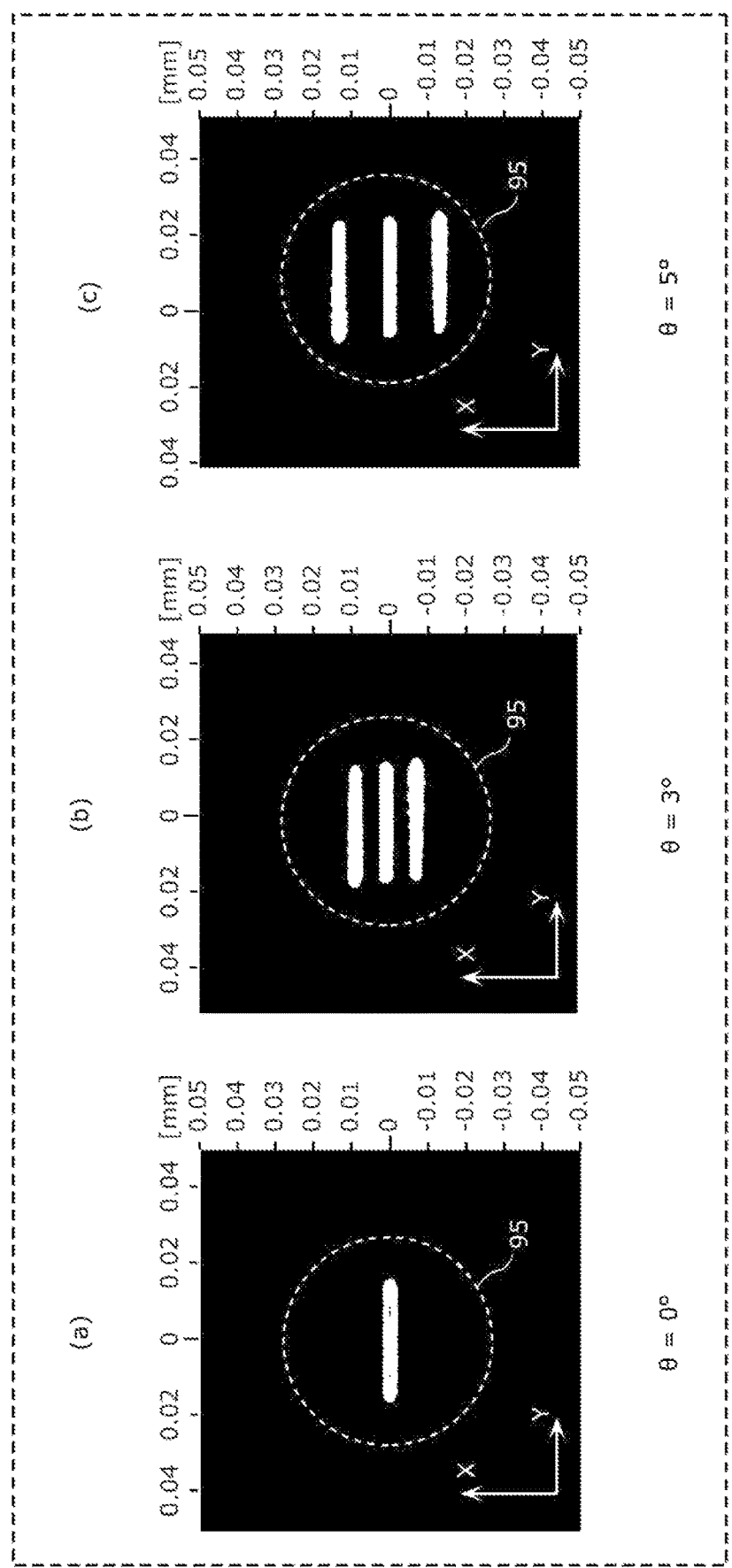
FIG. 8 is a diagram illustrating simulation results of the light source unit according to Embodiment 2.

Next, operations and advantageous effects of light source unit 200 according to the present embodiment will be described using simulation results. FIG. 8 is a diagram illustrating examples of a simulation result obtained using light source unit 200 according to the present embodiment.

FIG. 8 illustrates light intensity distributions on light collection surface 91 obtained from three simulation results. Note that the contour of core 95 of the optical fiber is indicated by a dotted circle in FIG. 8.

In a simulation, beam widths δx and δy in the third direction and the second direction in the near-field pattern of each of the beams emitted from the light emission points were defined as 1 μm and 30 μm, respectively. Distances LY12 and LY23 are each defined as 150 μm, the focal length of second condensing optical element 30 formed of an aspheric lens was defined as 4 mm, and the focal length of first condensing optical element 70 formed of an aspheric lens was defined as 4 mm. When the refractive index of deflection element 250 is 1.5, tilt angles α1, α2, and α3, with respect to a reference line, of first emission surface 256a, second emission surface 256b, and third emission surface 256c are 4 degrees, 0 degree, and −4 degrees, respectively. Note that the reference line is an intersection line between a reference plane and the XY-plane, and the reference plane is a plane that is tilted by angle θ about the Z-axis with respect to the ZX-plane. Angle θ is an angle between the third direction and an intersection line between first emission surface 256a and second emission surface 256b (or an intersection line between second emission surface 256b and third emission surface 256c), as is the case of angle θ according to Embodiment 1.

Light collection object 90 is an optical fiber and light collection surface 91 is an end face of the optical fiber having the core diameter of 105 µm.

Three simulations were conducted when angle θ of deflection element 250 is 0 degree, 3 degrees, and 5 degrees under the above conditions. Light intensity distributions (a), (b), and (c) on light collection surface 91 illustrated in FIG. 8 illustrate light intensity distributions when angle θ of deflection element 250 is 0 degree, 3 degrees, and 5 degrees, respectively. The case where angle θ of deflection element 250 is 0 degree corresponds to a comparative example of light source unit 200 according to the present embodiment. The case where angle θ of deflection element 250 is greater than 0 degree corresponds to light source unit 200 according to the present embodiment.

When angle θ of deflection element 250 is 0 degree, first emission surface 256a and third emission surface 256c of deflection element 250 are perpendicular to the ZY-plane. Accordingly, deflection angles of first beam 86a and third beam 86c deflected by deflection element 250 in the third direction are each 0 degree. Therefore, the positions of first light collection spot 89a, second light collection spot 89b, and third light collection spot 89c in the third direction overlap each other on light collection surface 91, as illustrated in light intensity distribution (a) in FIG. 8. In this case, since the peak positions of the light intensities of the beams are concentrated approximately at one point on light collection surface 91, light collection surface 91, which is an end face of the optical fiber, may receive damages.

When angle θ of deflection element 250 is 3 degrees or 5 degrees, on the other hand, deflection element 250 deflects first beam 85a and third beam 85c in the third direction. Therefore, the beams at the light emission points overlap each other in the third direction, but first beam 87a, second beam 87b, and third beam 87c are separate from each other in the third direction on light collection surface 91, as illustrated in light intensity distribution (b) or (c) in FIG. 8, and yet overlap each other in the second direction. Accordingly, it is possible to focus three beams in such a small area like core 95 of the end face of the optical fiber so that the beams do not overlap each other. In other words, with light source unit 200 according to the present embodiment, it is possible to focus two beams on light collection surface 91 while suppressing the peak intensities of the beams. Moreover, such advantageous effects can be obtained with light source unit 200 having a configuration simplified with the use of deflection element 250.

Furthermore, as illustrated in light intensity distribution (b) or (c) in FIG. 8, since the positions of the light collection spots of two beams on light collection surface 91 can be adjusted by adjusting angle θ of deflection element 250, it is easy to adjust a light intensity distribution (a light density distribution if stated differently) on light collection surface 91.

Figure 9A:
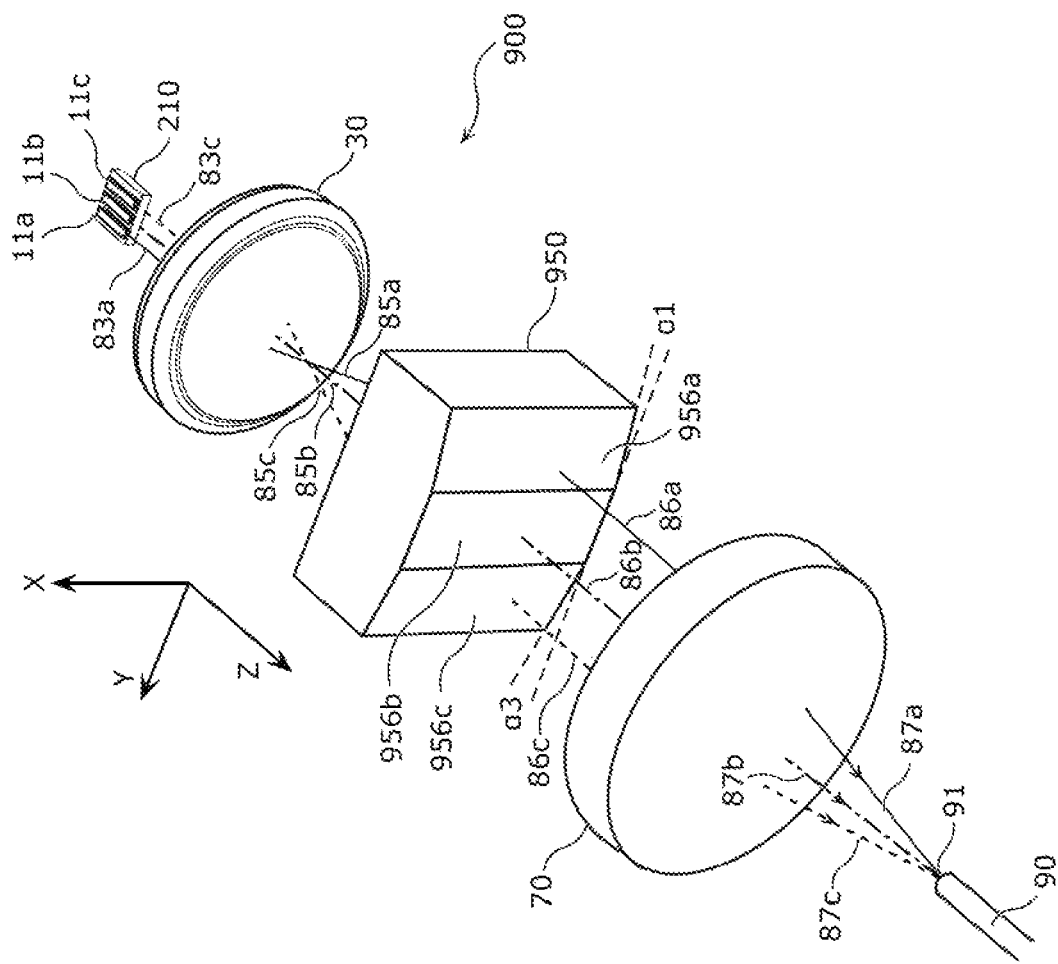
FIG. 9A is a perspective view illustrating an overall configuration of a light source unit according to a comparative example.

In order to explain the advantageous effects of light source unit 200 according to the present embodiment, simulation results of the light source unit according to the comparative example will be described with reference to FIG. 9A and FIG. 9B. FIG. 9A is a perspective view illustrating an overall configuration of light source unit 900 according to the comparative example. FIG. 9B is a diagram illustrating examples of a simulation result obtained using light source unit 900 according to the comparative example. FIG. 9B illustrates light intensity distributions on light collection surface 91 and in the vicinity thereof which are obtained from three simulation results. Note that the contour of core 95 of the optical fiber is indicated by a dotted circle in FIG. 9B.

As illustrated in FIG. 9A, light source unit 900 according to the comparative example is different from light source unit 200 according to Embodiment 2 in the configuration of deflection element 950, but the configurations of other elements are the same between light source unit 900 and light source unit 200. Deflection element 950 is an element obtained by modifying deflection element 250 according to Embodiment 2 by defining angle θ of deflection element 250 to be 0. Accordingly, beams are not deflected in the third direction by first emission surface 956a, second emission surface 956b, and third emission surface 956c of deflection element 950.

The simulation result obtained using light source unit 900 having such a configuration will be described. Light intensity distributions (a), (b), and (c) in FIG. 9B indicate light intensity distributions when the absolute value of tilt angle α1 (or α3) is 5 degrees, 4 degrees, and 3 degrees, respectively (when the refractive index of deflection element 250 is 1.5). Note that tilt angle α1 is an angle between first emission surface 956a and the second direction, and tilt angle α3 is an angle between third emission surface 956c and the second direction.

As illustrated in FIG. 9B, it is possible to adjust a light intensity distribution in the second direction by adjusting tilt angles α1 and α3 of deflection element 950, but it is not possible to adjust a light intensity distribution in the third direction. Therefore, when three beams are focused on core 95 of light collection surface 91, the three beams overlap each other in the third direction and the peak intensity of the light intensity distribution cannot be suppressed.

With light source unit 200 according to the present embodiment, on the other hand, since three beams are separate from each other in the third direction, it is possible to suppress the peak intensity of the light intensity distribution of the beams. Accordingly, it is possible to reduce damages on light collection surface 91 of light collection object 90.

[2-3. Relative Position of Beams]

Figure 10A:
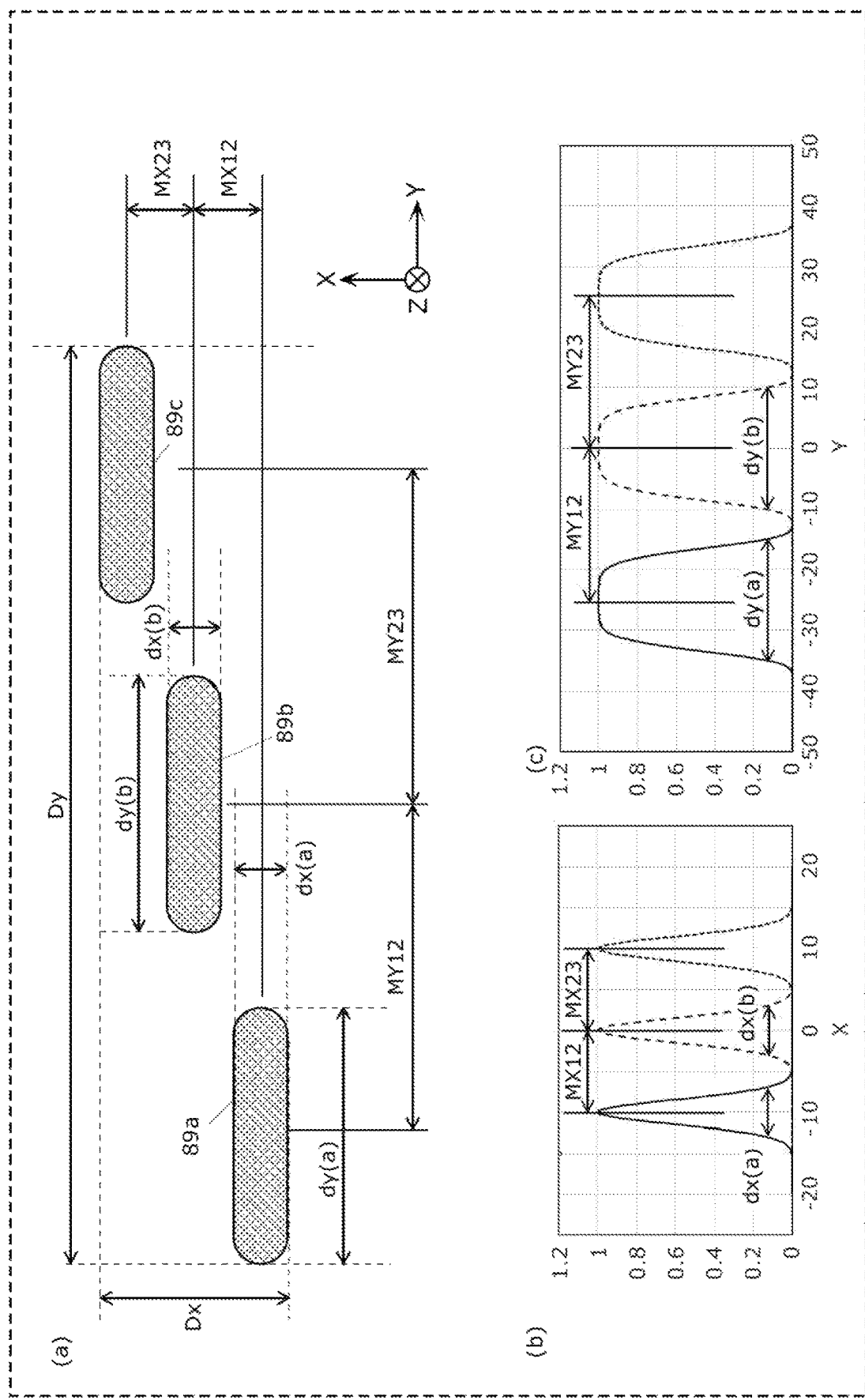
FIG. 10A is a diagram illustrating light collection spots of beams on the light collection surface of the light source unit according to Embodiment 2.
Figure 10B:
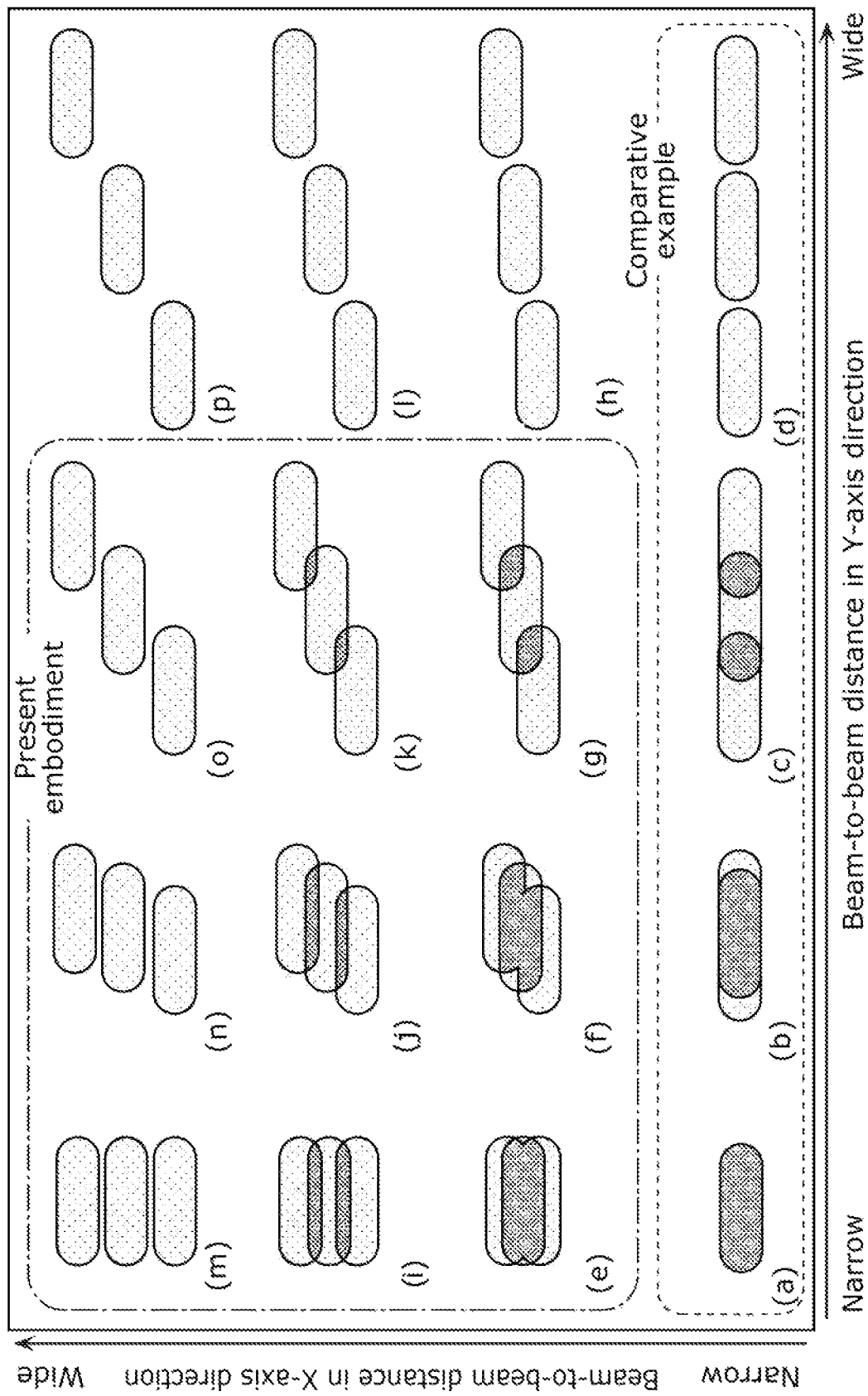
FIG. 10B is a diagram illustrating distribution examples of the light collection spots of the beams.
Figure 10C:
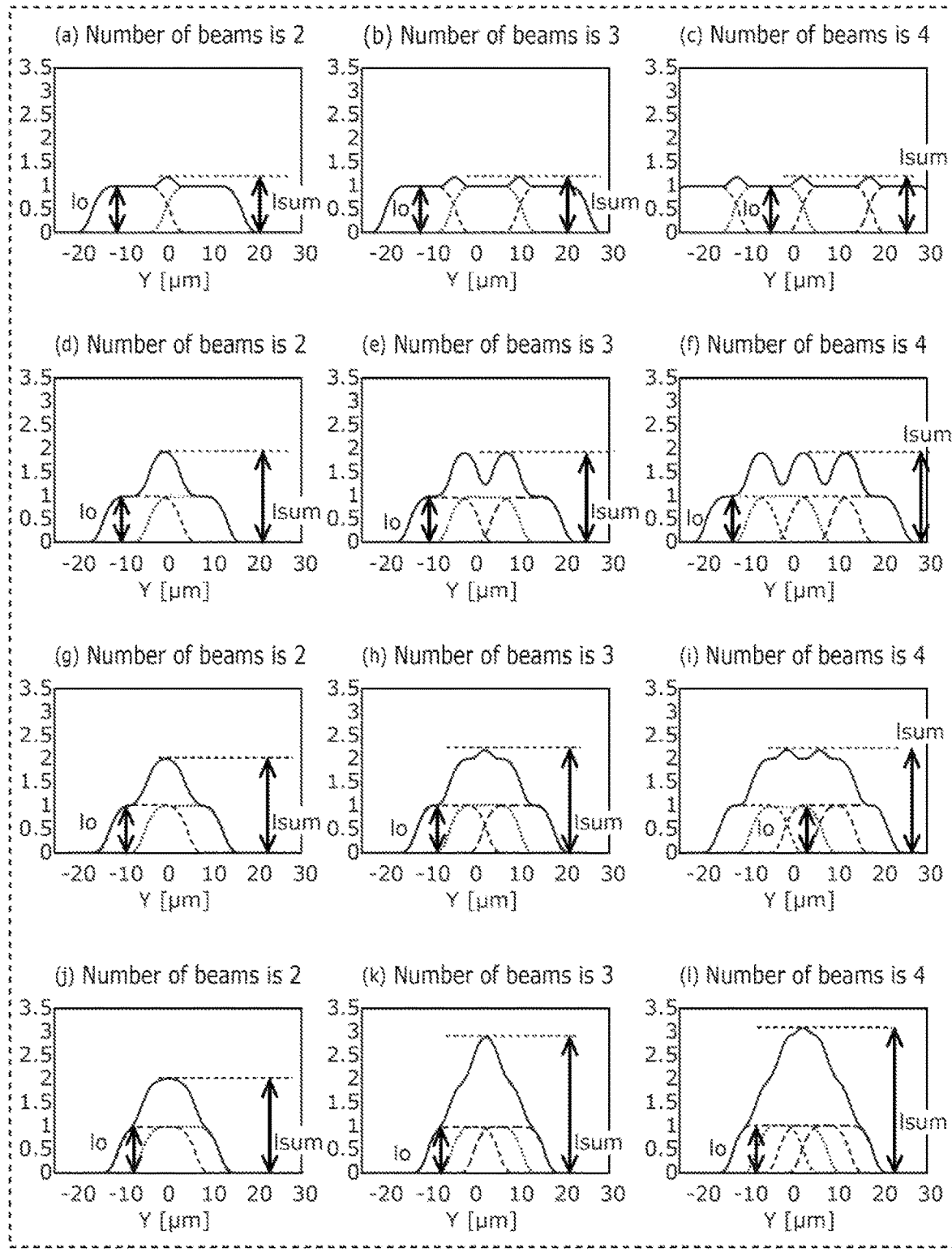
FIG. 10C illustrates graphs each illustrating a result of calculating a light intensity distribution, in a second direction, of light collection spots that overlap each other.
Figure 10D:
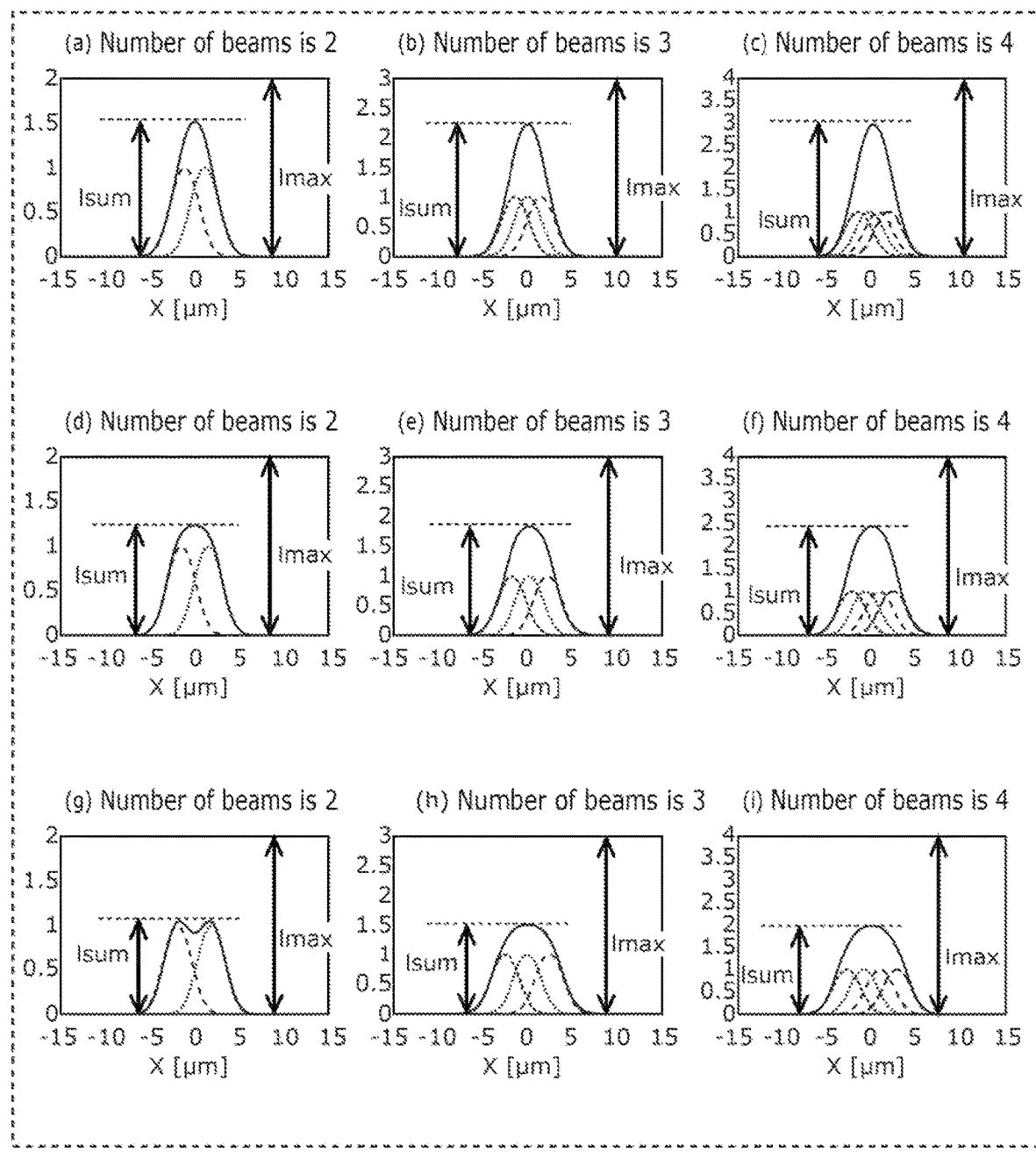
FIG. 10D illustrates graphs each illustrating a result of calculating a light intensity distribution, in a third direction, of light collection spots that overlap each other.

Next, a relative position of beams according to the present embodiment will be described with reference to FIG. 10A through FIG. 10D. FIG. 10A is a diagram illustrating light collection spots of beams on light collection surface 91 of light source unit 200 according to the present embodiment. Schematic diagram (a) in FIG. 10A illustrates, for instance, the light collection spots of the beams and the dimensions of the light collection spots on light collection surface 91. Graphs (b) and (c) in FIG. 10A are schematic diagrams illustrating light intensity distributions of the beams in the third direction and the second direction, respectively. FIG. 10B is a diagram illustrating sixteen types of distribution examples for comparing distributions of the light collection spots of the beams. FIG. 10B illustrates the case of forming light collection spots with three beams. In FIG. 10B, the horizontal axis indicates a beam-to-beam distance in the second direction and the beam-to-beam distance gets wider rightward. The vertical axis indicates a beam-to-beam distance in the third direction and the beam-to-beam distance gets wider upward. FIG. 10C and FIG. 10D are graphs illustrating results of calculating light intensity distributions of light collection spots that overlap each other in the second direction and the third direction, respectively.

As illustrated in each of schematic diagram (a) and graphs (b) and (c) in FIG. 10A, beam widths of first light collection spot 89a of first beam 87 in the second direction and the third direction on light collection surface 91 are respectively defined as dy(a) and dx(a). In addition, beam widths of second light collection spot 89b of second beam 87b in the second direction and the third direction on light collection surface 91 are respectively defined as dy(b) and dx(b). Beam widths of the light collection spot of the entire three beams in the second direction and the third direction are respectively defined as Dy and Dx. The beam widths of the light collection spot of the entire three beams are each defined by a distance, in one of the second direction and the third direction, between two points located at the outermost points on opposite sides of an outer periphery of the light collection spot within the range including the beam widths of the light collection spots (see schematic diagram (a) in FIG. 10A). Moreover, a distance between first light collection spot 89a and second light collection spot 89b (a distance between peak intensity positions which is also referred to as "beam-to-beam distance") is defined as MY12, and a distance between second light collection spot 89b and third light collection spot 89c (a distance between peak intensity positions) is defined as MY23.

In light source unit 200 according to the present embodiment, first beam 87a and second beam 87b overlap each other in the second direction and are separate from each other in the third direction on light collection surface 91. Moreover, second beam 87b and third beam 87c overlap each other in the second direction and are separate from each other in the third direction. In distribution examples (a) through (d) in FIG. 10B, for example, first beam 87a, second beam 87b, and third beam 87c perfectly overlap each other in the third direction. In other words, the peak intensity positions of the three beams perfectly overlap each other in the third direction. In distribution examples (e) through (h), the light distribution of first beam 87a partly overlaps the light distribution of third beam 87c, but the peak intensity positions of first beam 87a and third beam 87c are separate from each other. Furthermore, the overlap of the light distributions in the second direction gradually becomes smaller in the order of distribution examples (e), (f), (g), and (h). Stated differently, the peak intensity positions of first beam 87a, second beam 87b, and third beam 87c are gradually separate from each other in the second direction in the order of distribution examples (e), (f), (g), and (h). In distribution example (h), the overlap of the light distributions completely disappears. In distribution examples (i) through (l), the light distributions of first beam 87a, second beam 87b, and third beam 87c partly overlap each other in the third direction, but a distance between the peak intensity positions increases even more. In distribution example (l), the overlap between first beam 87a and third beam 87c completely disappears. In distribution examples (m) through (p), first beam 87a, second beam 87b, and third beam 87c are completely separate from each other in the third direction. The overlap of the light distributions in the second direction completely disappears in distribution examples (p), (l), and (h). The light intensities of the light collection spots of the beams according to the present embodiment are distributed, for example, as in distribution examples (e) through (g), (i) through (k), and (m) through (o) in FIG. 10B. Distribution examples (a) through (d), (h), (l), and (p), on the other hand, are comparative examples and are not included in the distribution examples of the light collection spots of the beams according to the present embodiment. This is because the peak intensity positions completely coincide with each other in the third direction or first beam 87a, second beam 87b, and third beam 87c are completely separate from each other in the second direction. The following describes definitions of the relative position of the light collection spots of the beams according to the present embodiment.

In light source unit 200 according to the present embodiment, it is better to condense beams in the second direction so that the beams are incident on a core, which has a small diameter, of an optical fiber, for instance. Influence on a light intensity distribution in the case of condensing beams in the second direction will be described herein with reference to FIG. 10C. Graphs (a), (b), and (c) in FIG. 10C illustrate combined light intensity distributions in the second direction in the case where the number of beams is two, three, and four, respectively. In order to show influence of the overlap of the beams, these graphs are each calculated under the assumption that the positions of beams in the third direction coincide with each other (according to such a calculation method, in the case of performing calculation for distribution examples (a), (e), (i) and (m) in FIG. 10B, for example, the same distributions can be obtained). Note that since each beam exhibits a multimode light distribution in the second direction, a super Gaussian distribution was applied as the light distribution of each beam in the calculation. In each of graphs (a) through (c) in FIG. 10C, a value in the vertical axis presents a light intensity standardized using light intensity peak value Io of each beam. The same applies to other graphs in FIG. 10C and FIG. 10D.

As illustrated in each of graphs (a) through (c) in FIG. 10C, if light intensity peak value Io of each beam and peak value Isum of a combined light intensity distribution are defined, a distance between first beam 87a and second beam 87b (beam-to-beam distance MY12) in the second direction is at most 0.8 times the beam width of first beam 87a or second beam 87b in the second direction. Moreover, a distance between second beam 87b and third beam 87c (beam-to-beam distance MY23) in the second direction is at most 0.8 times the beam width of second beam 87b or third beam 87c in the second direction. Stated differently, a distance between two neighboring beams in the second direction is at most 0.8 times the beam width of one of the two beams in the second direction. Such a state is defined in this specification that two beams "coincide" with each other. In such a state, it is possible to set peak value Isum of a combined light intensity distribution to at least 115% of light intensity peak value Io of each beam. In other words, it is possible to condense the beams in the second direction.

Note that beams may be condensed even more. For example, on light collection surface 91, beam-to-beam distance MY12 may be at most 0.5 times the beam width of first beam 87a or second beam 87b in the second direction. Moreover, beam-to-beam distance MY23 may be at most 0.5 times the beam width of second beam 87b or third beam 87c in the second direction. In such a state, it is possible to set peak value Isum of a combined light intensity distribution to at least 190% of light intensity peak value Io of each beam, as illustrated in each of graphs (d) through (f) in FIG. 10C.

Alternatively, on light collection surface 91, beam-to-beam distance MY12 may be at most 0.4 times the beam width of first beam 87a or second beam 87b in the second direction. Moreover, beam-to-beam distance MY23 may be at most 0.4 times the beam width of second beam 87b or third beam 87c in the second direction. In such a state, it is possible to set peak value Isum of a combined light intensity distribution to at least 195% of light intensity peak value Io of each beam, as illustrated in each of graphs (g) through (i) in FIG. 10C.

Alternatively, on light collection surface 91, beam-to-beam distance MY12 may be at most 0.275 times the beam width of first beam 87a or second beam 87b in the second direction. Moreover, beam-to-beam distance MY23 may be at most 0.275 times the beam width of second beam 87b or third beam 87c in the second direction. In such a state, it is possible to set peak value Io of a combined light intensity distribution to at least 195% of light intensity peak value Io of each beam, as illustrated in each of graphs (j) through (l) in FIG. 10c.

In contrast, when a light intensity (a light density) is too high on light collection surface 91, light collection surface 91 of light collection object 90 may deteriorate. In view of this, regarding the third direction, it is better that beams are a certain distance away from each other. Influence on a light intensity distribution in the case where beams overlap each other in the third direction will be described herein with reference to FIG. 10D. Graphs (a), (b), and (c) in FIG. 10D are graphs illustrating combined light intensity distributions in the third direction in the case where the number of beams is two, three, and four, respectively. In order to show influence of the overlap of the beams, these graphs are each calculated under the assumption that the positions of beams in the third direction coincide with each other (according to such a calculation method, in the case of performing calculation for distribution examples (e) through (h) in FIG. 10B, for example, the same distributions can be obtained). Note that since each beam exhibits a single-mode light distribution in the third direction, a Gaussian distribution was applied as the light distribution of each beam in the calculation.

As illustrated in each of graphs (a) through (c) in FIG. 10D, if (i) peak value Isum of a combined light intensity distribution and (ii) maximum value Imax of a combined light intensity distribution in the case where the peak positions of the intensities of all the beams coincide with each other are defined, a distance between first beam 87a and second beam 87b (beam-to-beam distance MX12) in the third direction on light collection surface 91 of light source unit 200 according to the present embodiment is at least a value obtained by dividing 0.75 times the beam width of first beam 87a or second beam 87b in the third direction by the number of light emission points. Moreover, a distance between second beam 87b and third beam 87c (beam-to-beam distance MX23) in the third direction is at least a value obtained by dividing 0.75 times the beam width of second beam 87b or third beam 87c in the third direction by the number of light emission points. In the present embodiment, the number of light emission points is three. Stated differently, a distance between two neighboring beams in the third direction is at least a value obtained by dividing 0.75 times the beam width of one of the two beams in the third direction by the number of light emission points, that is, three. Such a state is defined in this specification that two beams are "separate" from each other. In such a state, it is possible to set peak value Isum of a combined light intensity distribution to at most 75% of maximum value Imax. In other words, it is possible to suppress the combined light intensities of the beams in the third direction.

Note that the combined light intensities of beams may be suppressed even more. For example, on light collection surface 91, beam-to-beam distance MX12 may be at least a value obtained by dividing 1.0 time the beam width of first beam 87a or second beam 87b in the third direction by the number of light emission points. Moreover, beam-to-beam distance MX23 may be at least a value obtained by dividing 1.0 time the beam width of second beam 87b or third beam 87c in the third direction by the number of light emission points. In such a state, it is possible to set peak value Isum of a combined light intensity distribution to at most 61% of maximum value Imax, as illustrated in each of graphs (d) through (f) in FIG. 10D.

Alternatively, on light collection surface 91, beam-to-beam distance MX12 may be at least a value obtained by dividing 1.25 times the beam width of first beam 87a or second beam 87b in the third direction by the number of light emission points. Moreover, beam-to-beam distance MX23 may be at least a value obtained by dividing 1.25 times the beam width of second beam 87b or third beam 87c in the third direction by the number of light emission points. In such a state, it is possible to set peak value Isum of a combined light intensity distribution to at most 53% of maximum value Imax, as illustrated in each of graphs (g) through (i) in FIG. 10D.

Embodiment 3

A light source unit according to Embodiment 3 will be described. A main difference between the light source unit according to the present embodiment and light source unit 200 according to Embodiment 2 is a configuration of a second condensing optical element. The following describes the light source unit according to the present embodiment, focusing on the main difference from light source unit 200 according to Embodiment 2.

Figure 11A:
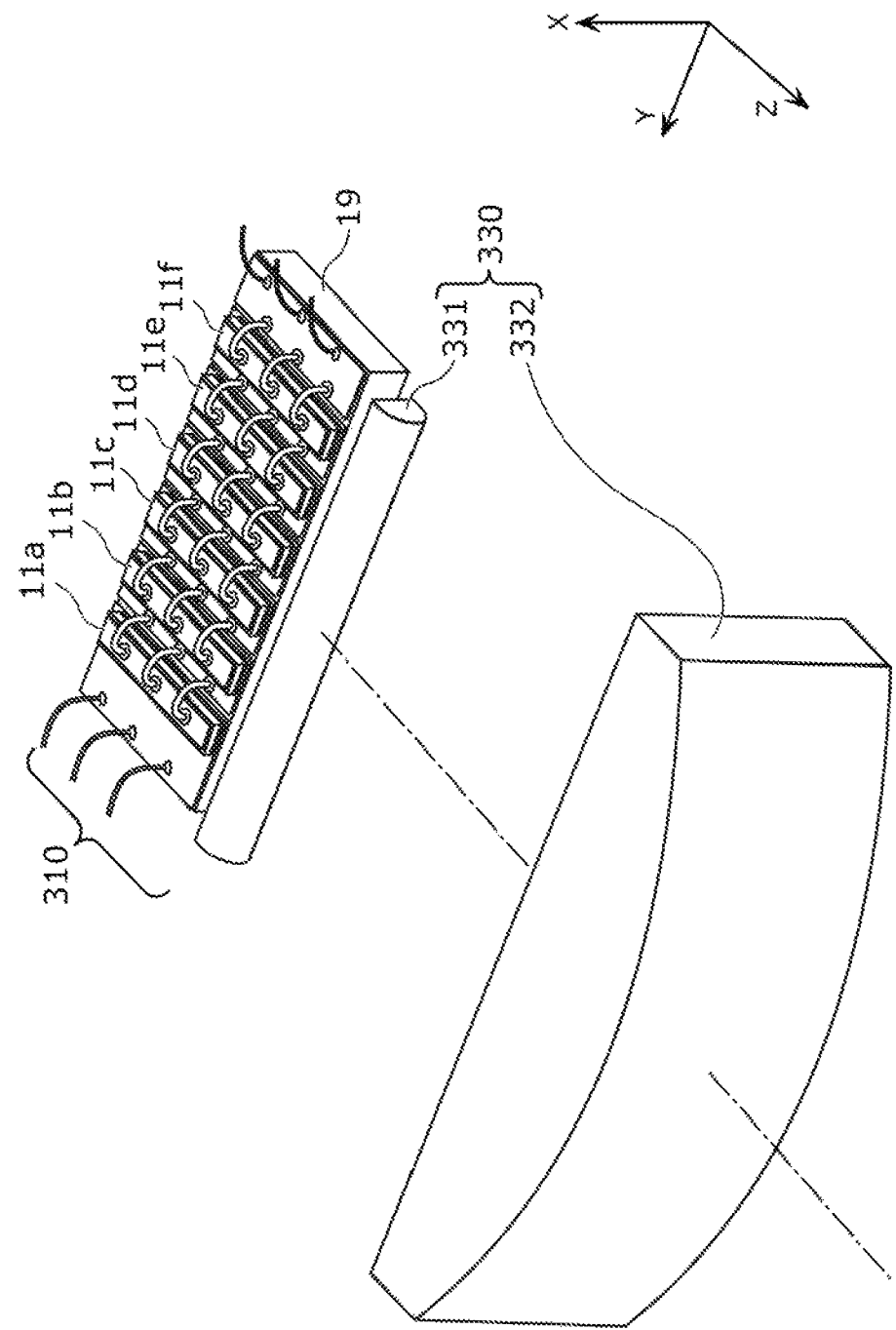
FIG. 11A is a perspective view illustrating an overall configuration of a semiconductor light-emitting device and a second condensing optical element that are included in a light source unit according to Embodiment 3.

First, a semiconductor light-emitting device and a second condensing optical element that are included in the light source unit according to the present embodiment will be described with reference to FIG. 11A. FIG. 11A is a perspective view illustrating an overall configuration of semiconductor light-emitting device 310 and second condensing optical element 330 included in the light source unit according to the present embodiment.

Semiconductor light-emitting device 310 includes first semiconductor light-emitting element chip 11a through sixth semiconductor light-emitting element chip 11f and submount 19. First semiconductor light-emitting element chip 11a through sixth semiconductor light-emitting element chip 11f respectively emit a first beam through a sixth beam.

Second condensing optical element 330 includes fast axis collimating lens 331 that reduces the dispersions of the first through sixth beams in the third direction and slow axis collimating lens 332 that reduces the dispersions of the first through sixth beams in the second direction. Slow axis collimating lens 332 is interposed between fast axis collimating lens 331 and a deflection element described later.

Figure 11B:
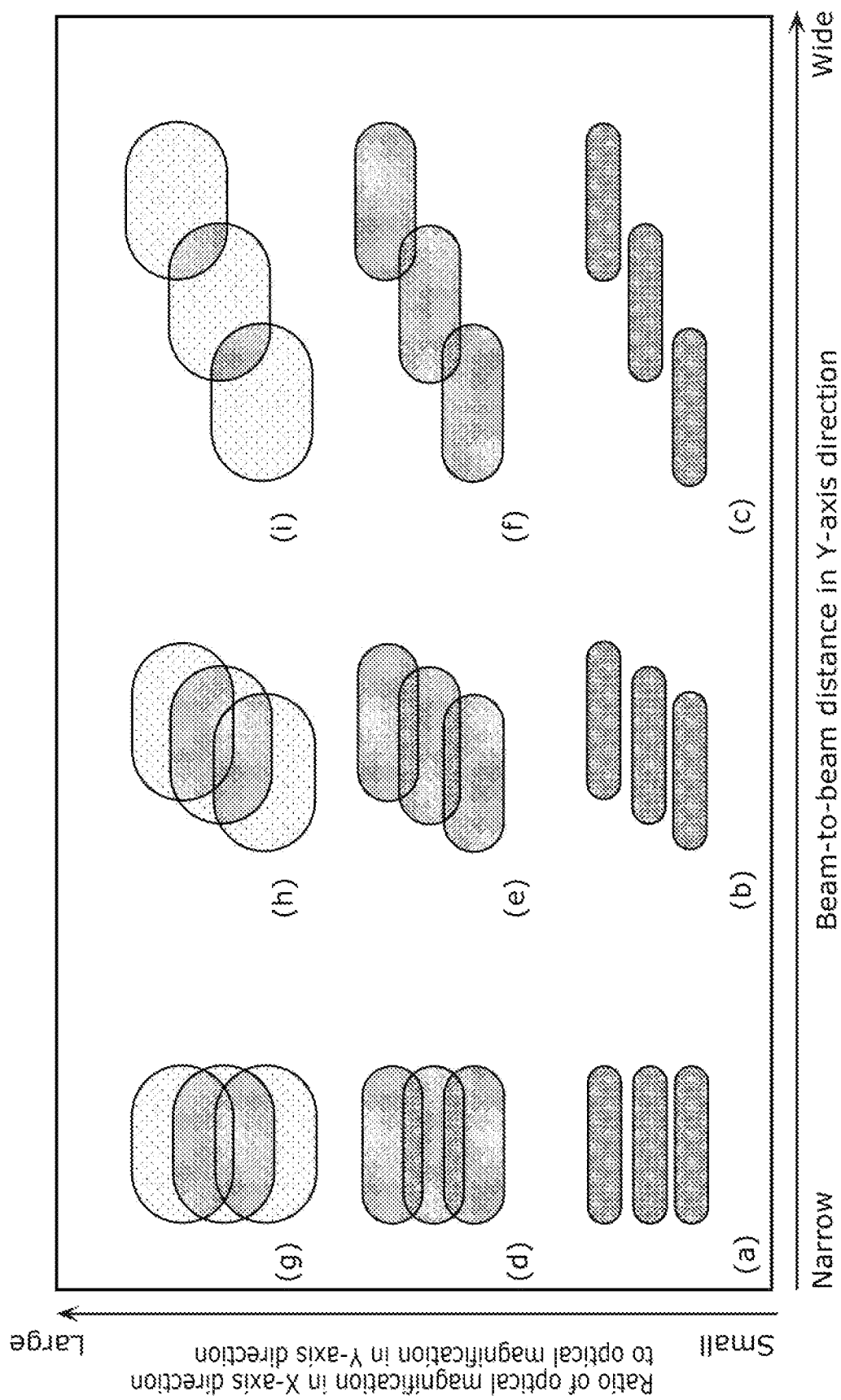
FIG. 11B is a schematic diagram illustrating operations of the second condensing optical element according to Embodiment 3.

Operations of such second condensing optical element 330 will be described with reference to FIG. 11B. FIG. 11B is a schematic diagram illustrating the operations of second condensing optical element 330 according to the present embodiment. FIG. 11B roughly illustrates light collection spots on the light collection surface of the light source unit according to the present embodiment. Note that semiconductor light-emitting device 310 in FIG. 11A emits six beams of the first through sixth beams, but only light collection spots corresponding to three beams are illustrated in FIG. 11B. By adjusting the magnifications of fast axis collimating lens 331 and slow axis collimating lens 332, it is possible to adjust the ratio of an optical magnification in the X-axis direction to an optical magnification in the Y-axis direction. In other words, it is possible to change the beam widths of the light collection spots in the second direction and the third direction without changing the near-field patterns of the semiconductor light-emitting element chips. In FIG. 11B, distribution examples (a), (b), and (c) respectively illustrate distributions corresponding to distribution examples (m), (n), and (o) in FIG. 10B. The vertical axis in FIG. 11B presents the ratio of an optical magnification in the X-axis direction to an optical magnification in the Y-axis direction, and the beam width in the third direction gets longer than the beam width in the second direction as the optical magnification increases (i.e., upward along the vertical axis). By thus adjusting the ratio of an optical magnification in the X-axis direction to an optical magnification in the Y-axis direction, it is possible to adjust a distance between the peak intensity positions of the beams in the third direction and an overlap of the surrounding areas of the beams. Accordingly, by adjusting each of the magnifications of fast axis collimating lens 331 and slow axis collimating lens 332, distributions as illustrated in distribution examples (i), (j), (k), (e), (f), and (g) in FIG. 10B can be achieved. In other words, with the use of fast axis collimating lens 331 and slow axis collimating lens 332 in addition to the deflection element, it is possible to more flexibly adjust the light collection spot distribution of each beam.

Thus, in the present embodiment, there is no need to provide lenses for respective beams unlike light source unit 1001 disclosed in PTL 2. Accordingly, it is possible to simplify more the configuration of the light source unit according to the present embodiment compared to the configuration of light source unit 1001 disclosed in PTL 2.

Figure 12:
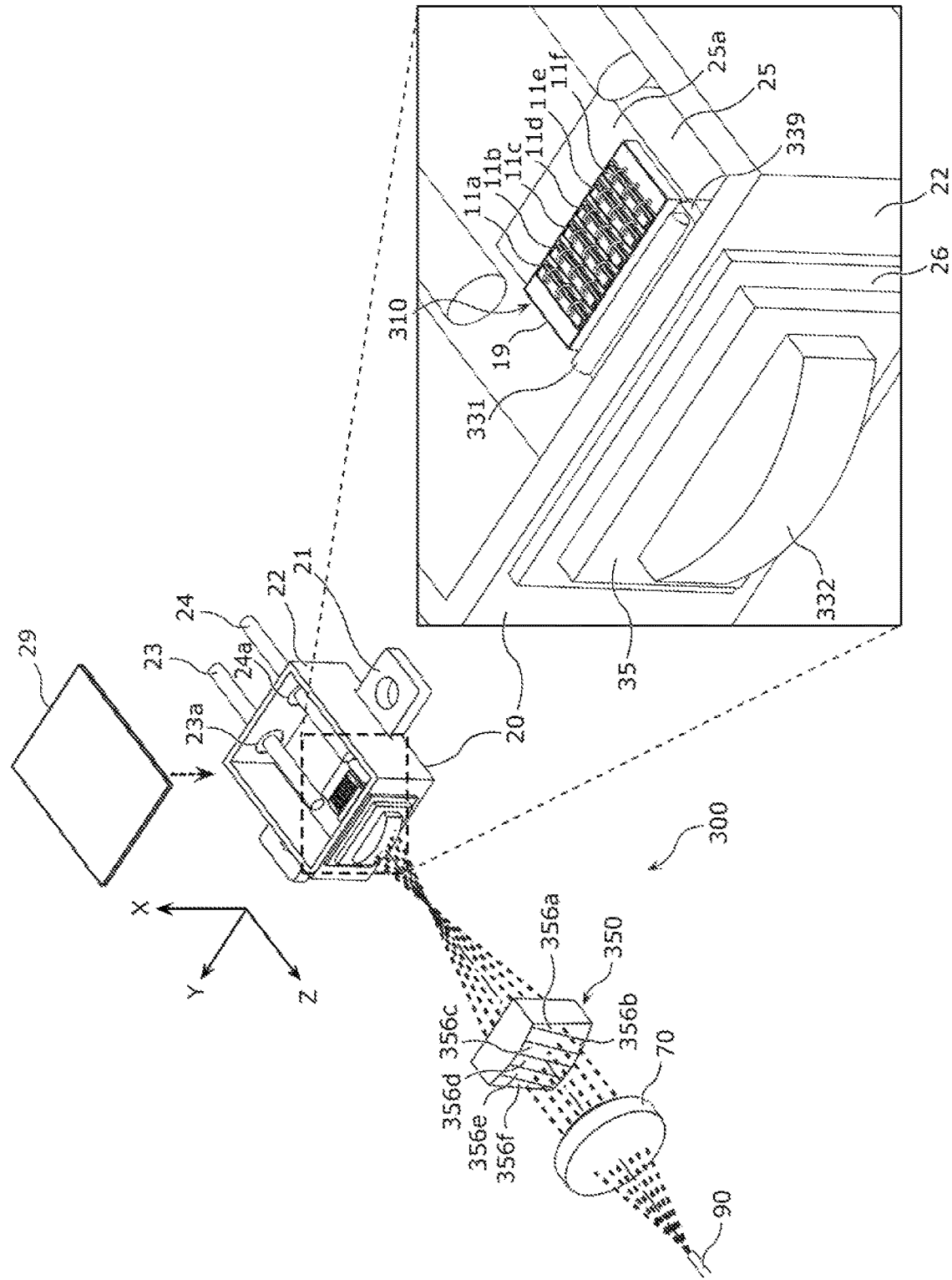
FIG. 12 is a perspective view illustrating an overall configuration of the light source unit according to Embodiment 3.

Next, the following describes, with reference to FIG. 12, a light source unit including semiconductor light-emitting device 310 and second condensing optical element 330 described above. FIG. 12 is a perspective view illustrating an overall configuration of light source unit 300 according to the present embodiment, and an insertion at the lower right is a view illustrating a magnified portion in the vicinity of semiconductor light-emitting device 310.

As illustrated in FIG. 12, light source unit 300 according to the present embodiment includes semiconductor light-emitting device 310, second condensing optical elements (fast axis collimating lens 331 and slow axis collimating lens 332), deflection element 350, first condensing optical element 70, and light collection object 90. In light source unit 300, semiconductor light-emitting device 310, fast axis collimating lens 331, and slow axis collimating lens 332 are accommodated in package 20. Package 20, deflection element 350, and first condensing optical element 70 are accommodated in a housing not shown in the figure. Package 20 includes base 21 made of, for example, copper and frame 22 (made of, for example, Kovar) including four planes surrounding semiconductor light-emitting device 310. Two openings are formed through one of the planes, and first terminal 23 and second terminal 24 for supplying power to semiconductor light-emitting device 310 are fixed to the two openings by insulating members 23a and 24a each being made of a ring-shaped glass. An opening for letting out beams emitted from semiconductor light-emitting device 310 is formed through a plane of frame 22 facing the plane on which the two openings are formed, and fixing member 26 made of, for example, Kovar is disposed on the plane through which the opening is formed. Package 20 includes carrier 25 fixed onto base 21. Carrier 25 is, for example, a copper block and includes mounting surface 25a. Semiconductor light-emitting device 310 is mounted on mounting surface 25a. Package 20 also includes support member 339 and holder 35 that support fast axis collimating lens 331 and slow axis collimating lens 332, respectively. Support member 339 is fixed to carrier 25 and supports fast axis collimating lens 331 disposed in the vicinity of the emission portion of semiconductor light-emitting device 310. Holder 35 is fixed onto fixing member 26 using, for instance, solder, and slow axis collimating lens 332 is disposed in the beam emission portion of package 20. After the components are accommodated in package 20, lid 29 is placed from above package 20 and is seam welded to frame 22. Package 20 having such a configuration supplies power to semiconductor light-emitting device 310, has a function to let emitted beams outside, and is capable of tightly sealing semiconductor light-emitting device 310.

With the use of such package 20, it is possible to inhibit the semiconductor light-emitting element chips in semiconductor light-emitting device 310 from contacting outside air. It is therefore possible to inhibit the reliability of semiconductor light-emitting device 310 from decreasing due to, for instance, contamination attached to the light emission points.

Deflection element 350 has first emission surface 356a through sixth emission surface 356f. First through sixth beams are respectively deflected in the third direction by first emission surface 356a through sixth emission surface 356f at different deflection angles. Accordingly, it is possible to achieve a state in which the first through sixth beams are separate from each other on light collection surface 91 of light collection object 90.

Embodiment 4

A light source unit according to Embodiment 4 will be described. A main difference between the light source unit according to the present embodiment and light source unit 300 according to Embodiment 3 is that an optical system in a range of from light emission points to light collection surface 91 of light collection object 90 is accommodated in package 20. The following describes the light source unit according to the present embodiment with reference to FIG. 13, focusing on the main difference from light source unit 300 according to Embodiment 3.

Figure 13:
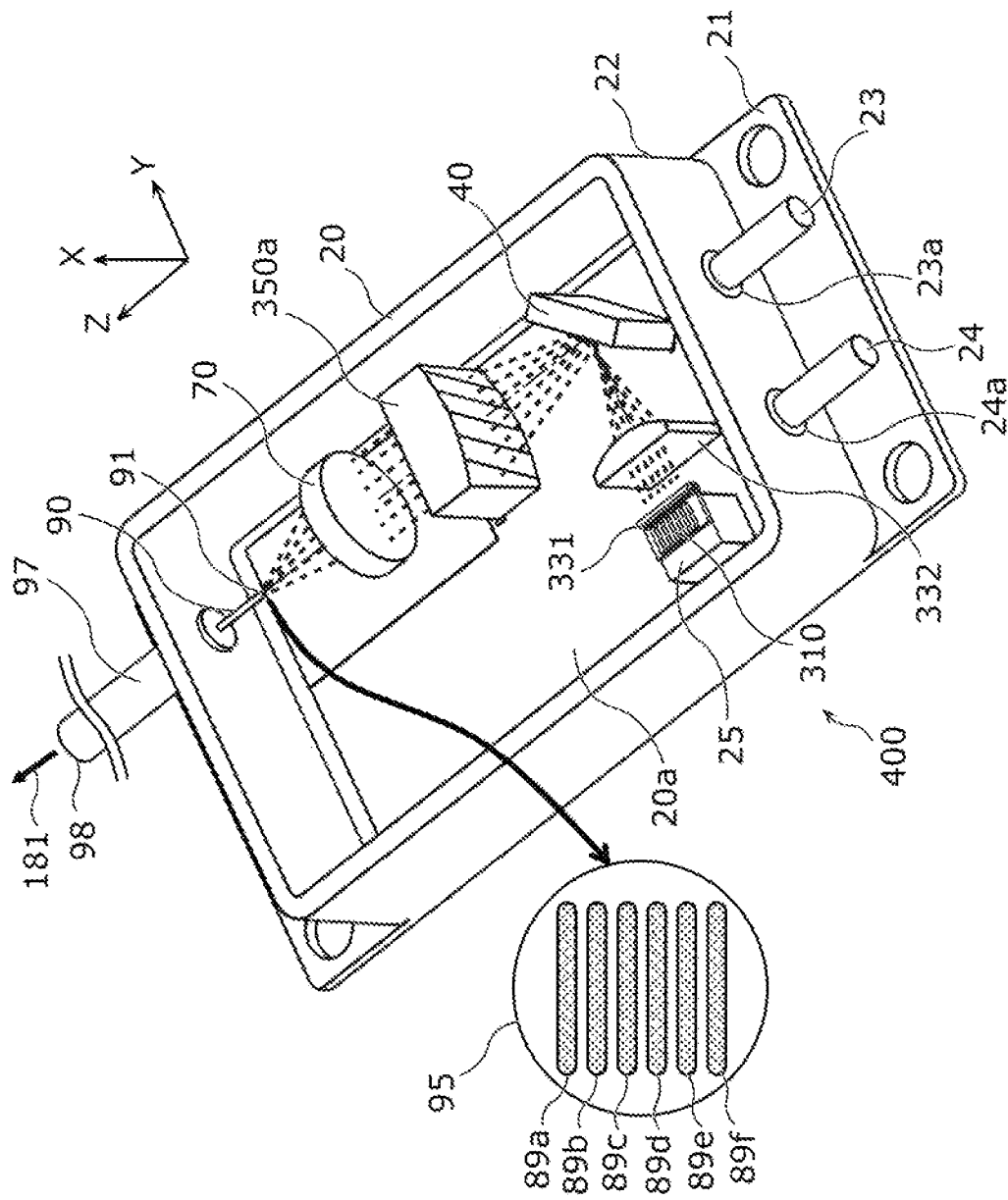
FIG. 13 is a perspective view illustrating an overall configuration of a light source unit according to Embodiment 4.

FIG. 13 is a perspective view illustrating an overall configuration of light source unit 400 according to the present embodiment. As illustrated in FIG. 13, light source unit 400 includes semiconductor light-emitting device 310, second condensing optical elements (fast axis collimating lens 331 and slow axis collimating lens 332), reflection mirror 40, deflection element 350a, first condensing optical element 70, light collection object 90, and package 20.

Reflection mirror 40 is a mirror that reflects a first beam through a sixth beam emitted from slow axis collimating lens 332 toward deflection element 350a. A plane mirror, for example, may be used as reflection mirror 40.

Deflection element 350a is an element having the same functions as those of deflection element 350 according to Embodiment 3, and has a first incident surface through a sixth incident surface having the same functions as those of first emission surface 356a through sixth emission surface 356f of deflection element 350.

In the present embodiment, package 20 is a housing that accommodates semiconductor light-emitting device 310, second condensing optical elements (fast axis collimating lens 331 and slow axis collimating lens 332), reflection mirror 40, deflection element 350a, first condensing optical element 70, and at least part of light collection object 90. In other words, the present embodiment illustrates an embodiment in which package 20 and housing 60 according to Embodiment 1 or Embodiment 3 are integrated into one body. Package 20 includes base 21, frame 22, and first terminal 23 and second terminal 24 for supplying power to semiconductor light-emitting device 310. Base 21 is made of, for example, copper and has mounting surface 20a that is flat. Reflection mirror 40, deflection element 350a, and first condensing optical element 70 are fixed to the same mounting surface 20a. In this case, since deflection element 350a has a bottom surface perpendicular to the third direction, it is possible to easily fix, together with reflection mirror 40, deflection element 350a to mounting surface 20a. Semiconductor light-emitting device 310 is also mounted on mounting surface 20a of package 20 via carrier 25.

Light collection object 90 is an optical fiber in the present embodiment. One of end faces of light collection object 90 is light collection surface 91 and the other of the end faces is emission surface 98 through which beams incident on light collection surface 91 are emitted. Light collection object 90 is held by holding member 97 that is a ferrule, for example. Holding member 97 is fixed to the opening of frame 22 using solder, for instance. Accordingly, light collection surface 91 of light collection object 90 is fixed inside of frame 22 and emission surface 98 is held outside of package 20. A lid that is not shown in the figure is placed on the top of package 20. Package 20 thus tightly seals semiconductor light-emitting device 310 and optical elements.

In the above configuration, in order to receive power, semiconductor light-emitting device 310 is connected to first terminal 23 and second terminal 24 by wires not shown in the figure. Light emitted from semiconductor light-emitting device 310 transmits through or is reflected by fast axis collimating lens 331, slow axis collimating lens 332, reflection mirror 40, deflection element 350a, and first condensing optical element 70, and is incident on light collection surface 91 of light collection object 90. The light incident on light collection surface 91 propagates through light collection object 90 and is emitted outside package 20.

Light source unit 400 having the above configuration is thus capable of preventing the optical system from contacting outside air. It is therefore possible to inhibit the reliability of light source unit 400 from decreasing due to, for instance, contamination attached to the optical elements constituting the optical system.

As described above, light source unit 400 according to the present embodiment includes light collection object 90 which is an optical fiber, and the first through sixth beams are focused on light collection surface 91 which is an end face of the optical fiber. As illustrated in FIG. 13, first light collection spot 89a through sixth light collection spot 89f corresponding to the first beam through the sixth beam are formed on core 95 of light collection object 90 which is an optical fiber. Thus, it is possible to allow the first through sixth beams to enter the optical fiber. Light propagated through the optical fiber is emitted as emitted light 181 from emission surface 98 which is the other end face of the optical fiber. Emitted light 181 may be radiated on an object to be processed which is not shown in the figure, using an optical light collection system not shown in the figure, and may be used for, for instance, processing and welding by means of transformation, for instance. In other words, it is possible to achieve a piece of processing equipment that includes light source unit 400 according to the present embodiment and uses emitted light from the optical fiber for processing.

Embodiment 5

A light source unit according to Embodiment 5 will be described. The light source unit according to the present embodiment includes a plurality of semiconductor light-emitting devices, which is a main difference from light source unit 400 according to Embodiment 4. The following describes the light source unit according to the present embodiment with reference to FIG. 14A and FIG. 14B, focusing on the main difference from light source unit 400 according to Embodiment 4.

Figure 14A:
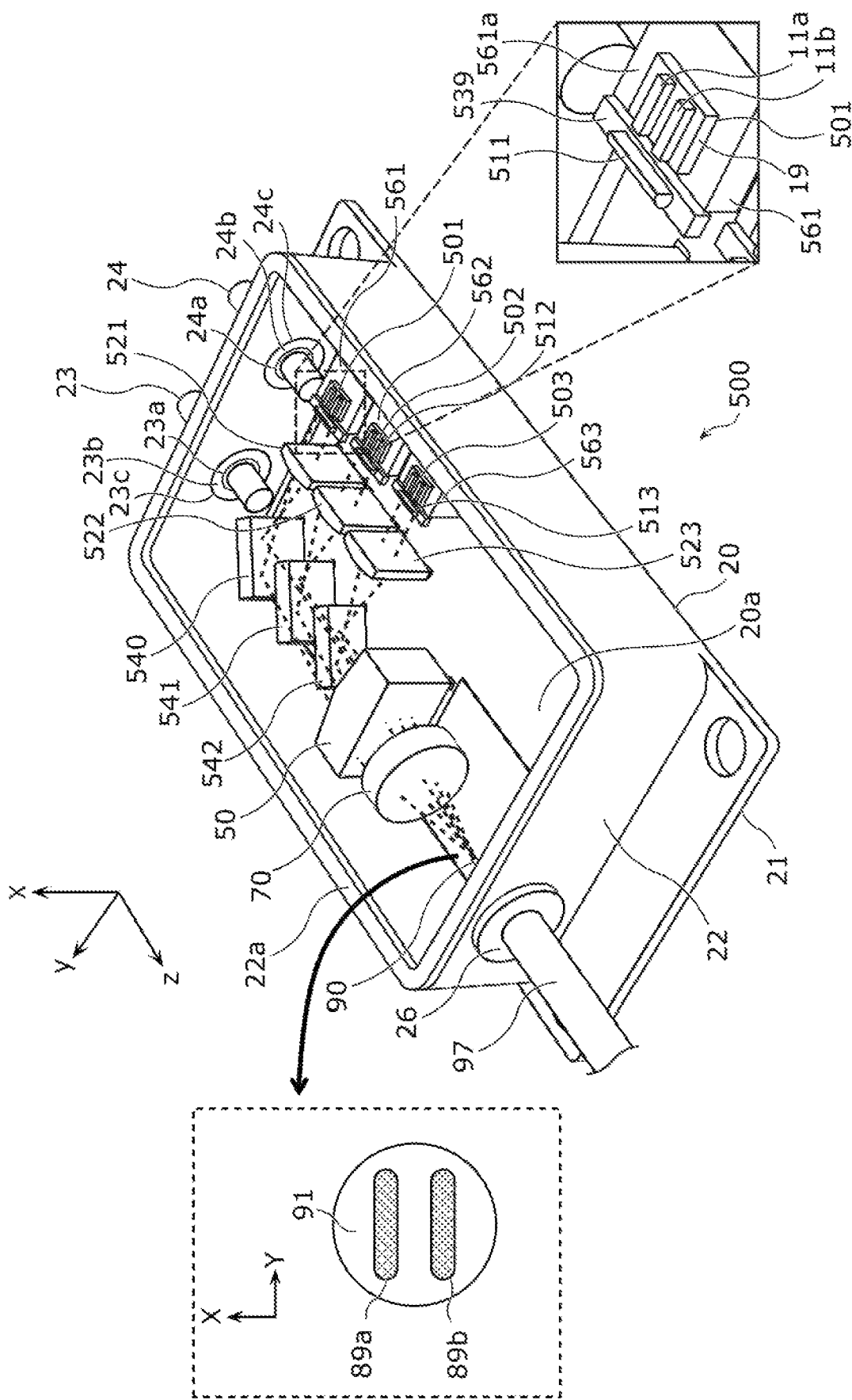
FIG. 14A is a perspective view illustrating an overall configuration of a light source unit according to Embodiment 5.
Figure 14B:
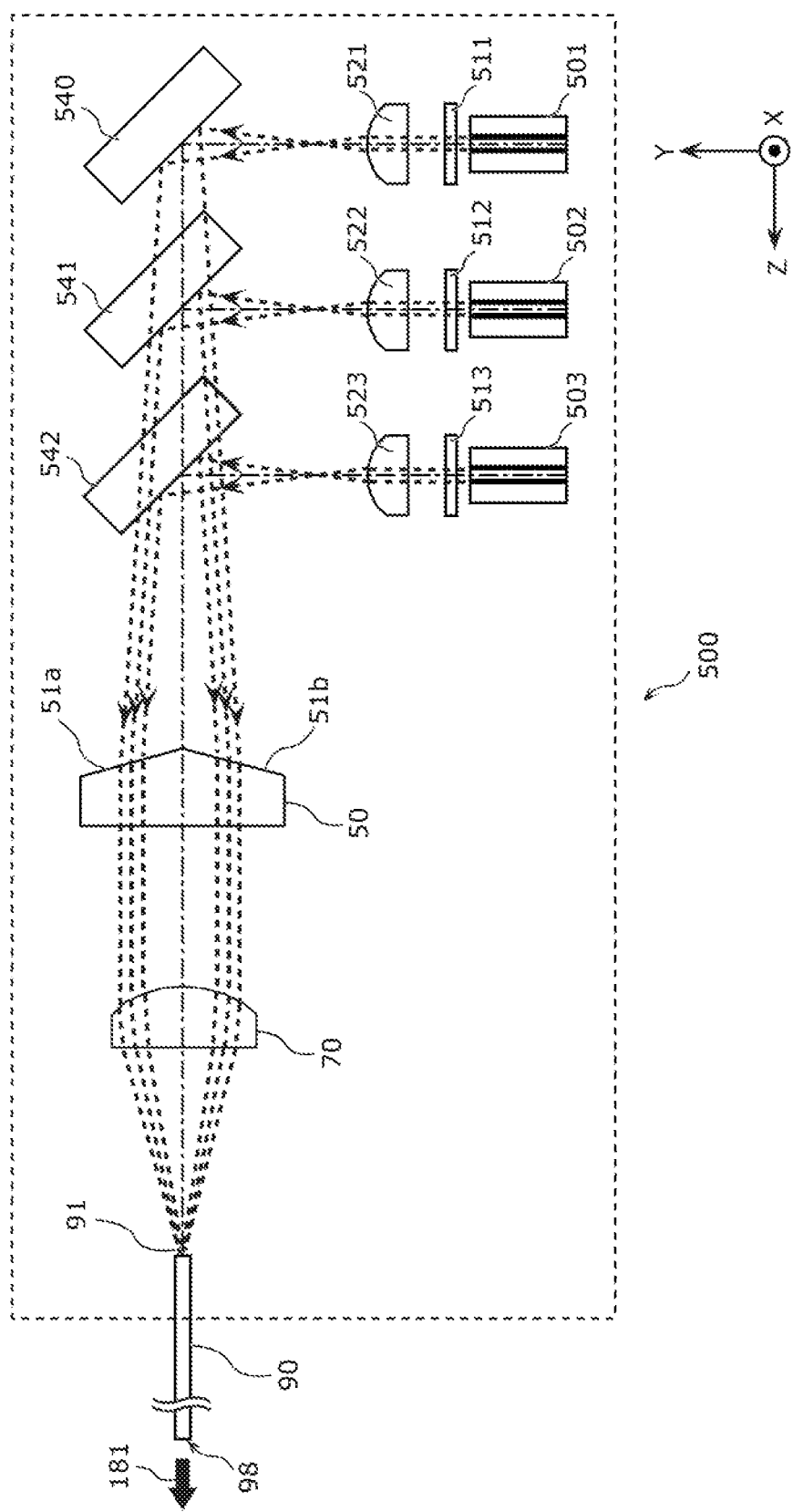
FIG. 14B is a plan view illustrating a configuration of optical elements of the light source unit according to Embodiment 5.

FIG. 14A is a perspective view illustrating an overall configuration of light source unit 500 according to the present embodiment. FIG. 14B is a plan view illustrating a configuration of optical elements included in light source unit 500 according to the present embodiment.

As illustrated in FIG. 14A, light source unit 500 includes semiconductor light-emitting devices 501 through 503, second condensing optical elements (fast axis collimating lenses 511 through 513 and slow axis collimating lenses 521 through 523), reflection mirrors 540 through 542, deflection element 50, first condensing optical element 70, light collection object 90 which is an optical fiber, and package 20.

Each of semiconductor light-emitting devices 501 through 503 is the same device as semiconductor light-emitting device 10 illustrated in FIG. 2A. Semiconductor light-emitting device 501 includes a first light emission point and a second light emission point, semiconductor light-emitting device 502 includes a third light emission point and a fourth light emission point, and semiconductor light-emitting device 503 includes a fifth light emission point and a sixth light emission point. A first beam through a sixth beam are respectively emitted from the first light emission point through the sixth light emission point.

Fast axis collimating lenses 511 through 513 are respectively disposed at locations facing the light emission points of semiconductor light-emitting devices 501 through 503, and reduce the dispersions of beams in the third direction.

Slow axis collimating lens 521 is disposed between fast axis collimating lens 511 and reflection mirror 540, slow axis collimating lens 522 is disposed between fast axis collimating lens 512 and reflection mirror 541, and slow axis collimating lens 523 is disposed between fast axis collimating lens 513 and reflection mirror 542. Slow axis collimating lenses 521 through 523 reduce the dispersions of the corresponding beams in a direction perpendicular to the third direction. In the present embodiment, slow axis collimating lenses 521 through 523 reduce the dispersions of the corresponding beams in the first direction.

Package 20 is a housing that accommodates semiconductor light-emitting devices 501 through 503, fast axis collimating lenses 511 through 513, slow axis collimating lenses 521 through 523, reflection mirrors 540 through 542, deflection element 50, first condensing optical element 70, and at least part of light collection object 90. In the present embodiment, carriers 561 through 563 are formed in package 20. Carriers 561 through 563 are base-like members that respectively support semiconductor light-emitting devices 501 through 503.

The heights of the carriers are then adjusted in such a manner that the positions, in the third direction, at which semiconductor light-emitting devices 501 through 503 are connected to package 20 get higher in the order of carrier 563, carrier 562, and carrier 561. Accordingly, it is possible to set the positions, in the third direction, of a beam from semiconductor light-emitting device 503, a beam from semiconductor light-emitting device 502, and a beam from semiconductor light-emitting device 501 in such a manner that the positions get higher in this order. Moreover, since the positions of the top surfaces of reflection mirror 542, reflection mirror 541, and reflection mirror 540 get higher in this order, a beam from semiconductor light-emitting device 501 can reach deflection element 50 without being blocked by reflection mirrors 541 and 542 as well as a beam from semiconductor light-emitting device 502 can reach deflection element 50 without being blocked by reflection mirror 542.

In the present embodiment, among the beams emitted from semiconductor light-emitting devices 501 through 503, the first beam, the third beam, and the fifth beam that are incident on first incident surface 51*a* (see FIG. 14B) of deflection element 50 may overlap each other on light collection surface 91. Likewise, the second beam, the fourth beam, and the sixth beam that are incident on second incident surface 51*b* (see FIG. 14B) of deflection element 50 may overlap each other on light collection surface 91. However, two beams emitted from two neighboring light emission points of each of semiconductor light-emitting devices 501 through 503 form light collection spots at different locations in the third direction. In this case, two light collection spots (first light collection spot 89*a* and second light collection spot 89*b*) are formed on light collection surface 91, as illustrated in FIG. 14A. Even in the case where three beams overlap each other on light collection surface 91, as is the case described in the present embodiment, it is possible to reduce damages on light collection surface 91 more than the case where all of six beams overlap each other at one location.

Next, semiconductor light-emitting devices 501 through 503 included in light source unit 500 according to the present embodiment, as well as a structure and a manufacturing method for adjusting and fixing the positions of components such as optical elements will be described in more detail.

Package 20 has a box-like shape and includes frame 22 and base 21 that dissipates heat from semiconductor light-emitting devices 501 through 503 to outside. Package 20 also includes first terminal 23 and second terminal 24 for supplying power to semiconductor light-emitting devices 501 through 503. In the present embodiment, base 21 and frame 22 are both made of copper, and sealing member 22*a* made of, for example, Kovar is brazed on the top of frame 22. Frame 22 includes openings for allowing first terminal 23, second terminal 24, and light collection object 90 which is an optical fiber, to penetrate to be fixed. Buffering members 23*b* and 24*b* each being, for example, a ring-shaped ferrum, ferric alloy, or ceramic are fixed to the openings of frame 22 for fixing first terminal 23 and second terminal 24 using, for example, adhesive members 23*c* and 24*c* such as silver solder. Fixing member 26 that is, for example, a ring-shaped ferrum, ferric alloy, or ceramic is fixed to the opening of frame 22 for fixing light collection object 90 using silver brazing filler metal, for instance. First terminal 23 and second terminal 24 are made of, for example, an iron-nickel alloy and are fixed to buffering members 23*b* and 24*b* of frame 22 by insulating members 23*a* and 24*a* such as fusible glass. A lid which is not shown in the figure and is made of, for example, Kovar is placed on the top of package 20 and is fixed to frame 22 through seam welding. Package 20 is thus tightly sealed.

First terminal 23 and second terminal 24 are electrically connected to semiconductor light-emitting devices 501 through 503 by conductive members such as metallic wires not shown in the figure, and supply a current to semiconductor light-emitting devices 501 through 503. In the present embodiment, semiconductor light-emitting devices 501 through 503 are connected in series.

In each of semiconductor light-emitting devices 501 through 503, semiconductor light-emitting element chips are fixed to submount 19 using, for example, a heat dissipation member that is not shown in the figure and is a solder material such as AuSn or SnAgCu. Submounts 19 of semiconductor light-emitting devices 501 through 503 are respectively fixed to carriers 561 through 563 using a heat dissipation member that is not shown in the figure and is made of a solder material or a metallic sheet including any one of metals such as Cu, Ag, Sb, Sn, Bi, In, Zn, Ge, Si, and Al. Specifically, a heat dissipation layer using such heat dissipation member is either of the following: a solder bonding layer for which a solder material such as SnAgCu, SnSb, or SnBi having a melting point lower than that of the heat dissipation member between the semiconductor light-emitting element chips and submount 19 is used; or an adhesion layer to which a metallic sheet made of, for example, In or Al is pressure-fixed using screws.

In the present embodiment, carriers 561 through 563 have a staircase structure processed and formed using the same material as that of base 21 or frame 22.

Note, however, that all or part of carriers 561 through 563 may be fixed to base 21 as separate components. In this case, submounts 19 are fixed to carriers 561 through 563 also using the heat dissipation member that is not shown in the figure and is made of a solder material or a metallic sheet having a melting point lower than that of the heat dissipation member between the semiconductor light-emitting element chips and submount 19.

The fixture surfaces of slow axis collimating lenses 521 through 523, reflection mirrors 540 through 542, deflection element 50, and first condensing optical element 70 are fixed to respective areas on mounting surface 20*a* of package 20.

Package 20 also includes three support members 539 and the fixture surfaces of fast axis collimating lenses 511 through 513 are fixed to respective support members 539. The fixture surfaces on the lateral surface of support members 539 are fixed to the respective lateral surfaces of semiconductor light-emitting element chips, submounts 19, or carriers 561 through 563.

Next, one example of a method of manufacturing light source unit 500 will be described.

(a) First, manufacture semiconductor light-emitting devices 501 through 503 by fixing semiconductor light-emitting element chips to submounts 19, using AuSn solder having the melting point of approximately 280 degrees Celsius.

(b) Subsequently, prepare package 20 having carriers 561 through 563. Mount, for example, a solder sheet made of SnAgCu having the melting point is approximately 220 degrees Celsius on carrier 561 and additionally dispose semiconductor light-emitting device 501 on the solder sheet. Heat carrier 561 at a temperature lower than the melting point of AuSn in a nitrogen atmosphere, adjust the position of semiconductor light-emitting device 501, and cool semiconductor light-emitting device 501 down to fix the position thereof. The heating time may be within one minute at the temperature of 200 degrees Celsius or higher so that the electrodes of the semiconductor light-emitting element chips are not damaged.

(c) Then, sequentially perform the same process for semiconductor light-emitting devices 502 and 503. Note, however, that after being disposed on carriers 561 through 563, semiconductor light-emitting devices 501 through 503 may be simultaneously heated and then cooled down to be fixed to carriers 561 through 563.

(d) Next, electrically connect first terminal 23 and second terminal 24 to semiconductor light-emitting devices 501 through 503, using metallic wires not shown in the figure.

(e) Subsequently, fix reflection mirrors 540 through 542, deflection element 50, first condensing optical element 70, and light collection object 90 to mounting surface 20a using an adhesive member, while adjusting the positions thereof. Here, while being held by holding member 97, light collection object 90 is inserted into package 20 through the opening of fixing member 26. Holding member 97 is fixed to fixing member 26 using solder, for instance.

(f) Subsequently, hold fast axis collimating lenses 511 through 513 and slow axis collimating lenses 521 through 523 at predetermined locations inside package 20.

(g) Subsequently, allow each of semiconductor light-emitting devices 501 through 503 to emit a predetermined amount of light and monitor emitted light 181 emitted from emission surface 98 of light collection object 90.

(h) Then, slightly move fast axis collimating lenses 511 through 513 and support members 539 in the second direction and the third direction to adjust the positions thereof so that the amount of emitted light is at maximum, and fix the positions using an adhesive member.

(i) Subsequently, slightly move slow axis collimating lenses 521 through 523 in the first direction and the second direction, adjust the positions thereof so that the amount of emitted light is at maximum, and fix the positions using an adhesive member.

(j) Radiate all of components inside light source unit 500 with ultraviolet light in an atmosphere including oxygen so that ozone is generated, and remove, for instance, organic substances attached to the components.

(k) Lastly, dispose light source unit 500 under a predetermined atmosphere and tightly seal light source unit 500 by seam welding a lid not shown in the figure to frame 22.

The details of the above manufacturing method may be changed according to the wavelengths of beams emitted from the semiconductor light-emitting element chips.

When each of the semiconductor light-emitting element chips is a laser diode chip which emits a beam with a wavelength of at least 350 nm and at most 550 nm and is formed using a material that includes nitrogen as a group V element, for example, an inorganic material such as a solder material may be used as the adhesive member in the processes (e), (h), and (i). The intention here is not to dispose, inside light source unit 500, a material that easily generates siloxane.

When a beam emitted from each of the semiconductor light-emitting element chips has a wavelength within the above range, a metallic film including any one of, for example, Cr, Ti, Ni, Pt, and Au is formed in advance on each of surfaces for fixing support members 539 and optical components (fast axis collimating lenses 511 through 513, slow axis collimating lenses 521 through 523, reflection mirrors 540 through 542, deflection element 50, and first condensing optical element 70). The optical components are then held together with solder materials at predetermined locations and fixed to the fixture surfaces through heating.

When the beam has a wavelength within the above range, a solder material having a melting point lower than that of a heat dissipation member that fixes the submounts 19 to carriers 561 through 563 may be used as a solder material for the above configuration. For example, SnBi having the melting point of 140 degrees Celsius can be used as the solder material. The solder material is then heated at the temperature lower than that of the melting point of the heat dissipation member, e.g., 160 degrees Celsius, and the optical components and the support members are thus fixed. In this case, partial heating using laser light may be applied. When the beam has a wavelength within the above range, it is possible, with the above configuration and manufacturing method, to configure components and adhesive members to be disposed inside package 20, using an inorganic material other than a resin. Accordingly, it is possible to inhibit the reliability of semiconductor light-emitting devices 501 through 503 from decreasing due to, for instance, contamination attached to light emission points thereof even in the case of using a semiconductor light-emitting element chip which emits a beam with a short wavelength of at most 550 nm. Dry air is used as an atmosphere in the process (k) so that the components are sealed in light source unit 500.

When the beam has a wavelength within the above range, optical components (fast axis collimating lenses 511 through 513, slow axis collimating lenses 521 through 523, reflection mirrors 540 through 542, deflection element 50, and first condensing optical element 70) to be disposed in the light source unit are formed using an inorganic glass-based material such as quartz, BK7, N-BK7, or waterwhite glass. Note that when a resin needs to be disposed inside light source unit 500, it is possible to inhibit contamination from being attached to light emission points by using an anti-ultraviolet light resin such as polyimide, or a resin containing less amount of silicone.

On the other hand, when each of the semiconductor light-emitting element chips is a laser diode chip which emits a beam with a wavelength of at least 550 nm and at most 2000 nm and is formed using a material that includes arsenic or phosphorus as a group V element, an ultraviolet light curing resin can be used as the adhesive member in the processes (e), (h), and (i). Then, dry air or dry nitrogen is used as an atmosphere in the process (k) so that the components are sealed in light source unit 500. When the beam has a wavelength within this range, the process (i) is not necessary.

Embodiment 6

A light source unit according to Embodiment 6 will be described. A main difference between the light source unit according to the present embodiment and light source unit 100 according to Embodiment 1 is that a light collection object includes a phosphor. The following describes the light source unit according to the present embodiment with reference to FIG. 15A through FIG. 15C and FIG. 16, focusing on the main difference from light source unit 100 according to Embodiment 1.

Figure 15A:
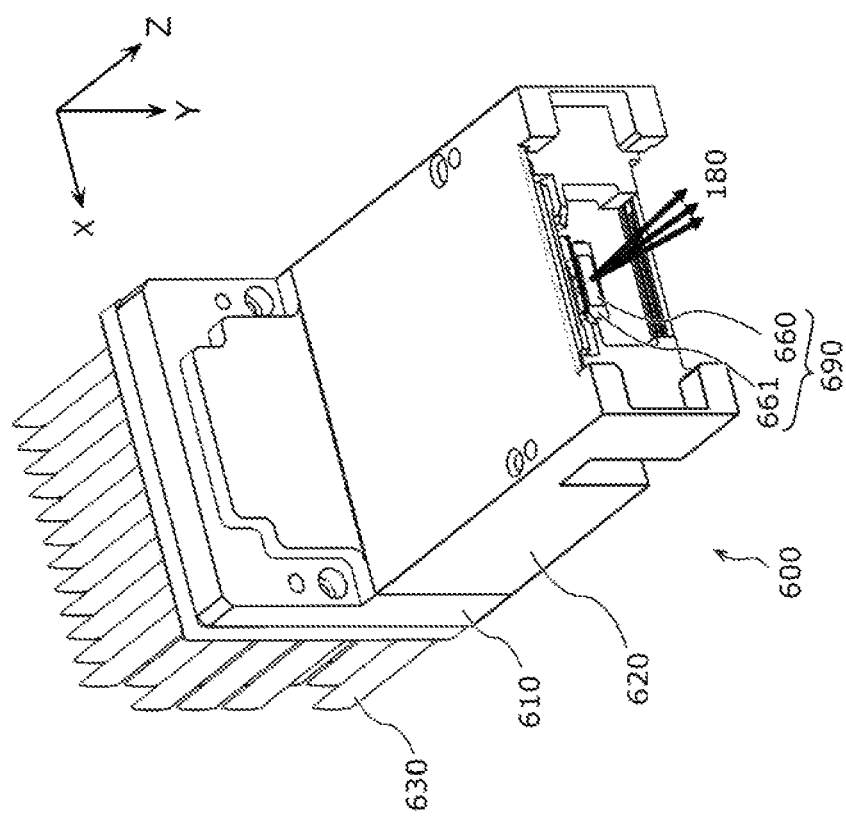
FIG. 15A is a perspective view illustrating an appearance of a light source unit according to Embodiment 6.
Figure 15B:
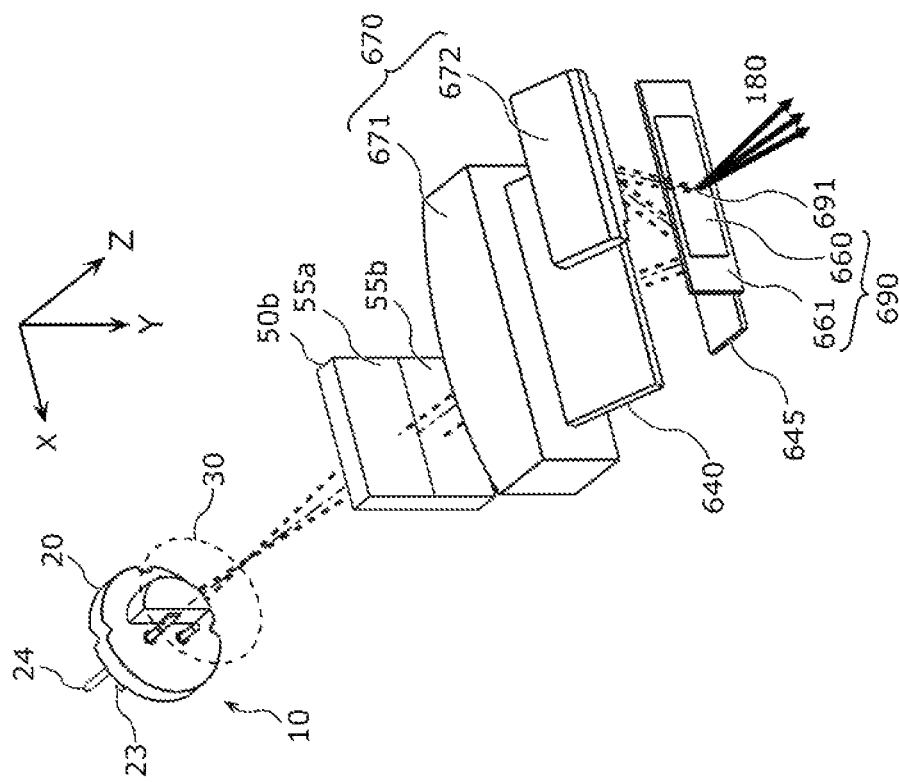
FIG. 15B is a perspective view illustrating an overall configuration of optical components disposed inside the light source unit according to Embodiment 6.
Figure 15C:
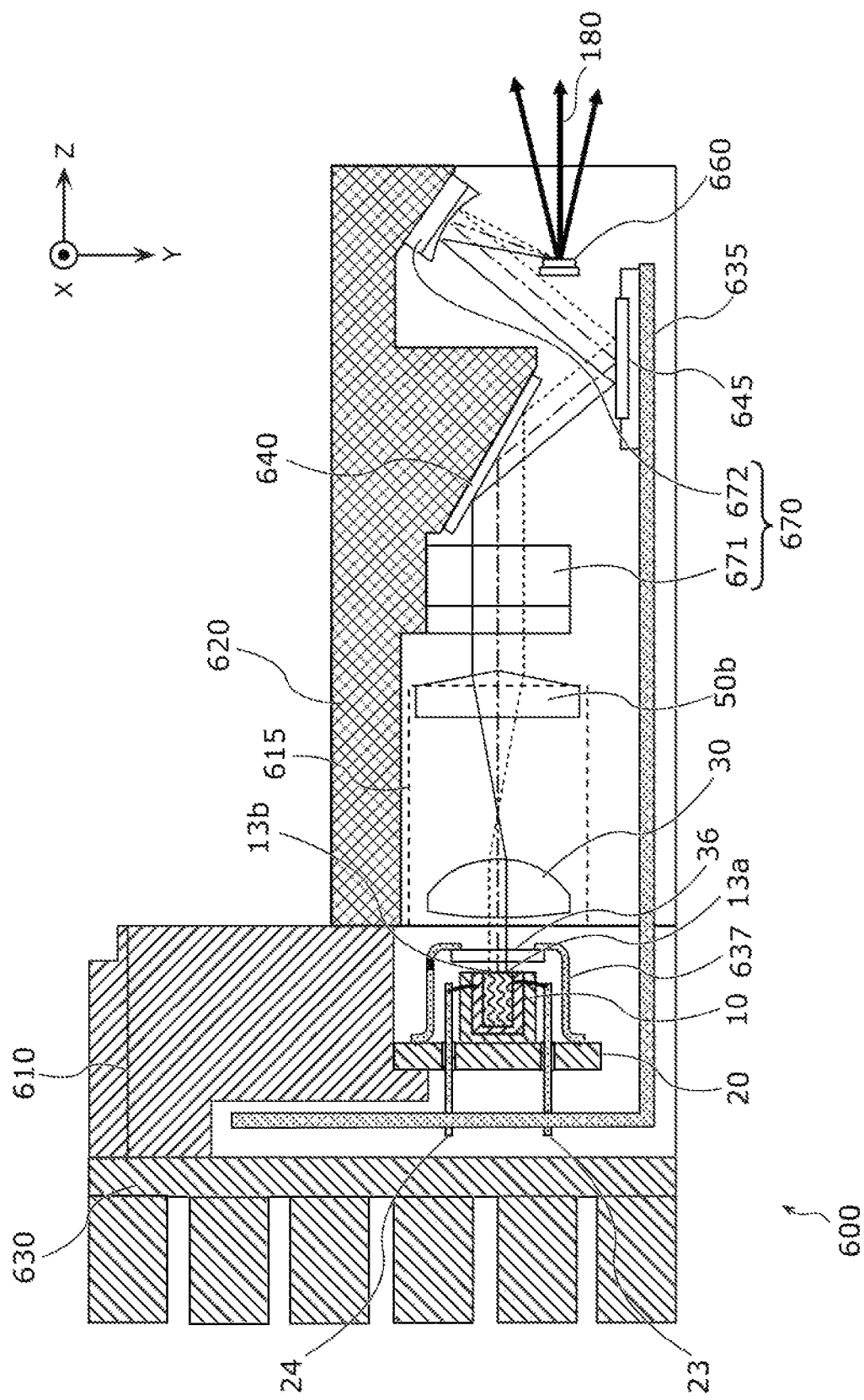
FIG. 15C is a schematic cross-sectional view of the light source unit according to Embodiment 6.

FIG. 15A is a perspective view illustrating an appearance of light source unit 600 according to the present embodiment. FIG. 15B is a perspective view illustrating an overall configuration of optical components disposed inside light source unit 600 according to the present embodiment. FIG. 15C is a schematic cross-sectional view illustrating light source unit 600 according to the present embodiment.

As illustrated in FIG. 15B, light source unit 600 includes semiconductor light-emitting device 10, second condensing optical element 30, deflection element 50b, first condensing optical element 670, and light collection object 690. Light source unit 600 also includes package 20, reflection mirror 640, and movable mirror 645. As illustrated in FIG. 15C, light source unit 600 additionally includes heat dissipation fin 630, first holder 610, second holder 620, third holder 615, and circuit board 635.

Semiconductor light-emitting device 10 is the same device as semiconductor light-emitting device 10 according to Embodiment 1, and includes first light emission point 13a and second light emission point 13b as illustrated in FIG. 15C. First light emission point 13a and second light emission point 13b emit a first beam and a second beam, respectively, as is the case described in Embodiment 1.

Semiconductor light-emitting device 10 is accommodated in package 20. Package 20 includes first terminal 23, second terminal 24, cap holder 637, and light-transmissive board 36, as illustrated in FIG. 15C. Light-transmissive board 36 is a light-transmissive optical element that transmits beams from semiconductor light-emitting device 10. Cap holder 637 is a member that covers semiconductor light-emitting device 10 and supports light-transmissive board 36.

Semiconductor light-emitting device 10 can be tightly sealed in package 20 by, for instance, cap holder 637 and light-transmissive board 36. Accordingly, it is possible to inhibit semiconductor light-emitting device 10 from contacting outside air.

Deflection element 50b is the same element as deflection element 50b according to Variation 2 of Embodiment 1.

Third holder 615 is a member that supports second condensing optical element 30 and deflection element 50b. Second condensing optical element 30 is movable in the first direction inside third holder 615 and is fixed after its position is adjusted so that the first beam and the second beam emitted from deflection element 50b are parallel to each other.

First condensing optical element 670 is an optical element that focuses a first beam and a second beam emitted from deflection element 50b on light collection surface 691 of light collection object 690. In the present embodiment, first condensing optical element 670 includes first cylindrical lens 671 and second cylindrical lens 672. First cylindrical lens 671 is a lens that focuses the first beam and the second beam in the third direction (the X-axis direction in FIG. 15C). Second cylindrical lens 672 is a lens that focuses the first beam and the second beam in a direction perpendicular to the third direction.

Reflection mirror 640 is a mirror that reflects the first beam and the second beam emitted from first cylindrical lens 671.

Movable mirror 645 is a mirror that reflects the first beam and the second beam reflected by reflection mirror 640. Movable mirror 645 has a reflection surface whose angle is changeable, and it is possible to scan light collection spot positions on light collection surface 691 by changing the angle of the reflection surface.

Light collection object 690 is a component that the first beam and the second beam, which are emitted from first condensing optical element 670 and then focused, enter. As illustrated in FIG. 15A and FIG. 15B, light collection object 690 includes phosphor 660 and phosphor support member 661.

Phosphor 660 is a component for the wavelength conversion of the first beam and the second beam. Phosphor 660 includes light collection surface 691. When each of the first beam and the second beam is blue light, for example, phosphor 660 converts one portion of the blue light into yellow light and emits the yellow light, and emits another portion of the blue light by scattering it. It is thus possible to mix the blue light and the yellow light to emit emitted light 180 which is white light.

Phosphor support member 661 is a member that supports phosphor 660.

First holder 610 is a member that supports package 20 and functions also as part of the housing of light source unit 600.

Second holder 620 is a member that supports third holder 615, first condensing optical element 670, reflection mirror 640, and light collection object 690, and functions, together with first holder 610, also as part of the housing of light source unit 600.

Heat dissipation fin 630 is a member that is attached to first holder 610 and dissipates heat generated in, for instance, semiconductor light-emitting device 10. Heat dissipation fin 630 may also function as part of the housing of light source unit 600.

Circuit board 635 is a board on which wires for supplying power to semiconductor light-emitting device 10 and also to movable mirror 645 are formed. Package 20 and movable mirror 645 are mounted on circuit board 635.

As described above, light source unit 600 according to the present embodiment includes phosphor 660 on which the first beam and the second beam are incident. Accordingly, light source unit 600 can be used as an illumination device. Stated differently, it is possible to achieve an illumination device that includes light source unit 600 and uses emitted light 180 from phosphor 660 as illumination light.

Figure 16:
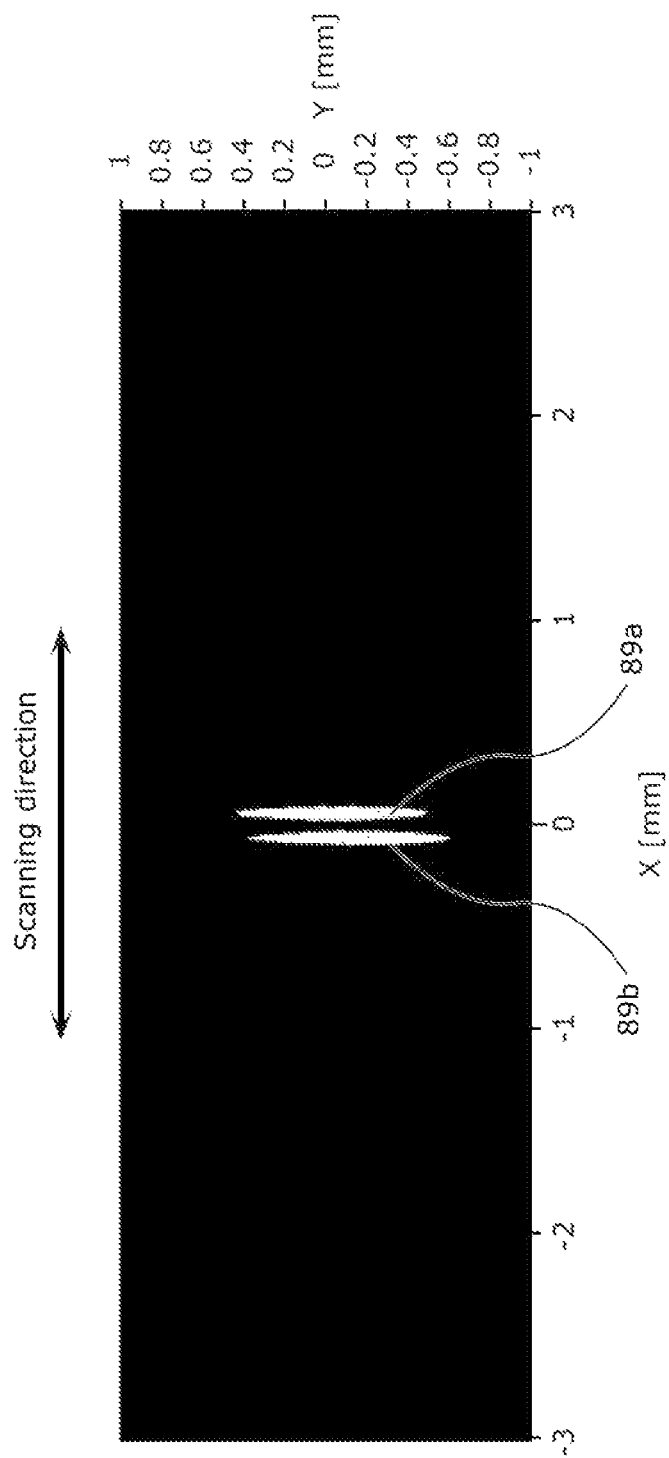
FIG. 16 is a diagram illustrating a light intensity distribution on the light collection surface of the light source unit according to Embodiment 6.
Figure 17:
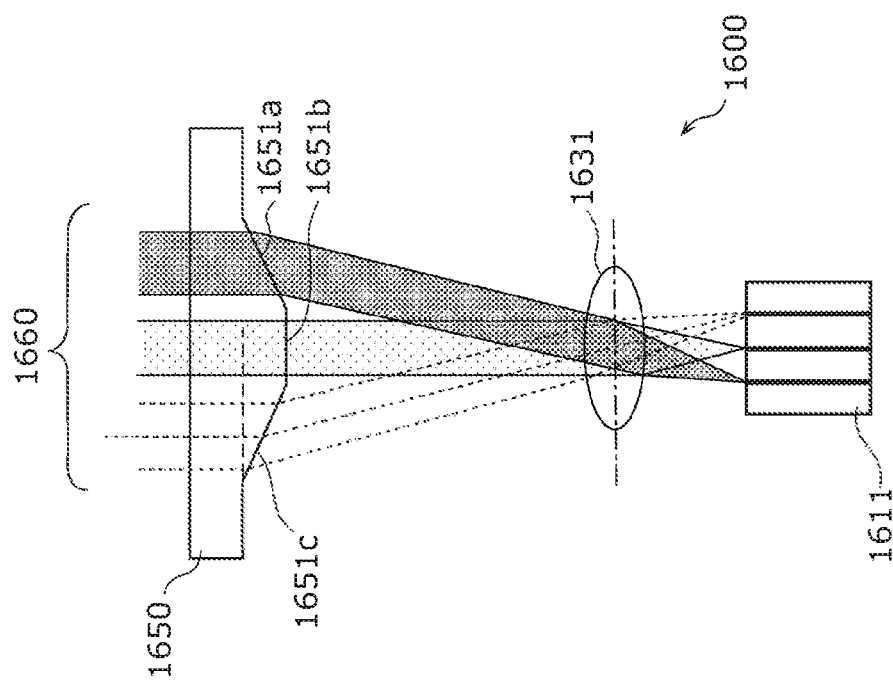
FIG. 17 is a schematic diagram illustrating a configuration of a light source unit disclosed in PTL 1.
Figure 18:
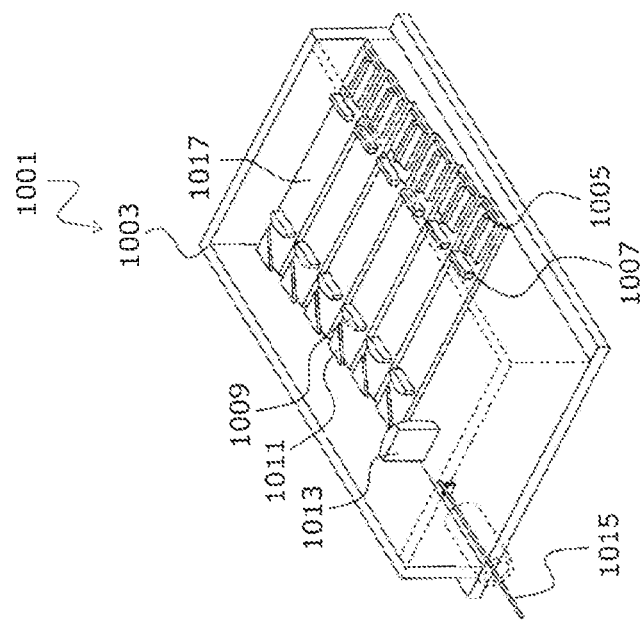
FIG. 18 is a schematic diagram illustrating a configuration of a light source unit disclosed in PTL 2.

Next, light collection spots on light collection surface 691 of light source unit 600 according to the present embodiment will be described with reference to FIG. 16. FIG. 16 is a diagram illustrating a light intensity distribution on light collection surface 691 of light source unit 600 according to the present embodiment. FIG. 16 illustrates a light intensity distribution calculated through a simulation.

As illustrated in FIG. 16, first light collection spot 89a and second light collection spot 89b respectively corresponding to the first beam and the second beam are formed on light collection surface 691 on phosphor 660. These light collection spots overlap each other in the second direction (the vertical axis direction in FIG. 16) and are disposed apart from each other in the third direction (the horizontal axis direction in FIG. 16). Accordingly, it is possible to emit white light having high luminance and inhibit phosphor 660 from deteriorating due to light intensity (light density) on the light collection spots becoming too high.

In the present embodiment, it is possible to scan light collection spot positions in the direction indicated by the arrow in FIG. 16, by changing the angle of the reflection surface of movable mirror 645. Accordingly, it is possible to scan the direction in which emitted light 180 is emitted.

Variations and Others

Although the light source unit according to the present disclosure, for instance, has been described based on each of the embodiments, the present disclosure is not limited to the above embodiments.

For example, the shapes of the lateral surfaces of a deflection element are not specifically limited. The deflection element according to Embodiment 1 or Variation 2 thereof has lateral surfaces perpendicular to the ZY-plane (i.e., along the third direction), but may be tilted with respect to the third direction. For example, each of the lateral surfaces may be tilted by angle θ with respect to the third direction.

Each of the above embodiments and variations thereof has illustrated a configuration in which both the first beam and the second beam are deflected in the third direction by the deflection element, but only one of the first beam and the second beam may be deflected in the third direction. Even with such a configuration, it is possible to separate the position of the first beam from the position of the second beam on the light collection surface.

The aspects of the present disclosure may also encompass various modifications that may be conceived by those skilled in the art to the embodiments, and embodiments achieved by combining elements and functions in different embodiments, without departing from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The light source unit and others according to the present disclosure are useful for devices that require light with a relatively high output. The devices include image display devices such as laser display devices and projectors, and industrial laser devices such as laser processing devices and laser annealing devices.

The invention claimed is:

1. A light source unit having an optical axis parallel to a first direction, the light source unit comprising:
   a first light emission point from which a first beam is emitted;
   a second light emission point from which a second beam is emitted, the second light emission point being disposed apart from the first light emission point in a second direction perpendicular to the first direction; and
   a deflection element that deflects at least one of the first beam or the second beam in a third direction perpendicular to the first direction and, the second direction, wherein
   the first beam is incident on the deflection element from a fourth direction perpendicular to the third direction,
   the second beam is incident on the deflection element from a fifth direction perpendicular to the third direction,
   the first beam is emitted from the deflection element in a sixth direction,
   the second beam is emitted from the deflection element in a seventh direction,
   the sixth direction is defined by a change of a first deflection angle from the fourth direction in a view along the second direction,
   the seventh direction is defined by a change of a second deflection angle from the fifth direction in the view along the second direction,
   the sixth direction is defined by a third deflection angle from the fourth direction in a view along the third direction,
   the seventh direction is defined by a fourth deflection angle from the fifth direction in the view along the third direction,
   the first deflection angle is different from the second deflection angle, and
   the third deflection angle is different from the fourth deflection angle.

2. The light source unit according to claim 1, wherein the first beam at the first light emission point overlaps the second beam at the second light emission point in the third direction.

3. The light source unit according to claim 1, further comprising:
   a first condensing optical element that focuses, on a light collection surface, the first beam and the second beam that are emitted from the deflection element.

4. The light source unit according to claim 1, wherein the deflection element includes a first incident surface on which the first beam is incident and a second incident surface on which the second beam is incident,
   an intersection line between the first incident surface and a plane perpendicular to the third direction is tilted by a first tilt angle from the second direction,
   an intersection line between the second incident surface and a plane perpendicular to the third direction is tilted by a second tilt angle from the second direction,
   an intersection line between the first incident surface and a plane perpendicular to the second direction is tilted by a third tilt angle from the third direction,
   an intersection line between the second incident surface and a plane perpendicular to the second direction is tilted by a fourth tilt angle from the third direction,
   the first tilt angle is different from the second tilt angle,
   the third tilt angle is different from the fourth tilt angle,
   an absolute value of the third tilt angle is smaller than an absolute value of the first tilt angle, and
   an absolute value of the fourth tilt angle is smaller than an absolute value of the second tilt angle.

5. The light source unit according to claim 1, wherein the deflection element includes a first emission surface from which the first beam is emitted and a second emission surface from which the second beam s emitted,
   an intersection line between the first emission surface and a plane perpendicular to the third direction is tilted by a fifth tilt angle from the second direction,
   an intersection line between the second emission surface and a plane perpendicular to the third direction is tilted by a sixth tilt angle from the second direction,
   an intersection line between the first emission surface and a plane perpendicular to the second direction is tilted by a seventh tilt angle from the third direction,
   an intersection line between the second emission surface and a plane perpendicular to the second direction is tilted by an eighth tilt angle from the third direction,
   the fifth tilt angle is different from the sixth tilt angle,
   the seventh tilt angle is different from the eighth tilt angle,
   an absolute value of the seventh tilt angle is smaller than an absolute value of the fifth tilt angle, and
   an absolute value of the eighth tilt angle is smaller than an absolute value of the sixth tilt angle.

6. The light source unit according to claim 1, wherein the first light emission point and the second light emission point are included in a semiconductor laser array disposed on a single semiconductor substrate.

7. The light source unit according to claim 1, further comprising:
   a mounting surface perpendicular to the third direction, wherein
   the first light emission point is included in a first semiconductor light-emitting element chip,
   the second light emission point is included in a second semiconductor light-emitting element chip, and
   the first semiconductor light-emitting element chip and the second semiconductor light-emitting element chip are mounted on the mounting surface.

8. The light source unit according to claim 1, further comprising:
   a second condensing optical element disposed between (i) the deflection element and (ii) the first light emission point and the second light emission point.

9. A light source unit having an optical axis parallel to a first direction, the light source unit comprising:
   a first light emission point from which a first beam is emitted;
   a second light emission point from which a second beam is emitted, the second light emission point being disposed apart from the first light emission point in a second direction perpendicular to the first direction; and a deflection element that deflects at least one of the first beam or the second beam in a third direction perpendicular to the first direction and the second direction, wherein the first beam is incident on the deflection element from a fourth direction perpendicular to the third direction, the second beam is incident on the deflection element from a fifth direction perpendicular to the third direction, an angle between the fourth direction and the first direction is different from an angle between the fifth direction and the first direction in a view along the third direction, the first beam is emitted from the deflection element in a sixth direction, the second beam is emitted from the deflection element in a seventh direction, the sixth direction is defined by a change of a first deflection angle from the fourth direction in a view along the second direction, the seventh direction is defined by a change of a second deflection angle from the fifth direction in the view along the second direction, the first deflection angle is different from the second deflection angle, and the sixth direction and the seventh direction are parallel to each other in the view along the third direction.

* * * * *